United States Patent
Wang et al.

(10) Patent No.: US 11,025,461 B2
(45) Date of Patent: Jun. 1, 2021

(54) SYSTEMS AND METHODS FOR DELTA-SIGMA DIGITIZATION

(71) Applicant: CABLE TELEVISION LABORATORIES, INC, Louisville, CO (US)

(72) Inventors: Jing Wang, Broomfield, CO (US); Luis Alberto Campos, Superior, CO (US); Zhensheng Jia, Superior, CO (US)

(73) Assignee: Cable Television Laboratories, Inc., Louisville, CO (US)

( * ) Notice: Subject to any disclaimer, the term of this patent is extended or adjusted under 35 U.S.C. 154(b) by 0 days.

(21) Appl. No.: 16/835,168

(22) Filed: Mar. 30, 2020

(65) Prior Publication Data

US 2020/0287758 A1    Sep. 10, 2020

Related U.S. Application Data

(63) Continuation of application No. 16/288,057, filed on Feb. 27, 2019, now Pat. No. 10,608,852, which is a continuation-in-part of application No. 16/283,520, filed on Feb. 22, 2019, now Pat. No. 10,601,510, which is a continuation-in-part of application No.
(Continued)

(51) Int. Cl.
| | |
|---|---|
| *H04L 25/49* | (2006.01) |
| *H04B 10/2575* | (2013.01) |
| *H04W 88/08* | (2009.01) |
| *H03M 3/00* | (2006.01) |
| *H04B 1/04* | (2006.01) |

(52) U.S. Cl.
CPC ........ *H04L 25/4906* (2013.01); *H03M 3/424* (2013.01); *H03M 3/43* (2013.01); *H03M 3/45* (2013.01); *H03M 3/452* (2013.01); *H03M 3/454* (2013.01); *H03M 3/496* (2013.01); *H04B 1/0483* (2013.01); *H04B 10/25753* (2013.01); *H04W 88/085* (2013.01)

(58) Field of Classification Search
CPC combination set(s) only.
See application file for complete search history.

(56) References Cited

U.S. PATENT DOCUMENTS

| | | | | |
|---|---|---|---|---|
| 2004/0223553 | A1* | 11/2004 | Kumar | H04L 1/0059 |
| | | | | 375/259 |
| 2007/0066268 | A1* | 3/2007 | Simic | G01S 19/235 |
| | | | | 455/318 |

(Continued)

OTHER PUBLICATIONS

Chih-Lin, RAN Revolution with NGFI (xhaul) for 5G, Journal of Lightwave Technology, vol. 36,No. 2, Jan. 15, 2018, pp. 541-547.*

*Primary Examiner* — Omar S Ismail
(74) *Attorney, Agent, or Firm* — Armstrong Teasdale LLP

(57) ABSTRACT

A baseband processing unit includes a baseband processor configured to receive a plurality of component carriers of a radio access technology wireless service, and a delta-sigma digitization interface configured to digitize at least one carrier signal of the plurality of component carriers into a digitized bit stream, for transport over a transport medium, by (i) oversampling the at least one carrier signal, (ii) quantizing the oversampled carrier signal into the digitized bit stream using two or fewer quantization bits.

20 Claims, 29 Drawing Sheets

Related U.S. Application Data

16/191,315, filed on Nov. 14, 2018, now Pat. No. 10,608,744.

(60) Provisional application No. 62/635,629, filed on Feb. 27, 2018, provisional application No. 62/633,956, filed on Feb. 22, 2018, provisional application No. 62/586,041, filed on Nov. 14, 2017.

(56) References Cited

U.S. PATENT DOCUMENTS

| | | | | |
|---|---|---|---|---|
| 2007/0101242 | A1* | 5/2007 | Yancey | G06F 13/4256 714/776 |
| 2007/0236374 | A1* | 10/2007 | Brueske | G01S 7/52028 341/143 |
| 2009/0021409 | A1* | 1/2009 | Mathe | H03M 3/374 341/143 |
| 2012/0014694 | A1* | 1/2012 | Tempi | H04B 10/25759 398/43 |
| 2016/0212747 | A1* | 7/2016 | Effenberger | H04L 27/00 |
| 2017/0117812 | A1* | 4/2017 | Furtner | H02M 3/33515 |
| 2017/0373890 | A1* | 12/2017 | Fertonani | H04L 27/0002 |
| 2018/0026823 | A1* | 1/2018 | Kumar | H04L 1/0057 370/329 |

* cited by examiner

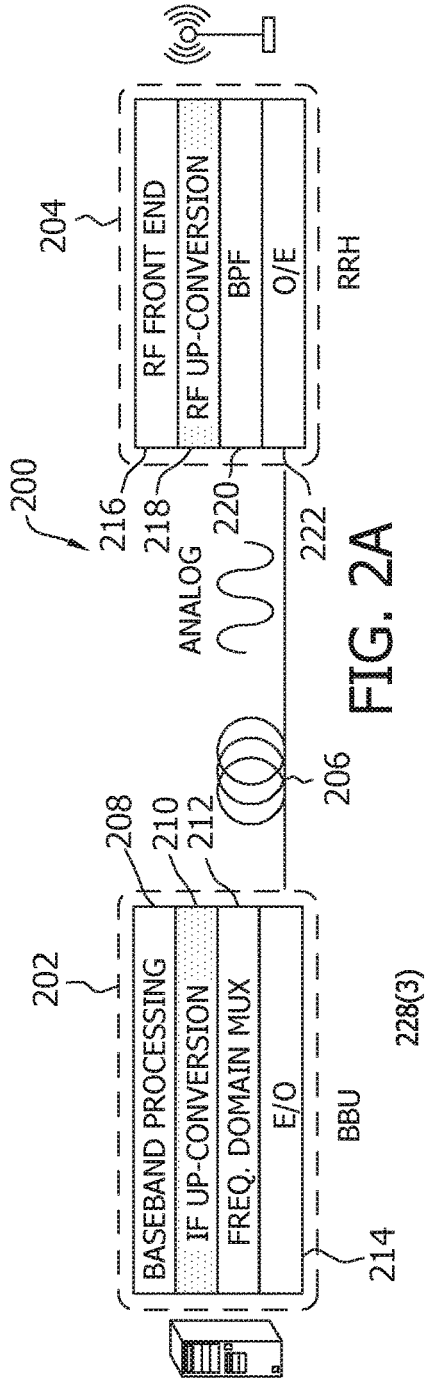

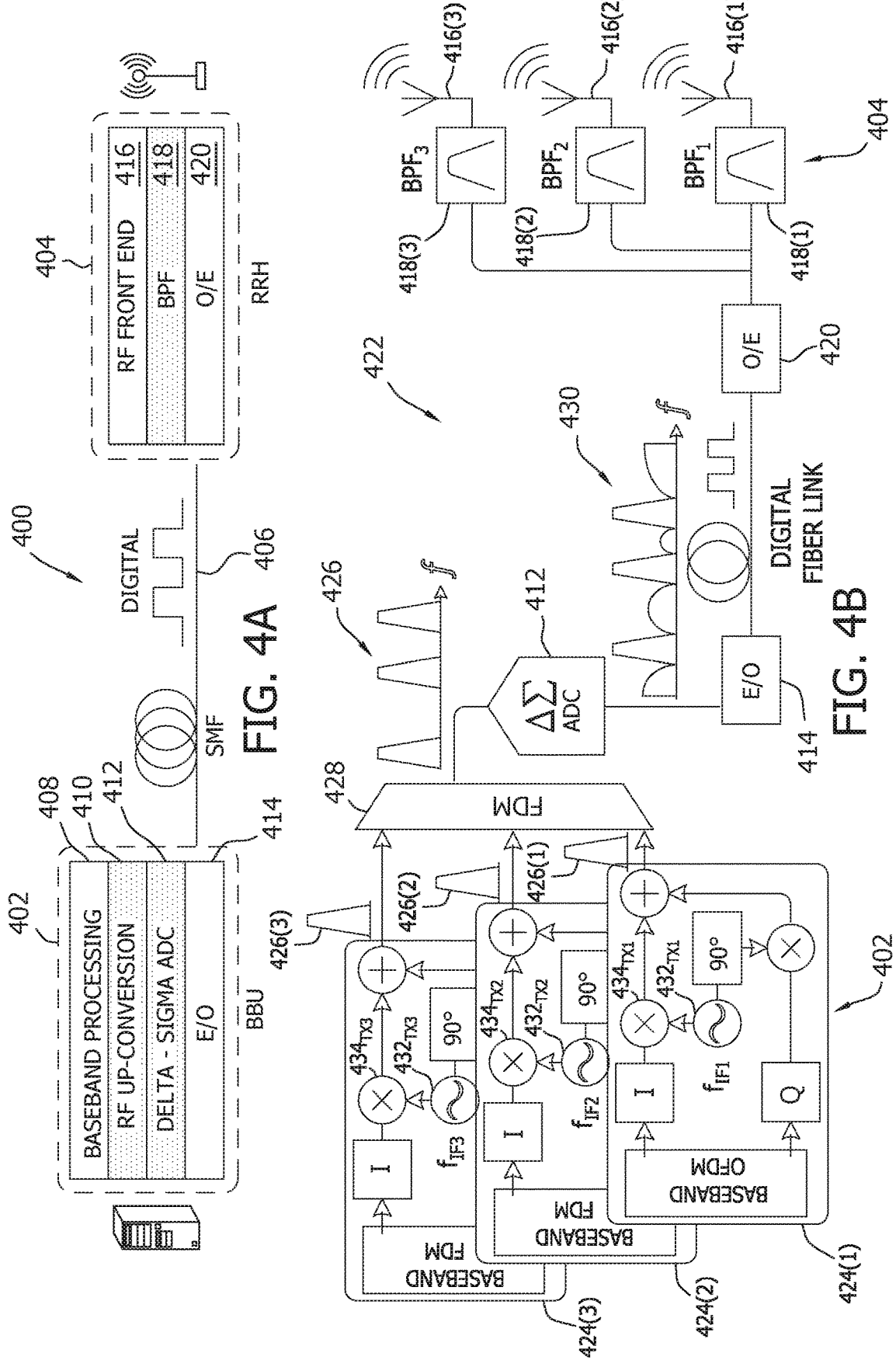

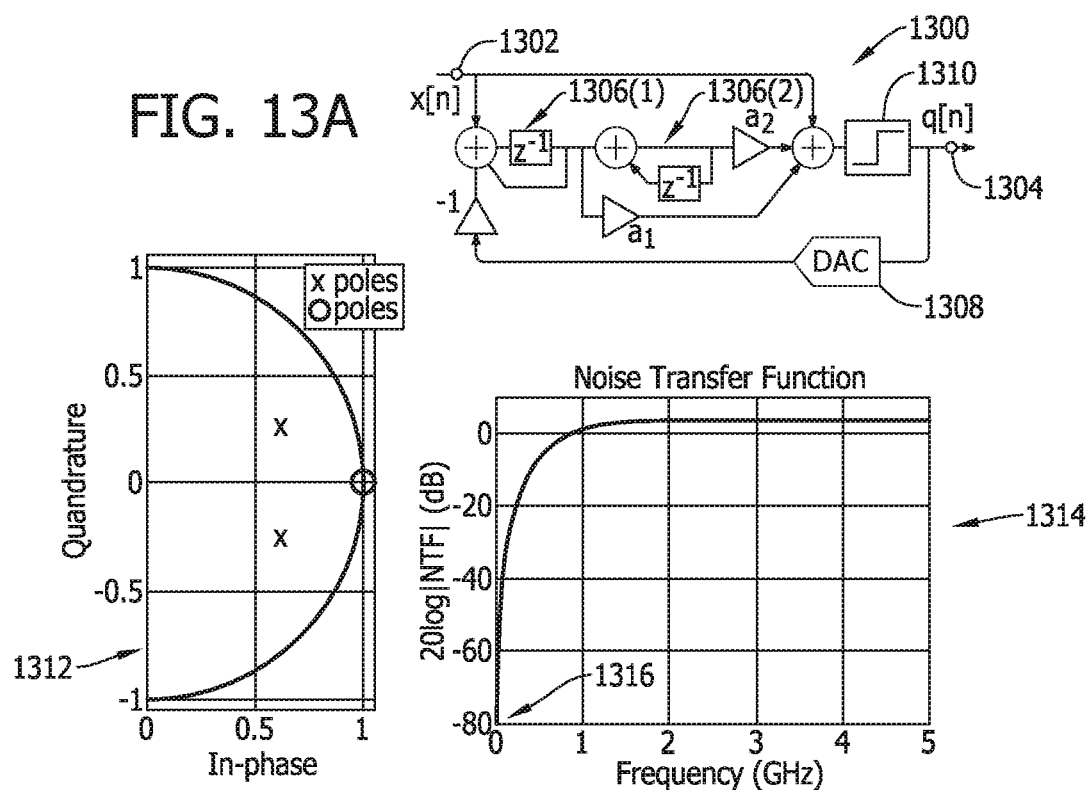
FIG. 13A
FIG. 13B
FIG. 13C
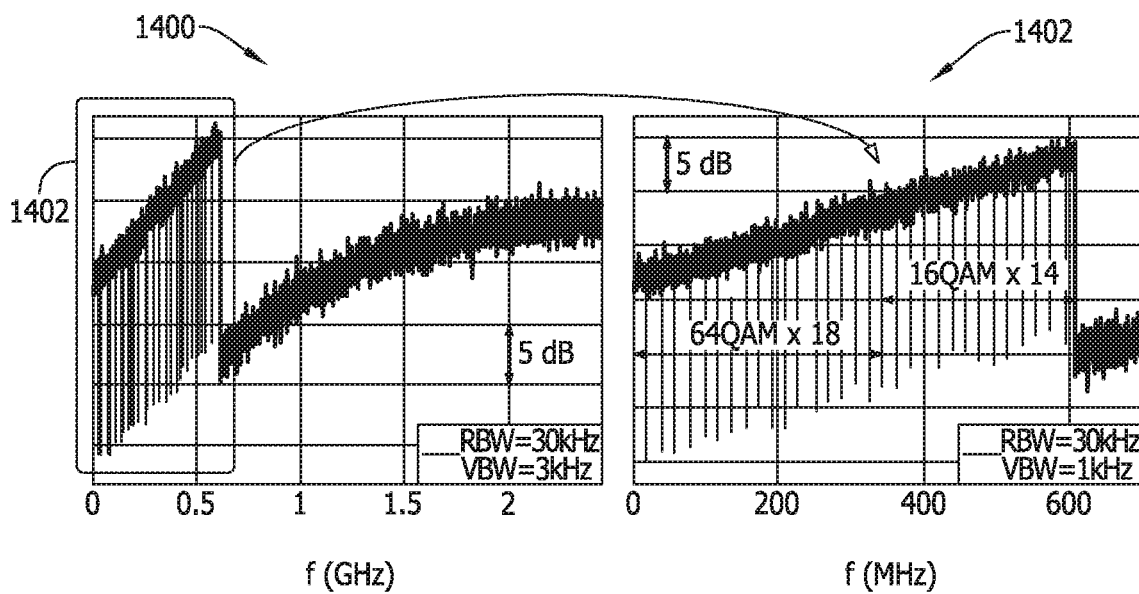
FIG. 14A
FIG. 14B

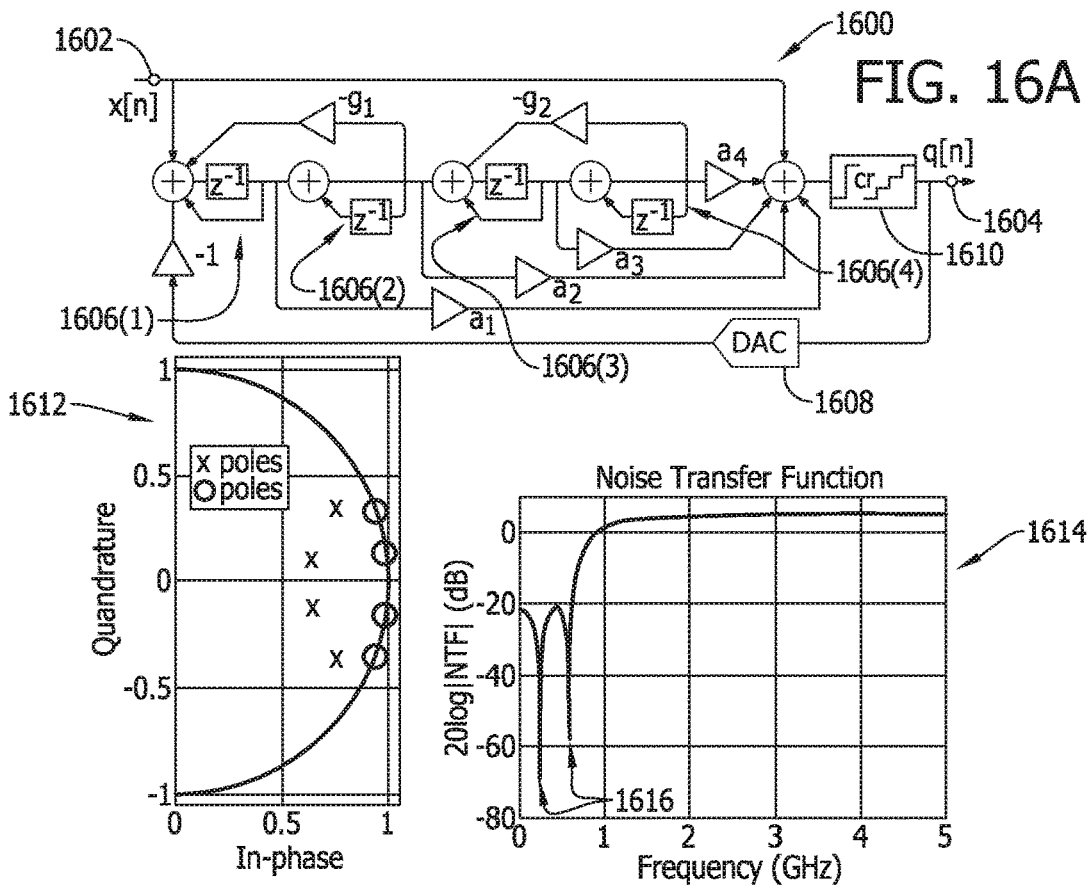
FIG. 16A
FIG. 16B
FIG. 16C
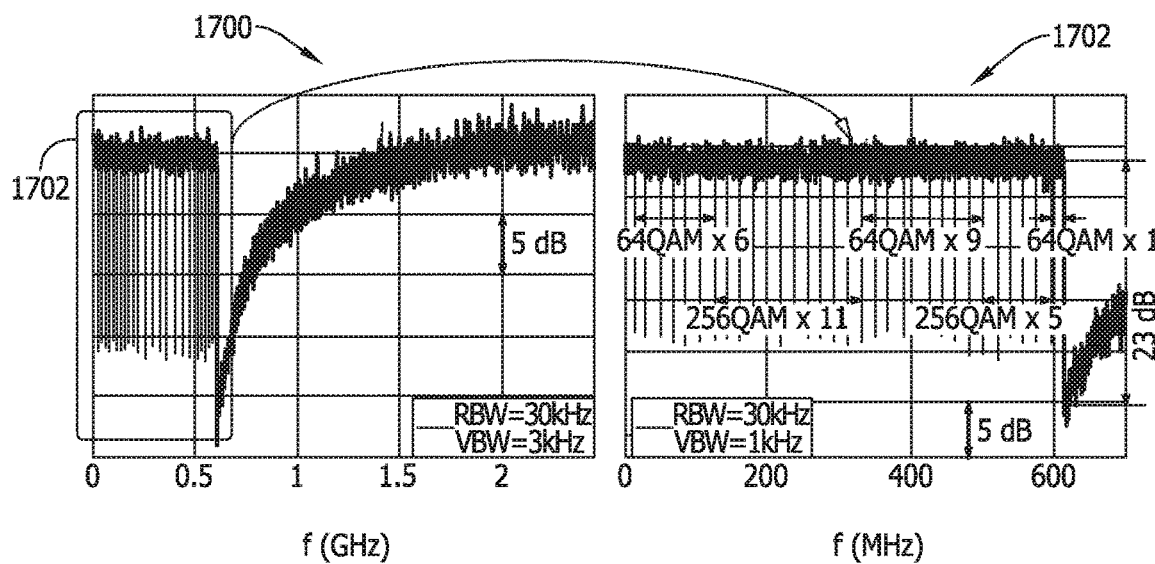
FIG. 17A
FIG. 17B

SYSTEMS AND METHODS FOR DELTA-SIGMA DIGITIZATION

CROSS REFERENCE TO RELATED APPLICATIONS

This application is a continuation of U.S. application Ser. No. 16/288,057, filed Feb. 27, 2019. U.S. application Ser. No. 16/288,057 is a continuation in part of U.S. application Ser. No. 16/283,520, filed Feb. 22, 2019. U.S. application Ser. No. 16/283,520 is a continuation in part of U.S. application Ser. No. 16/191,315, filed Nov. 14, 2018. U.S. application Ser. No. 16/191,315 claims the benefit of and priority to U.S. Provisional Patent Application Ser. No. 62/586,041, filed Nov. 14, 2017. U.S. application Ser. No. 16/283,520 also claims the benefit of and priority to U.S. Provisional Patent Application Ser. No. 62/633,956, filed Feb. 22, 2018. U.S. application Ser. No. 16/288,057 additionally claims the benefit of and priority to U.S. Provisional Patent Application Ser. No. 62/635,629, filed Feb. 27, 2018. The disclosures of all of these applications are incorporated herein by reference in their entireties.

BACKGROUND

The field of the disclosure relates generally to communication networks, and more particularly, to digitization techniques in access communication networks.

Emerging video-intensive and bandwidth-consuming services, such as virtual reality (VR), augmented reality (AR), and immersive applications, are driving the growth of wireless data traffic in a significant manner. This rapid growth has made the network segment of mobile fronthaul (MFH) networks a new bottleneck of user experience. Various technologies have been proposed and investigated to increase the spectral efficiency of MFH networks and enhance the quality of services (QoS) for end users, such as analog MFH based on radio-over-fiber (RoF) technology and digital MFH based on common public radio interface (CPRI), etc. These conventional proposals, however, have been unable to keep up with the increasing pace of growth of wireless traffic.

In a new paradigm of 5G new radio (5G-NR), heterogeneous MFH networks are proposed to aggregate wireless services from multiple radio access technologies (multi-RATs), and then deliver the aggregated services in a shared ubiquitous access network, as described further below with respect to FIG. 1.

FIG. 1 is a schematic illustration of a conventional access network architecture 100. Architecture 100 includes a core network 102, a baseband processing unit (BBU) pool 104, and one or more remote radio heads (RRHs) 106 (e.g., RRHs 106(1), and mobile users 106(2) and wireless users 106(3), which connect with a respective RRH 106(1)). Architecture 100 is, in this example, a cloud-radio access network (C-RAN) that includes a plurality of centralized BBUs 108 in BBU pool 104 to enable inter-cell processing. Core network 102 includes one or more service gateways (S-GWs) 110, or mobile management entities (MMEs), in operable communication with BBU pool 104 over a mobile backhaul (MBH) network 112. That is, MBH network 112 constitutes the network segment from S-GW/MME 110 to BBUs 108 or BBU pool 104. In a similar fashion, a mobile fronthaul (MFH) 114 is defined as the network segment from BBUs 108/BBU pool 104 to RRHs 106.

In operation of architecture 100, MBH 112 transmits digital bits 116 of net information, whereas MFH 114 transmits wireless services 118 in either an analog waveform 120 based on RoF technology, or in a digital waveform 122 using a digitization interface, such as CPRI. In the embodiment depicted in FIG. 1, architecture 100 represents a heterogeneous MFH network, for aggregating and delivering a plurality of services 124 from different radio access technologies (RATs), including Wi-Fi, 4G long term evolution (4G-LTE), and 5G-NR, to RRHs 106 by way of a shared fiber link 126. Service aggregation of the same RAT (e.g., Wi-Fi channel boning, LTE carrier aggregation (CA), etc.) is referred to as intra-RAT aggregation, whereas heterogeneous aggregation of services from different RATs is referred to as inter-RAT aggregation. A heterogeneous MFH network offers traffic offloading among different RATs and enhances the seamless coverage and provides a ubiquitous access experience to end users.

Accordingly, the conventional MFH technologies include: (1) analog MFH based on RoF technology, which is described further below with respect to FIGS. 2A-B; and (2) digital MFH based on CPRI, which is described further below with respect to FIGS. 3A-B.

FIG. 2A is a schematic illustration of a conventional analog MFH network 200. MFH network 200 includes at least one BBU 202 in operable communication with an RRH 204 over a transport medium 206 (e.g., an optical fiber). BBU 202 includes a baseband processing layer 208, an intermediate frequency (IF) up-conversion layer 210, a frequency domain multiplexer (FDM) 212, and an electrical-optical (E/O) interface 214. In a similar manner, RRH 204 includes a radio frequency (RF) front end 216, an RF up-conversion layer 218, a bandpass filter (BPF) 220, and an optical-electrical (O/E) interface 222.

In operation of MFH network 200, BBU 202 receives digital bits from MBH networks (not shown in FIG. 2A). The received bits are processed by baseband processing layer 208, which provides an OFDM signal to IF up-conversion layer 210 for synthesis and up-conversion to an intermediate frequency. Different wireless services are then multiplexed by FDM 212 in the frequency domain, and finally transmitted through E/O interface 214 to RRH 204 over an analog fiber link of transport medium 206. At RRH 204, after O/E interface 222, the different services are separated by bandpass filter(s) 220, and then up-converted by RF up-converter 218 to radio frequencies for wireless emission. Since these wireless services are carried on different intermediate frequencies (IFs) during fiber propagation, this operation is also referred to as intermediate frequency over fiber (IFoF).

FIG. 2B is a schematic illustration of a conventional analog MFH link 224 for network 200, FIG. 2A. In an exemplary embodiment, MFH 224 represents a system implementation of an analog MFH link based on RoF/IFoF technology, and includes a plurality of transmitters 226 (e.g., corresponding to a respective BBU 202) configured to transmit a plurality of respective signals 228 over link 206. Signals 228 are aggregated by FDM 212 prior to transmission over fiber 206 by E/O interface 214. The aggregated signals 228 are received by O/E interface 222, which provides signals 228 to respective receivers 230 (e.g., of a respective RRH 204). It can be seen from the embodiment depicted in FIG. 2B that the respective RF devices include mixers 232 and local oscillators 234, for both BBUs 202 and RRHs 204, for IF up-conversion and RF up-conversion, respectively. In this embodiment, transmitters 226 are depicted to illustrate the IF up-conversion.

Due to its high spectral efficiency, simple equalization in the frequency domain, and robustness against inter-symbol interference (ISI), orthogonal frequency-division multiplexing (OFDM) has been adopted by most RATs, including WiMAX, Wi-Fi (802.11), WiGig (802.11ad), 4G-LTE (3GPP), and 5G-NR. However, OFDM signals are vulnerable to nonlinear impairments due to their continuously varying envelope and high peak-to-average ratio (PAPR). Therefore, it has become increasingly difficult to support high order modulation formats (e.g., >256QAM) using OFDM over MFH networks. To transmit the higher order formats required by LTE and 5G-NR signals without nonlinear distortions, digital MFH networks based digitization interfaces, such as CPRI, has been proposed and implemented. A digital MFH network is described below with respect to FIGS. 3A-B.

FIG. 3A is a schematic illustration of a conventional digital MFH network 300. Digital MFH network 300 is similar to analog MFH network 200, FIG. 2, in many respects, and includes at least one BBU 302 in operable communication with an RRH 304 over a transport medium 306 (e.g., an optical fiber). Network 300 differs from network 200 though, in that network 300 transmits mobile services using digital waveforms over medium 206, which is implemented by the digitization interface of CPRI. BBU 302 includes a baseband processing layer 308, a Nyquist analog-to-digital converter (ADC) 310, a first time division multiplexer/demultiplexer (TDM) 312, and an electrical-optical (E/O) interface 314. In a similar manner, RRH 304 includes an RF front end 316, an RF up-converter 318, a Nyquist digital-to-analog converter (DAC) 320, a second TDM 322, and an optical-electrical (O/E) interface 324.

FIG. 3B is a schematic illustration of a conventional digital MFH link 326 for network 300, FIG. 3A. In an exemplary embodiment, MFH 326 includes a plurality of transmitters 328 (e.g., corresponding to a respective BBU 302) configured to transmit a plurality of respective bit streams 330 over fiber link 306. Operation of network 300 therefore differs from that of network 200, in that, after baseband processing (e.g., by baseband processing layer 308), the waveforms of baseband signals from processor 308 are digitized into bits 330 by Nyquist ADC 310. The digitized bits 330 are then transported to respective receivers 332 (e.g., of a respective RRH 304) over a digital fiber link (e.g., transport medium 306) based on mature optical intensity modulation-direct detection (IM-DD) technology. In the configuration depicted in FIG. 3B, the waveforms of the in-phase (I) and quadrature (Q) components of each wireless service are sampled and quantized separately, and the bits 330 from I/Q components of the different services are multiplexed in the time by first TDM 312. At the respective RRHs 304, after time division de-multiplexing by second TDM 322, Nyquist DAC 320 recovers the I/Q waveforms from received bits 334, which are then up-converted by RF up-converter 318 to RF frequencies and fed to RF front end 316.

Thus, when compared with analog MFH network 200 based on RoF/IFoF technology, digital MFH network 300 demonstrates an improved resilience against nonlinear impairments, and may be implemented by existing digital fiber links, such as, for example, a passive optical network (PON). However, these conventional digital MFH networks suffer from the fact that CPRI has a significantly low spectral efficiency, and may only accommodate few narrowband RATs, such as UMTS (CPRI v1 and v2), WiMAX (v3), LTE (v4), and GSM (v5). Additionally, because CPRI uses TDMs to aggregate services, time synchronization is an additional challenge to the coexistence of multiple RATs with different clock rates. With the low spectral efficiency and the lack of support to Wi-Fi and 5G-NR, CPRI has proven to be a technically-infeasible and cost-prohibitive digitization interface for 5G heterogeneous MFH networks. Accordingly, it is desirable to develop more universal digitization techniques that enable cost-effective carrier aggregation of multiple RATs (multi-RATs) in the next generation heterogeneous MFH networks.

BRIEF SUMMARY

In an embodiment, a digital mobile fronthaul (MFH) network includes a baseband processing unit (BBU) having a digitization interface configured to digitize, using delta-sigma digitization, at least one wireless service for at least one radio access technology. The network further includes a transport medium in operable communication with the BBU. The transport medium is configured to transmit a delta-sigma digitized wireless service from the BBU. The network further includes a remote radio head (RRH) configured to operably receive the delta-sigma digitized wireless service from the BBU over the transport medium.

In an embodiment, a method for performing delta-sigma digitization of an aggregated signal is provided. The aggregated signal includes a plurality of different signal bands from a communication network. The method includes steps of oversampling the aggregated signal at rate equal to an oversampling rate times the Nyquist sampling rate to generate an oversampled signal and quantization noise, noise shaping the oversampled signal to push the quantization noise into out-of-band frequency spectra corresponding to respective spectral portions between the plurality of different signal bands, and filtering the noise shaped signal to remove the out-of-band quantization noise from the plurality of different signal bands.

In an embodiment, a baseband processing unit includes a baseband processor configured to receive a plurality of component carriers of a radio access technology wireless service, and a delta-sigma digitization interface configured to digitize at least one carrier signal of the plurality of component carriers into a digitized bit stream, for transport over a transport medium, by (i) oversampling the at least one carrier signal, (ii) quantizing the oversampled carrier signal into the digitized bit stream using two or fewer quantization bits.

In an embodiment, a method for performing delta-sigma analog-to-digital conversion (ADC) of a plurality of component carriers is provided. The method includes steps of obtaining a data rate of a selected communication specification, selecting a quantity of the plurality of component carriers and corresponding modulation formats according to the obtained data rate, determining a signal-to-noise ratio for the selected quantity of component carriers based on error vector magnitude values compatible with the selected communication specification, calculating a number of quantization bits and a noise transfer function according to the number of quantization bits, and quantizing the plurality of component carriers into a digitized bit stream according to the number of quantization bits and the noise transfer function.

In an embodiment, a delta-sigma digitization interface is provided for modulating an input analog carrier signal into a digitized bit stream. The interface includes a sampling unit configured to sample the input analog carrier signal at a predetermined sampling rate to produce a sampled analog signal, a delta-sigma analog-to-digital converter configured to quantize the sampled analog signal into the digitized bit stream according to a predetermined number of quantization bits, and an output port for transmitting the digitized bit stream to a transport medium.

In an embodiment, a communication system is provided. The communication system includes a core network, a central unit in operable communication with the core network, at least one distributed unit in operable communication with the central unit, at least one radio resource unit in operable communication with the at least one distributed unit over a next generation fronthaul interface split option from the at least one distributed unit. The at least one distributed unit is different from the central unit.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein:

FIG. 2A is a schematic illustration of a conventional analog mobile fronthaul network.

FIG. 2B is a schematic illustration of a conventional analog mobile fronthaul link for the network depicted in FIG. 2A.

FIG. 4A is a schematic illustration of a digital mobile fronthaul network according to an embodiment of the present disclosure.

FIG. 4B is a schematic illustration of a digital mobile fronthaul link for the network depicted in FIG. 4A.

FIG. 13A is a schematic illustration of a filter according to an embodiment of the present disclosure.

FIG. 13B is a graphical illustration depicting an I-Q plot for a noise transfer function for the filter depicted in FIG. 13A.

FIG. 13C is a graphical illustration depicting a frequency response of the noise transfer function for the filter depicted in FIG. 13A.

FIG. 14A is a graphical illustration depicting a spectrum plot according to an embodiment of the present disclosure.

FIG. 14B is a graphical illustration depicting a close-up view of the carrier spectrum portion depicted in FIG. 14A.

FIG. 16A is a schematic illustration of a filter according to an embodiment of the present disclosure.

FIG. 16B is a graphical illustration depicting an I-Q plot for a noise transfer function for the filter depicted in FIG. 16A.

FIG. 16C is a graphical illustration depicting a frequency response of the noise transfer function for the filter depicted in FIG. 16A.

FIG. 17A is a graphical illustration depicting a spectrum plot according to an embodiment of the present disclosure.

FIG. 17B is a graphical illustration depicting a close-up view of the carrier spectrum portion depicted in FIG. 17A.

Figure 1:
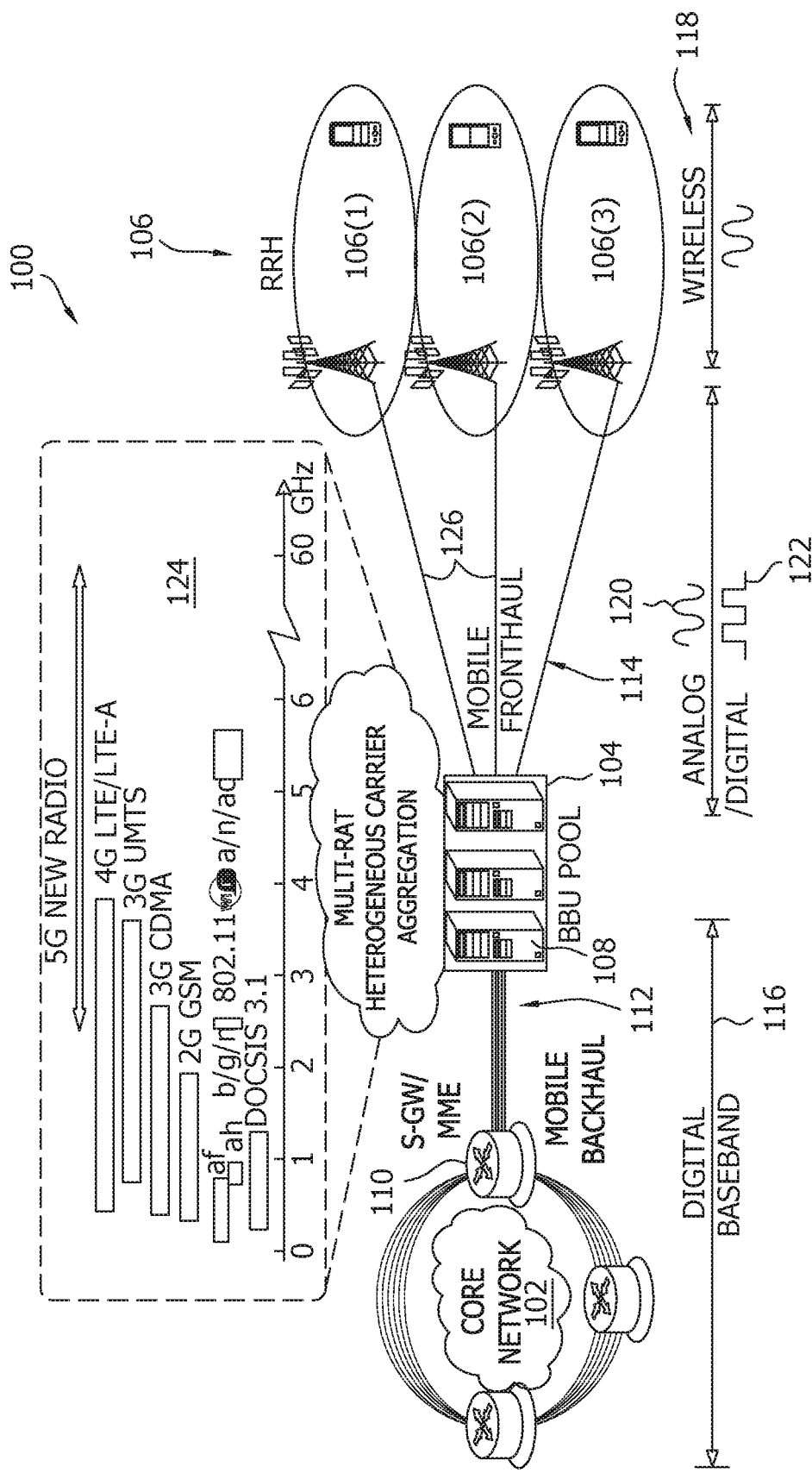
FIG. 1 is a schematic illustration of a conventional access network architecture.

Unless otherwise indicated, the drawings provided herein are meant to illustrate features of embodiments of this disclosure. These features are believed to be applicable in a wide variety of systems including one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a," "an," and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

As used herein, the terms "processor" and "computer" and related terms, e.g., "processing device", "computing device", and "controller" are not limited to just those integrated circuits referred to in the art as a computer, but broadly refers to a microcontroller, a microcomputer, a programmable logic controller (PLC), an application specific integrated circuit (ASIC), and other programmable circuits, and these terms are used interchangeably herein. In the embodiments described herein, memory may include, but is not limited to, a computer-readable medium, such as a random access memory (RAM), and a computer-readable non-volatile medium, such as flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include computer program storage in memory for execution by personal computers, workstations, clients, and servers.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

Furthermore, as used herein, the term "real-time" refers to at least one of the time of occurrence of the associated events, the time of measurement and collection of predetermined data, the time for a computing device (e.g., a processor) to process the data, and the time of a system response to the events and the environment. In the embodiments described herein, these activities and events occur substantially instantaneously.

According to the embodiments described herein, multi-band delta-sigma digitization systems and methods enable carrier aggregation of multi-RATs in next generation heterogeneous MFH networks. The present multiband delta-sigma ADC techniques allow different RAT technologies, such as, 4G-LTE, Wi-Fi, and 5G-NR signals, to be aggregated and delivered together with shared MFH networks. The present embodiments advantageously enable the aggregation of heterogeneous wireless services from multi-RATs in the frequency domain, and then the digitization of the aggregated services simultaneously in an "as is" manner, that is, without frequency conversion.

These advantageous configurations are thus able to circumvent clock rate compatibility and time synchronization problems arising from multi-RAT coexistence, while also eliminating the need of DAC and RF devices at remote cell cites (e.g., RRHs), thereby further enabling a low-cost, all-analog implementation of RRHs where desired. The present embodiments further significantly reduce the cost and complexity of 5G small cells, while also facilitating large-scale dense deployment of heterogeneous 5G MFH networks. The present systems and methods further provide an innovative digitization interface advantageously replaces CPRI, thereby realizing a significantly higher spectral efficiency, while also offering improved compatibility for multi-RAT coexistence in 5G heterogeneous MFH networks.

Figure 3A:
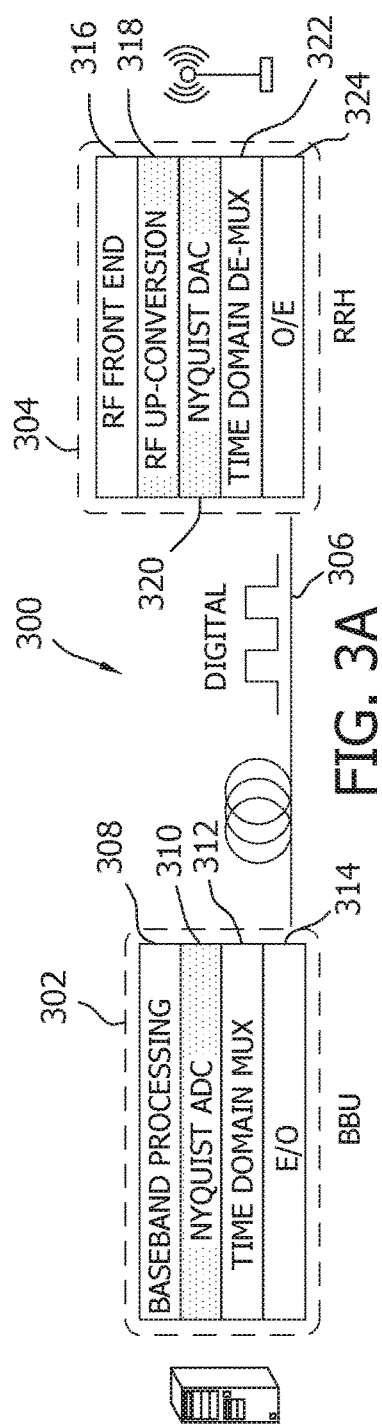
FIG. 3A is a schematic illustration of a conventional digital mobile fronthaul network.

FIG. 4A is a schematic illustration of a digital MFH network 400. Network 400 is similar to networks 200, FIG. 2A, 300, FIG. 3A in a number of respects, but represents an improved digitization interface for implementing multiband delta-sigma digitization. MFH network 400 includes at least one BBU 402 in operable communication with an RRH 404 over a transport medium 406 (e.g., an optical fiber). BBU 402 includes a baseband processor 408, an RF up-converter 410, a delta-sigma ADC 412, and an E/O interface 414. In a similar manner, RRH 404 includes an RF front end 416, a BPF 418, and an O/E interface 420.

Figure 3B:
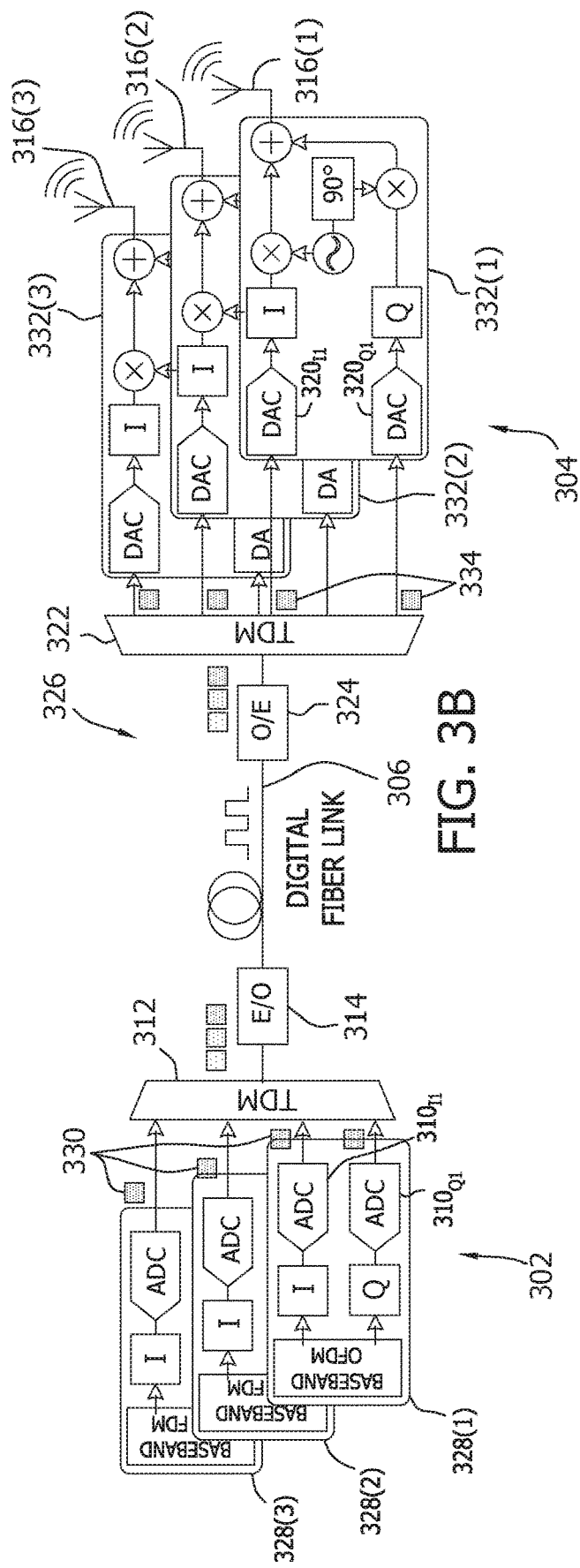
FIG. 3B is a schematic illustration of a conventional digital mobile fronthaul link for the network depicted in FIG. 3A.

FIG. 4B is a schematic illustration of a digital MFH link 422 for network 400, FIG. 4A. In exemplary operation of link 422, at respective transmitters 424 (e.g., of respective BBUs 402), after baseband processing by baseband processor 408, a plurality of various wireless services 426 (e.g., from different RATs) are up-converted by RF up-converter 410 to RF frequencies, and then aggregated in the frequency domain by an FDM 428. The wireless signals of aggregated services 426 are then digitized by delta-sigma ADC 412 (e.g., a multiband delta-sigma ADC) to generate a digitized delta-sigma data stream 430. In the exemplary embodiment, delta-sigma ADC 412 digitizes multiband signals/services 426 simultaneously. Unlike Nyquist ADC techniques used in CPRI (e.g., by Nyquist ADC 310, FIG. 3), which only digitize baseband signals, multiband delta-sigma ADC 412 is advantageously able to digitize wireless services 426 in an "as is" manner, without the need of frequency down-conversion.

In the exemplary embodiment depicted in FIG. 4B, transmitters 424 are depicted, for example, to illustrate the RF up-conversion of I and Q components of different wireless services. Further to this example, in this architecture, respective RF devices, including without limitation local oscillators 432, mixers 434, and delta-sigma ADCs 412 may all be advantageously centralized in BBU 402, whereas only BPFs 418 and respective antennas of RF front ends 416 are needed in RRHs 404. This simplified design enables a DAC-free and RF-free RRH, which may be further advantageously implemented by essentially all relevant analog devices. This configuration is particularly advantageous with respect to the 5G paradigm, given the wide and dense deployment of small cells. That is, an all-analog, DAC-free, RF-free architecture (i.e., according to FIGS. 4A-B) will significantly reduce the cost and complexity of existing and future RRHs.

In the embodiments depicted in FIGS. 4A-B, the digital MFH architecture is depicted to implement FDM (e.g., FDM 428) to multiplex wireless services (e.g., services 426), and analog BPFs (e.g., BPFs 418) to separate the multiplexed wireless services. This configuration thus avoids the compatibility problem of different baseband chip rates for various RATs, and also circumvents the synchronization problem experienced among the different services. Furthermore, the delta-sigma digitization techniques of the present embodiments provide a waveform-agnostic interface, which not only supports OFDM, but also works with other multi-carrier waveforms, such as filter bank multicarrier (FBMC), universal filtered multicarrier (UFMC), etc.

Figure 5:
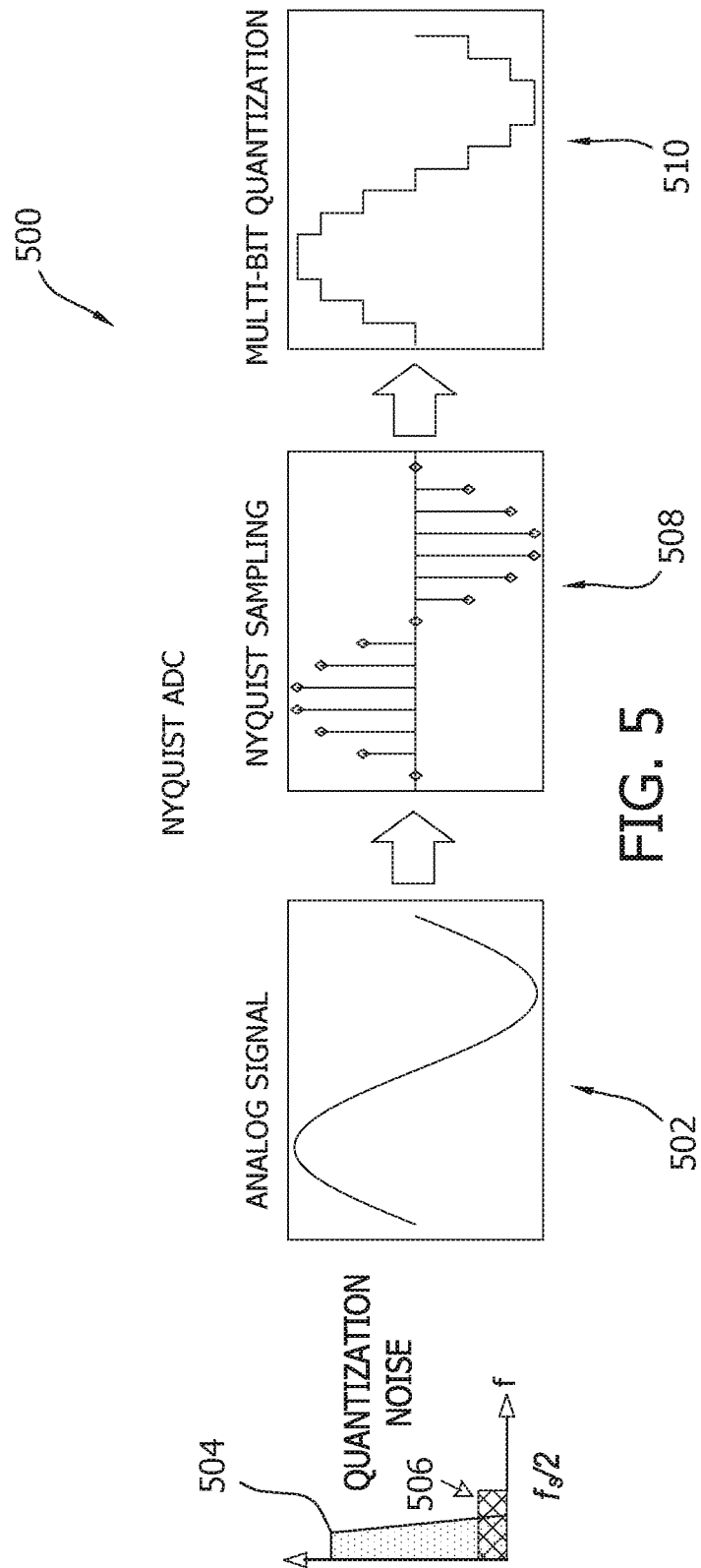
FIG. 5 is a graphical illustration depicting a conventional digitization process.

FIG. 5 is a graphical illustration depicting a conventional digitization process 500. Sampling process 500 depicts the operation of a conventional Nyquist ADC used in CPRI for an analog signal 502 (shown in the time domain). In operation, process 500 bandwidth-limits analog signal 502 as a corresponding frequency domain signal 504 using a low-pass filter. That is, in the frequency domain, analog signal 502 is bandwidth limited to digital signal 504. After digitization, quantization noise 506 is uncorrelated with the frequency of the input signal, and is spread evenly over the Nyquist zone $f_S/2$. In the time domain, process 500 performs Nyquist sampling 508 of analog signal 502 (i.e., at the Nyquist frequency), and quantizes each obtained sample by multiple quantization bits to produce multi-bit quantization signal 510.

Since the quantization noise of a Nyquist ADC is approximately Gaussian, as well as uniformly spread over the Nyquist zone, a very large number of quantization bits are needed to ensure the signal-to-noise ratio (SNR) (e.g., CNR or MER) of the resulting digitized signals 510. Such a large number of required quantization bits leads to low spectral efficiency, as well as a data rate bottleneck of MFH networks.

More specifically, as depicted in FIG. 5, in conventional CPRI Nyquist ADC, each LTE carrier is digitized individually by a Nyquist ADC having, for example, a sampling rate of 30.72 MSa/s. For each sample, 15 quantization bits and one control bit (16 bits total) are used to represent the analog amplitude. The quantization noise (e.g., quantization noise 506) of a Nyquist ADC is evenly distributed in the Nyquist zone in the frequency domain, which can be approximated by Gaussian white noise.

To reduce the quantization noise and increase the SNR of digitized signal, CPRI requires a large number of quantization bits, thereby resulting in the low spectral efficiency and significant bandwidth after digitization, which render CPRI the data rate bottleneck of digital MFH networks. In the case of line coding of 8b/10b, CPRI will consume up to 30.72 MSa/s*16 bit'Sa*10/8*2=1.23 Gb/s of MFH capacity for each 20 MHz LTE carrier. Within a 10-Gb/s PON link, for example, CPRI is only capable of accommodating eight LTE carriers.

Additionally, CPRI is known to operate at a fixed chip rate of 3.84 MHz, and to only support a limited number of RATs, such as UMTS (CPRI v1 and v2), WiMAX (v3), LTE (v4), and GSM (v5). Given the different clock rates of various RATs, time synchronization remains a problem for multi-RAT coexistence. Moreover, the low spectral efficiency and inability to support to Wi-Fi and 5G-NR render CPRI technically lacking and cost-prohibitive as a digitization interface for 5G heterogeneous MFH networks. These drawbacks are solved through implementation of the following innovative processes.

Figure 6A:
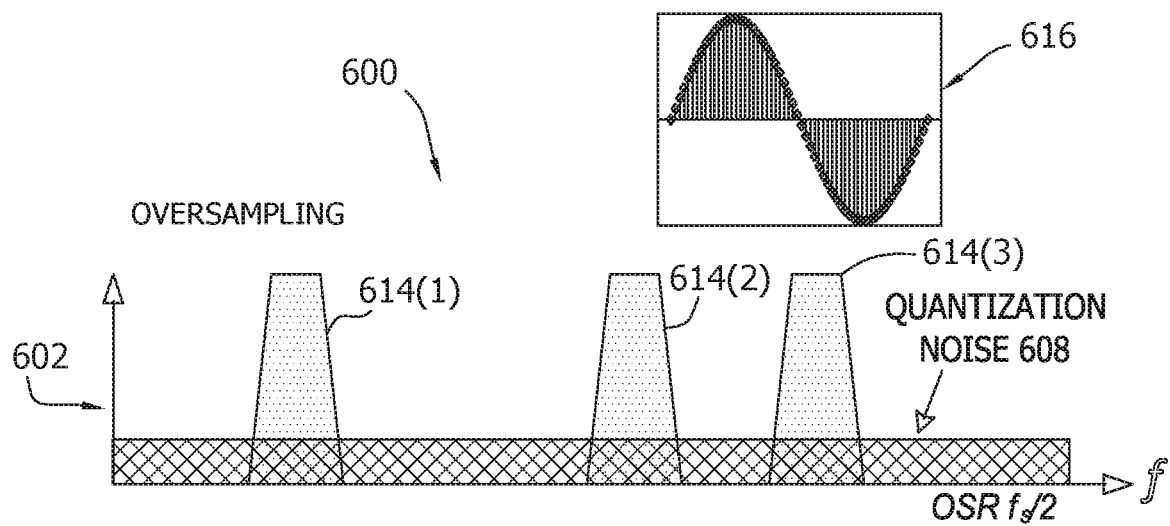
FIGS. 6A-C are graphical illustrations depicting a digitization process according to an embodiment of the present disclosure.
Figure 6B:
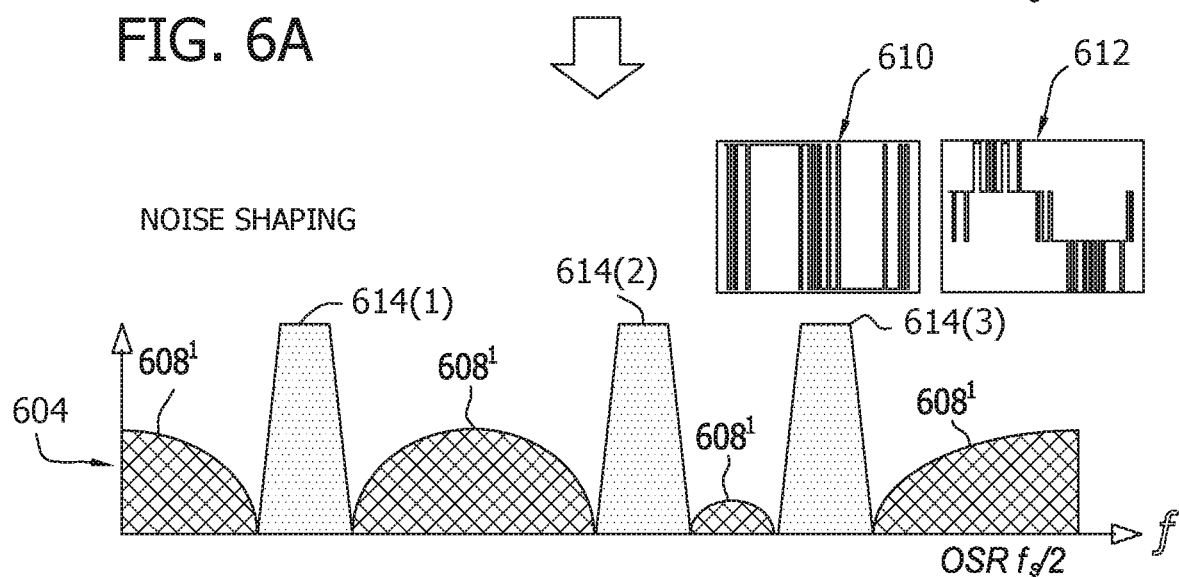
Figure 6C:
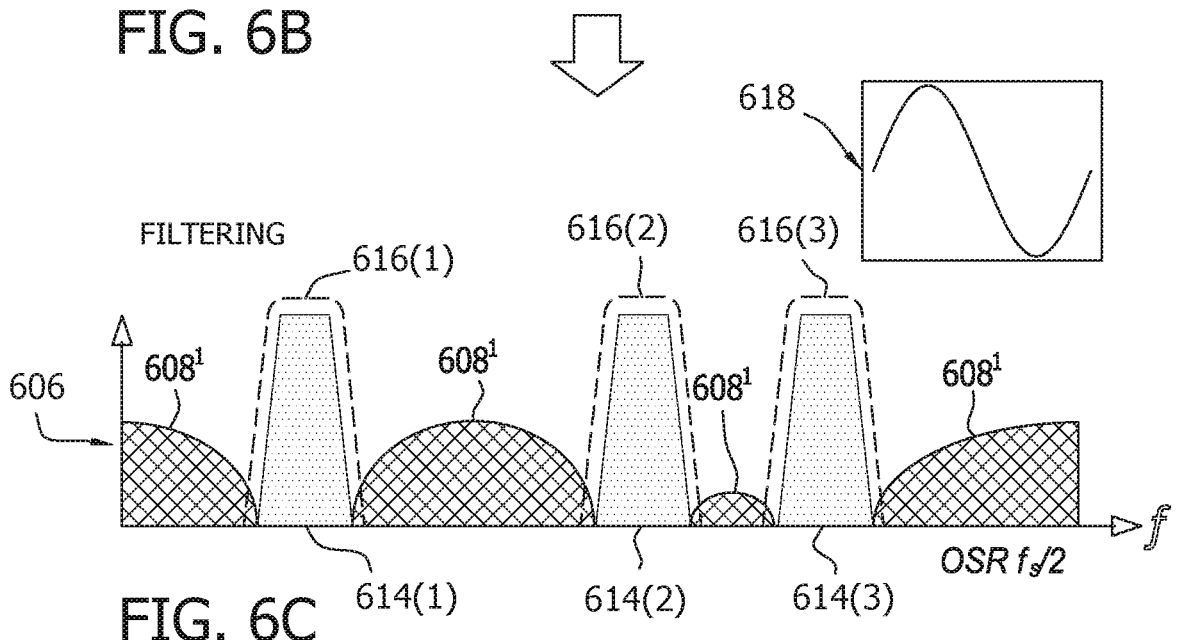

FIGS. 6A-C are graphical illustrations depicting a digitization process 600. In an exemplary embodiment, process 600 demonstrates an operational principle of the multiband delta-sigma ADC techniques described herein, and may be executed by a processor (not shown in FIGS. 6A-C) in one or more BBUs. More specifically, FIG. 6A depicts an oversampling subprocess 602 of process 600, FIG. 6B depicts a noise shaping subprocess 604 of process 600, and FIG. 6C depicts a filtering subprocess 606 of process 600.

In an exemplary embodiment of oversampling subprocess 602, quantization noise 608 is spread over a relatively wide Nyquist zone (e.g., the oversampling rate (OSR) times the Nyquist sampling rate $f_S/2$, or $OSR*f_S/2$). In this example, because the quantization number is limited to one or two quantization bits, namely, one-bit quantization 610 (e.g., a binary, or on-off keying (OOK) signal) or two-bit quantization 612 (e.g., a PAM4 signal), quantization noise 608 is significant. In the exemplary embodiment depicted in FIGS. 6A-C, three non-contiguous signal bands 614 of wireless services are aggregated together. In some embodiments, signal bands 614 come from the same RAT (e.g., intra-RAT carrier aggregation). In other embodiments, signal bands 614 come from different RATs (e.g., inter-RAT carrier aggregation). Oversampling subprocess 602 and thus results in an oversampled analog signal 616.

In an exemplary embodiment of noise shaping subprocess 604, quantization noise 608' is pushed out of the signal bands 614, thereby separating signals from noise in the frequency domain. In this example of subprocess 604, the respective spectra of signal bands 614 are not modified during the operation of digitization process 600. In an exemplary embodiment of filtering subprocess 606, bandpass filters 616 are respectively applied to signal bands 614 to substantially eliminate the out-of-band (OOB) noise (e.g., quantization noise 608') and thereby enable retrieval of an output signal 618 closely approximating the original analog waveform.

This advantageous technique thus represents a significant improvement over the conventional Nyquist ADC techniques described above with respect to FIG. 5. More particularly, through implementation of a multiband delta-sigma ADC according to the operational principles of process 600, the known shortcomings of CPRI may be successfully circumvented. For example, instead of the large number of quantization bits required by conventional CPRI techniques, the present delta-sigma ADC embodiments successfully "trade" quantization bits for the sampling rates described herein. The present techniques thus exploit a high sampling rate, but only require relatively few (i.e., one or two) quantization bits to be fully implemented.

In the exemplary embodiments depicted in FIGS. 6A-C, the OOB quantization noise (e.g., quantization noise 608') is added by the delta-sigma ADC (not shown in FIGS. 6A-C), and which converts the original signal waveform from analog to digital. At the RRH, the original analog waveform (e.g., output signal 618) may then be easily retrieved once the quantization noise is eliminated by filtering (e.g., filtering subprocess 606). From the noise shaping technique of noise shaping subprocess 604 though, the retrieved analog signal may have an uneven noise floor. Accordingly, in an embodiment, the noise shaping technique may be configured to exploit a noise transfer function to control the frequency distribution of quantization noise 608', where each conjugate pair of zero points of the noise transfer function corresponds to a null point of noise. In the design of a multiband delta-sigma ADC, one or two pairs of zeros of the noise transfer function may be assigned to each signal band 614, depending on the bandwidth.

The operational principles of the present delta-sigma ADC may also be advantageously interpreted in the time domain. The present delta-sigma ADC techniques have, for example, a memory effect, whereas conventional Nyquist ADC techniques have no such memory effect. Conventional Nyquist ADC operations quantize each sample individually and independently, and the resultant output bits are only determined by the input amplitude for that particular sample, which has no dependence on previous samples. In contrast, the present delta-sigma ADC techniques are able to digitize samples consecutively whereby a particular output bit may depend not only on the particular input sample, but also on previous samples.

For example, in the case of a sinusoidal analog input, a one-bit delta-sigma ADC according to the present embodiments outputs a high speed OOK signal with a density of "1" bits, proportional to the amplitude of analog input. Thus, when the input is close to its maximum value, the output will include almost all "1" bits. However, when the input is close to its minimum value, the output will include all "0" bits. Similarly, for intermediate inputs, the output will be expected to have an equal density of "0" and "1" bits.

Figure 7A:
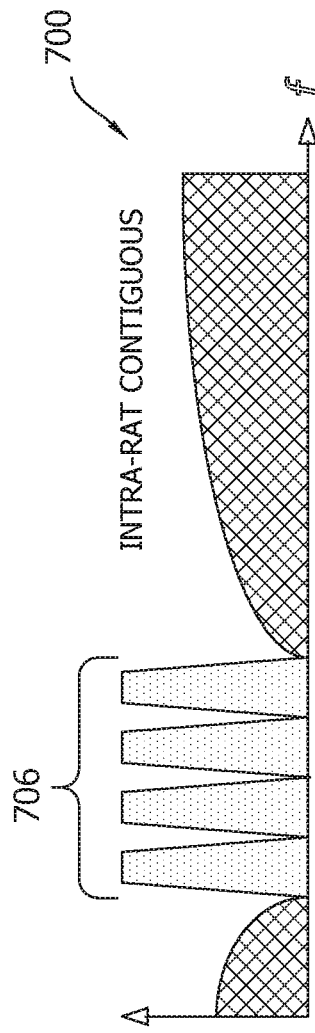
FIGS. 7A-C are graphical illustrations depicting respective applications of the digitization process depicted in FIGS. 6A-C.
Figure 7B:
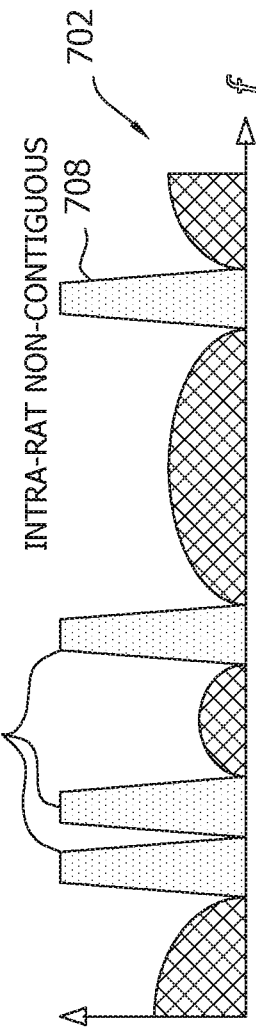
Figure 7C:
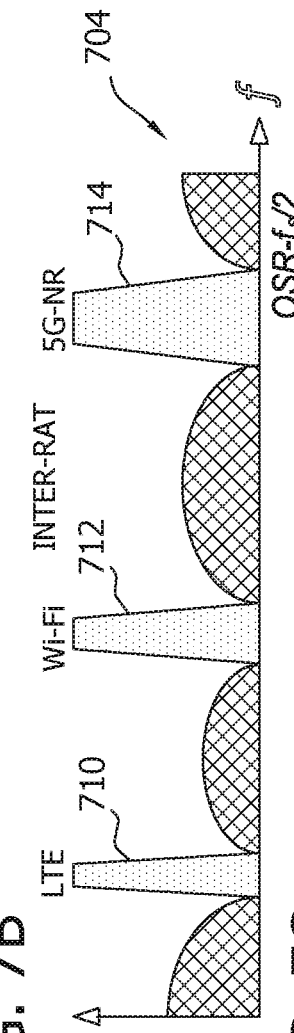

FIGS. 7A-C are graphical illustrations depicting respective applications 700, 702, 704 of digitization process 600, FIGS. 6A-C (e.g., after noise filtering subprocess 604). More specifically, application 700 depicts a case of intra-RAT contiguous carrier aggregation, application 702 depicts a case of intra-RAT non-contiguous carrier aggregation, and application 704 depicts a case of heterogeneous inter-RAT carrier aggregation.

In an exemplary embodiment of application 700, a case of intra-RAT contiguous carrier aggregation may occur where wireless services 706 from the same RAT are bonded together contiguously in the frequency domain, and digitized simultaneously by a single-band delta-sigma ADC. Examples of this scenario include LTE contiguous carrier aggregation and Wi-Fi channel bonding.

In an exemplary embodiment of application 702, a case of intra-RAT non-contiguous carrier aggregation may occur where wireless services 708 from the same RAT are aggregated non-contiguously, and digitized together by a multi-band delta-sigma ADC. Examples of this scenario include LTE non-contiguous carrier aggregation.

In an exemplary embodiment of application 704, a case of heterogeneous inter-RAT carrier aggregation may occur where respective wireless services 710, 712, 714 from different RATs (e.g., an LTE RAT for service 710, a Wi-Fi RAT for service 712, and a 5G-NR RAT for service 714) are aggregated in a heterogeneous MFH network. As illustrated in this embodiment, a waveform/RAT-agnostic digitization interface is provided that eliminates the need for DAC and RF devices in RRHs, while also supporting multiband wireless services with different carrier frequencies and bandwidths from multiple RATs, without presenting the synchronization or compatibility problems experienced by conventional digitization interfaces.

In the embodiments depicted in FIGS. 7A-C, each frequency band is utilized by only one wireless service. Other application scenarios of frequency sharing, such as in the case where one frequency component is occupied by more than one wireless signals (e.g., frequency overlap among multiple RATs or multiple-input multiple-output (MIMO)) are contemplated, but not illustrated in this example. Various frequency ranges of different RATs, including overlaps, are illustrated below in Table 1.

TABLE 1

| RAT | Wi-Fi (802.11) | | | | | WiMAX | | LTE | UWB |
|---|---|---|---|---|---|---|---|---|---|
| Protocol | a | g | n | ac/ax | af | ah | 802.16 e | 3GPP (rel. 8) | 802.15.3a |
| Freq. bands (GHz) | 5.15-5.875 | 2.4-2.497 | 5.15-5.875 | 5.15-5.875 | 0.054-0.698, 0.47-0.79 | <1 | 2.1-5.9 | 0.7-2.6 | 3.168-10.56 |

As can be seen from the information provided in Table 1, problems occur as a result of frequency reuse. As described further below with respect to FIGS. 8 and 9, respectively, the present systems and methods provide further solutions to overcome the problems of frequency reuse based on wavelength division multiplexing (WDM) and power division multiplexing (PDM) technologies.

Figure 8:
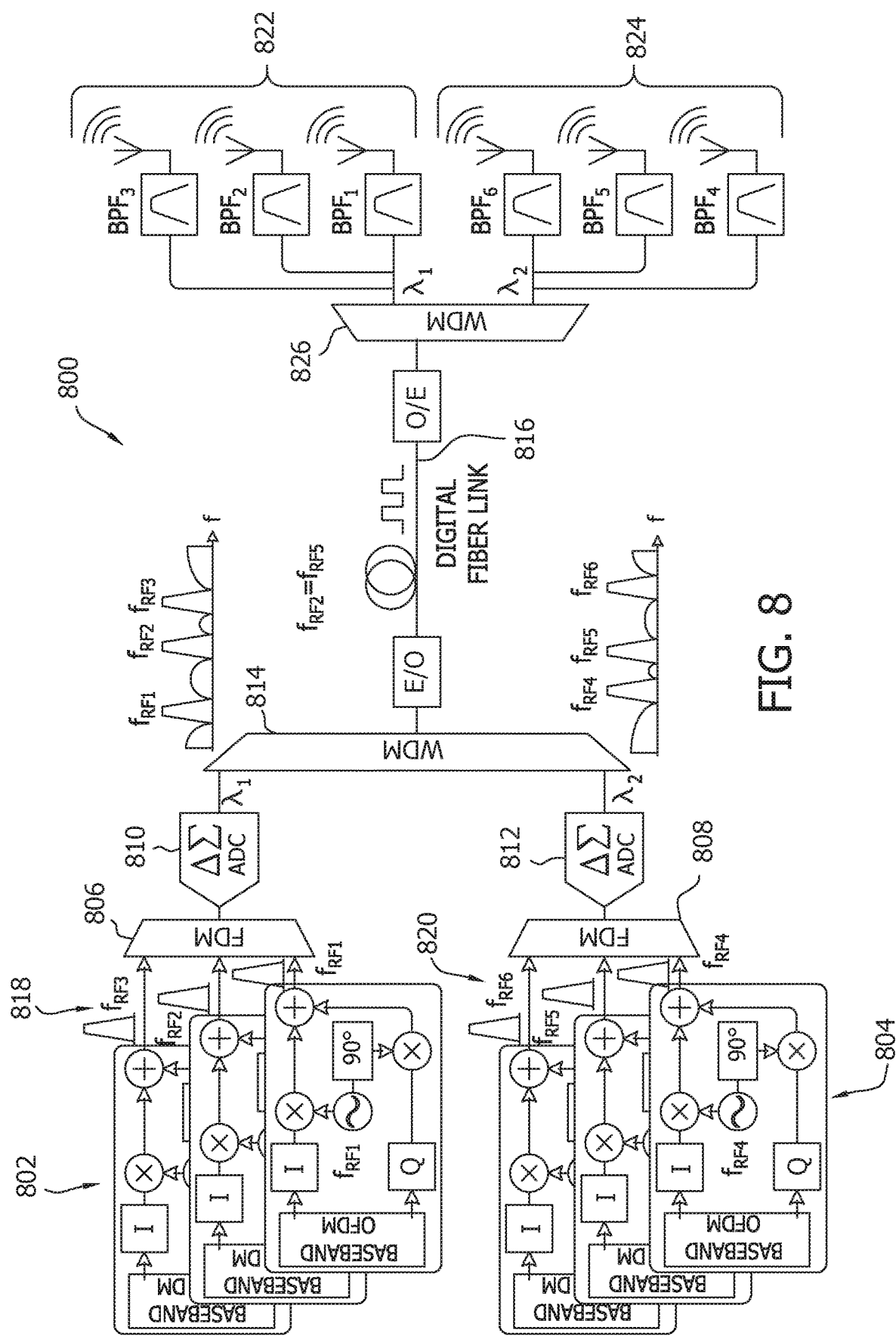
FIG. 8 is a schematic illustration of a mobile fronthaul link implementing wavelength division multiplexing, according to an embodiment of the present disclosure.

FIG. 8 is a schematic illustration of an MFH link 800 implementing WDM. MFH link 800 is similar in some structural respects to MFH link 400, FIG. 4, and includes a first group of transmitters 802 and a second group of transmitters 804 in operational communication with a first FDM 806 and a second FDM 808, respectively. Additionally, first FDM 806 and second FDM 808 are also in operational communication with a first delta-sigma ADC 810 and a second delta-sigma ADC 812, respectively. In an exemplary embodiment of MFH link 800, multiple wireless services at the same RF frequencies may be advantageously digitized and supported by different wavelengths using WDM technology.

More particularly, digital bit streams from first and second delta-sigma ADCs 810, 812 are carried by different wavelengths $\lambda_1$ and $\lambda_2$, respectively, and then multiplexed by a WDM multiplexer 814 onto a single fiber transport medium 816. In the example depicted in FIG. 8, a first $OOK_1$ is carried on wavelength $\lambda_1$, which supports three wireless services 818 at respective frequencies of $f_{RF1}$, $f_{RF2}$, and $f_{RF3}$, and a second $OOK_2$ is carried on wavelength $\lambda_2$, which supports three different wireless services 820 at respective frequencies of $f_{RF4}$, $f_{RF5}$, and $f_{RF6}$. Further in this example, the frequencies $f_{RF2}=f_{RF5}$; however, the two wavelengths $\lambda_1$ and $\lambda_2$ are separated at first RRH 822 and second RRH 824 by a WDM de-multiplexer 826. Thus, the separate services $f_{RF2}$ and $f_{RF5}$ may be filtered out by corresponding filters 828 (e.g., $BPF_2$ and $BPF_5$, respectively, in this example).

Figure 9:
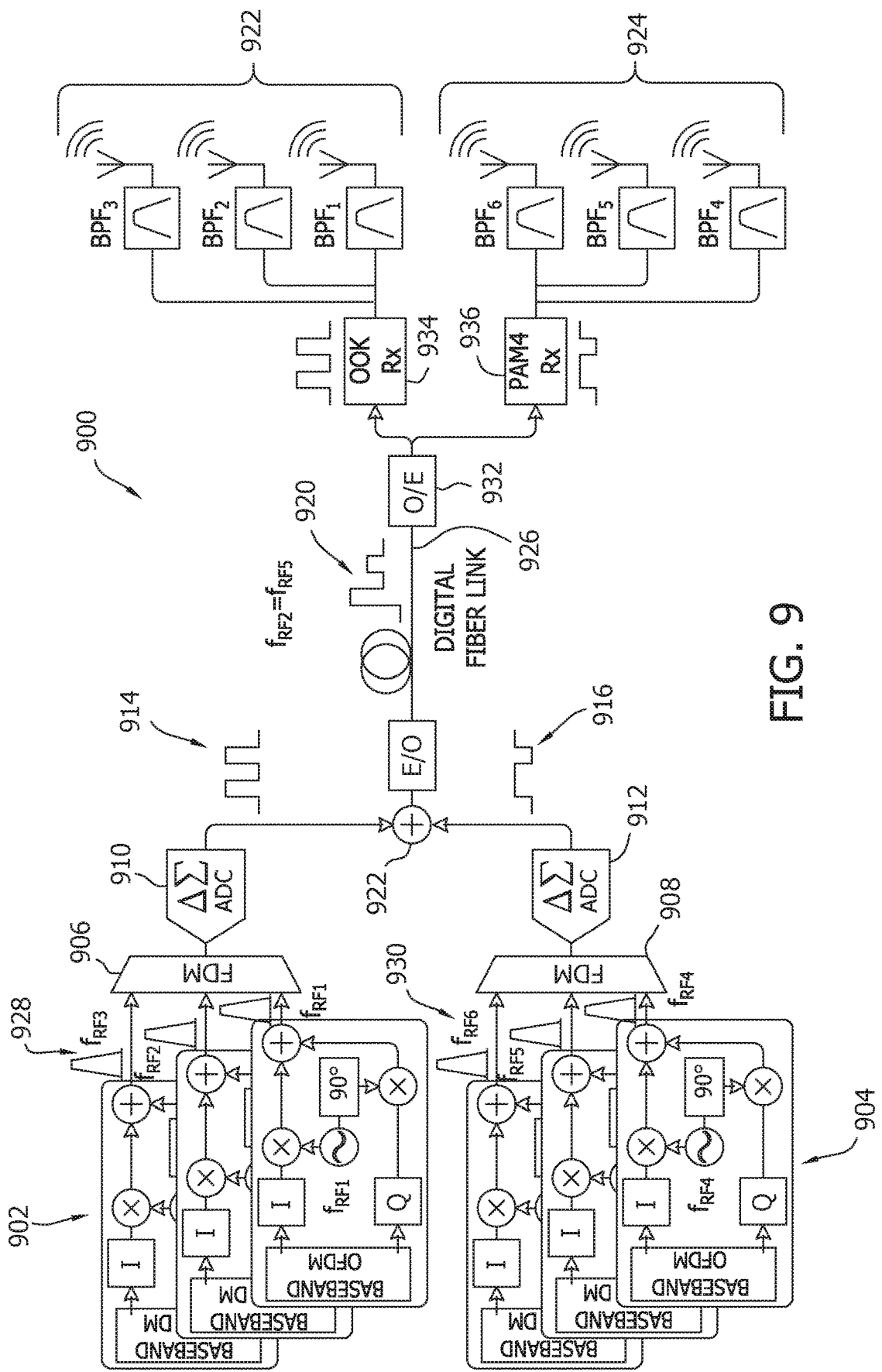
FIG. 9 is a schematic illustration of a mobile fronthaul link implementing power division multiplexing, according to an embodiment of the present disclosure.

FIG. 9 is a schematic illustration of an MFH link 900 implementing PDM. MFH link 900 is similar to MFH link 800, FIG. 8, and includes a first group of transmitters 902 and a second group of transmitters 904 in operational communication with a first FDM 906 and a second FDM 908, respectively. Additionally, first FDM 906 and second FDM 908 are also in operational communication with a first delta-sigma ADC 910 and a second delta-sigma ADC 912, respectively. In an exemplary embodiment of MFH link 900, multiple wireless services at the same RF frequencies may be advantageously supported by different power levels using PDM technology.

More particularly, a first digitized bit stream 914 from first delta-sigma ADC 910 and a second digitized bit stream 916 from second delta-sigma ADC 912 have different amplitudes and may be superimposed in the power domain by a power combiner 918. That is, in MFH link 900, the two digitized bit streams 914, 916 of differing amplitudes are multiplexed in the power division and synthesized to a single 4-level pulse amplitude modulation (PAM4) signal 920. A signal 920 may then be delivered from first and second transmitter groups 902, 904 (e.g., of respective BBUs) to corresponding first and second RRH groups 922, 924, respectively over a single fiber transport medium 926.

Similar to the embodiment depicted in FIG. 8, in MFH link 900, first digitized bit stream 914 represents an $OOK_1$ signal carrying wireless services 928 at respective frequencies of $f_{RF1}$, $f_{RF2}$, and $f_{RF3}$, and second digitized bit stream 916 represents an $OOK_2$ signal carrying different wireless services 930 at respective frequencies of $f_{RF4}$, $f_{RF5}$, and $f_{RF6}$. However, in this example, the amplitude of $OOK_1$ is twice that of $OOK_2$, and thus the summation of the $OOK_1$ and $OOK_2$ signals synthesize PAM4 signal 920 (described further below with respect to FIG. 10). Also similar to the example depicted in FIG. 8, again frequencies $f_{RF2}=f_{RF5}$. In further operation of MFH link 900, prior to reception by first and second RRH groups 922, 924, and further downstream from an O/E interface 932 (e.g., a photodetector), and OOK receiver 934 is configured to retrieve the $OOK_1$ signal, and a PAM4 receiver 936 is configured to retrieve the $OOK_2$ signal. In this example, the relatively larger offset imposed by the $OOK_1$ signal is removed before MFH link 900 is able to retrieve the relatively smaller amplitude of the $OOK_2$ signal.

Figure 10:
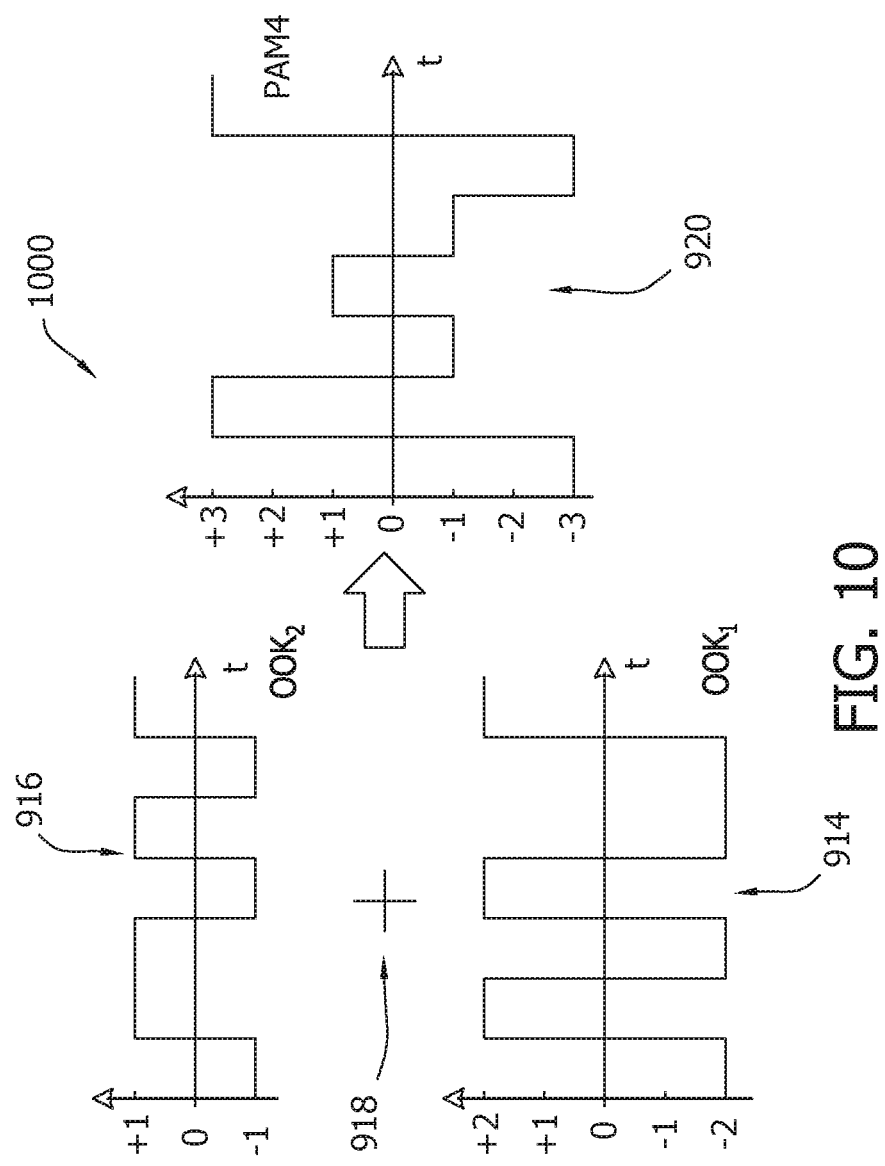
FIG. 10 is a graphical illustration depicting an operating principle of the link depicted in FIG. 9.

FIG. 10 is a graphical illustration depicting an operating principle 1000 of MFH link 900, FIG. 9. In an exemplary embodiment, operating principle 1000 depicts a synthesis effect of PDM using the present delta-sigma digitization techniques. More particularly, operating principle 1000 illustrates the synthesis of PAM4 signal 920 by the summation (e.g., by power combiner 918) of the $OOK_1$ signal of first digitized bit stream 914 and the $OOK_2$ signal of the second digitized bit stream 916. The amplitude ratio of $OOK_1$ signal and the $OOK_2$ signal is 2:1.

According to the embodiments described herein, innovative multiband delta-sigma digitization are provided that are advantageously capable of supporting heterogeneous carrier aggregations in 5G heterogeneous mobile fronthaul networks, including without limitation, 4G-LTE, Wi-Fi, and 5G-NR. The advantageous systems and methods of the present embodiments are further capable of aggregating heterogeneous wireless services in the frequency domain, thereby avoiding the baseband clock rate compatibility and time-synchronization problems arising from multi-RAT coexistence. The present techniques are further capable of digitizing multiband wireless services simultaneously, in an "as is" manner, without requiring frequency conversion, and thereby eliminating the need for DAC and RF devices at RRHs. By providing a significantly lower-cost and efficient all-analog implementation capability for RRHs the present systems and methods are particularly useful to significantly reduce RRH cost and complexity, which will facilitate wide dense deployment of 5G small cells.

The embodiments described herein further propose respective solutions based on wavelength/power division multiplexing (WDM/PDM) technologies to accommodate more than one wireless service at the same frequency. These additional embodiments therefore further enable frequency sharing among multiple RATs and MIMO deployments. Additional exemplary systems and methods for implementing delta-sigma digitization are described in co-pending U.S. patent application Ser. No. 15/847,417, filed Dec. 19, 2017, and to U.S. patent application Ser. No. 16/180,591, filed Nov. 5, 2018, the disclosures of both of which are incorporated by reference herein.

Flexible Digitization Interface

In accordance with one or more of the systems and methods described above, an innovative flexible digitization interface is provided. In an exemplary embodiment, the present digitization interface is based on delta-sigma ADC, which advantageously enables on-demand provisioning of SNR and data rates for WE networks. By eliminating the conventional DAC at the RRH, the present systems and methods are capable of significantly reducing the cost and complexity of small cells. In particular embodiments, the present digitization interface enables an all-analog implementation of RRHs, and is capable of handling variable sampling rates, adjustable quantization bits, and/or flexible distribution of quantization noise. In some embodiments, the interface further utilizes noise shaping techniques to adjust the frequency distribution of quantization noise as needed or desired, thereby further enabling advantageous on-demand SNR and data rate provisioning.

As described above, the rapid growth of mobile data, driven by the emerging video-intensive/bandwidth-hungry services, immersive applications, 5G-NR paradigm technologies (e.g., MIMO, carrier aggregation, etc.), creates significant challenges for existing optical and wireless access networks. The embodiments described above feature an innovative C-RAN architecture that enhances the capacity and coverage of cellular networks and consolidates baseband signal processing and management functions into a BBU pool. The exemplary architectures divide the RANs into two segments: (1) an MBH segment from the core network to the BBUs; and (2) a WE segment from the BBUs to the RRHs.

However, as also described above, conventional techniques such as CPRI, despite the overprovisioning SNR, suffer from low spectral efficiency and lack of scalability/flexibility, rendering such techniques a bottleneck of digital MFH networks for 5G services. Accordingly there is a need for an improved delta-sigma digitization interface to replace CPRI, which not only circumvents the CPRI data-rate bottleneck by improving the spectral efficiency, but also addresses the scalability and flexibility problems from CPRI by advantageously providing reconfigurability and flexibility in terms of sampling rate, quantization bit number, and quantization noise distribution. The present delta-sigma digitization interface thus provides for agile, on-demand SNR and data rate provisioning, while also allowing a significantly simplified RRH design that enables all-analog, DAC-free implementation. Such architectural simplifications significantly reduce the cost and complexity of 5G small cells for wide deployment.

An exemplary architecture that may implement the present flexible digitization interface is described above with respect to FIG. 4. Compared with the conventional digital MFH based on CPRI (e.g., FIG. 3), the Nyquist ADC in the BBU may be replaced by a delta-sigma ADC, and the Nyquist DAC in RRH may be replaced by a BPF. At the BBU, different mobile services are carried on IFs and multiplexed in the frequency domain. After delta-sigma ADC, the services may be digitized into bits and delivered to the RRH, for example, by an optical IM-DD link. At the RRH, a BPF may filter out the desired mobile service, eliminate the OOB quantization noise, and retrieve the analog waveform. This exemplary configuration, where the BPF implements DAC and frequency de-multiplexer functions, significantly reduces the system complexity of the RRH, enables an all-analog implementation thereof, capable of handling any sampling rate or quantization bit number without synchronization problems. Given the wide and dense deployment of small cells in 5G paradigm, this all-analog, DAC-free RRH design will significantly reduce the cost and complexity of small cells.

A comparison of FIG. 5 with FIGS. 6A-C, above, illustrates the difference in operating principles between a Nyquist ADC and a delta-sigma ADC, respectively. As described above, in CPRI, each LTE carrier is digitized individually by a Nyquist ADC with a sampling rate of 30.72 MSa/s and 15 quantization bits. For each sample, 16 bits total (i.e., 15 quantization bits and one control bit) are used to transform the analog amplitude to digital bits. To accommodate various RATs, CPRI has a fixed basic frame rate 3.84 MHz, and can only work at a fixed sampling rate and fixed number of quantization bits. The quantization noise of a Nyquist ADC is evenly distributed in the frequency domain, and therefore CPRI requires a large number of quantization bits to reduce the quantization noise and maintain a high SNR for the digitized signal, thereby leading to the low spectral efficiency and high data bandwidth bottleneck problems.

CPRI data rate options are shown in Table 2, below. With line coding of 8b/10b, CPRI consumes up to 30.72 MSa/s*16 bit/Sa*10/8*2=1.23 Gb/s MFH capacity for each 20 MHz LTE carrier (e.g., Option 2 in Table 2). Within a 10-Gb/s PON, only eight LTE carriers may be accommodated (e.g., Table 2, Option 7). LTE carrier aggregation was initially standardized by 3GPP release 10, which allowed 5 component carriers, and then expanded to allow 32 CCs in 3GPP release 13. This expanded carrier aggregation may consume up to 40 Gb/s fronthaul capacity if digitized by CPRI, which cannot be supported by existing optical/wireless access networks.

TABLE 2

| Option | Line coding | LTE carrier # | Examples | Bit rate (Mb/s) |
|---|---|---|---|---|
| 1 | 8b/10b | 0.5 | Only I or Q | 491.52 × 10/8 = 614.4 |
| 2 | 8b/10b | 1 | One 20-MHz LTE CC | 491.52 × 10/8 × 2 = 1228.8 |
| 3 | 8b/10b | 2 | 2 CA or 2 × 2 MIMO | 491.52 × 10/8 × 4 = 2457.6 |
| 4 | 8b/10b | 2.5 | Only I/Q, 5 CA | 491.52 × 10/8 × 5 = 3072 |
| 5 | 8b/10b | 4 | 4 × 4 MIMO or 2 CA + 2 × 2 MIMO | 491.52 × 10/8 × 8 = 4915.2 |
| 6 | 8b/10b | 5 | 5 CA | 491.52 × 10/8 × 10 = 6144 |
| 7 | 8b/10b | 8 | 8 × 8 MIMO or 2 CA + 4 × 4 MIMO | 491.52 × 10/8 × 16 = 9830.4 |
| 7A | 64b/66b | 8 | 8 × 8 MIMO or 4 CA + 2 × 2 MIMO | 491.52 × 66/64 × 16 = 8110.08 |
| 8 | 64b/66b | 10 | 5 CA + 2 × 2 MIMO | 491.52 × 66/64 × 20 = 10137.6 |
| 9 | 64b/66b | 12 | 3 CA + 4 × 4 MIMO | 491.52 × 66/64 × 24 = 12165.12 |

Figures 11A, 11B:
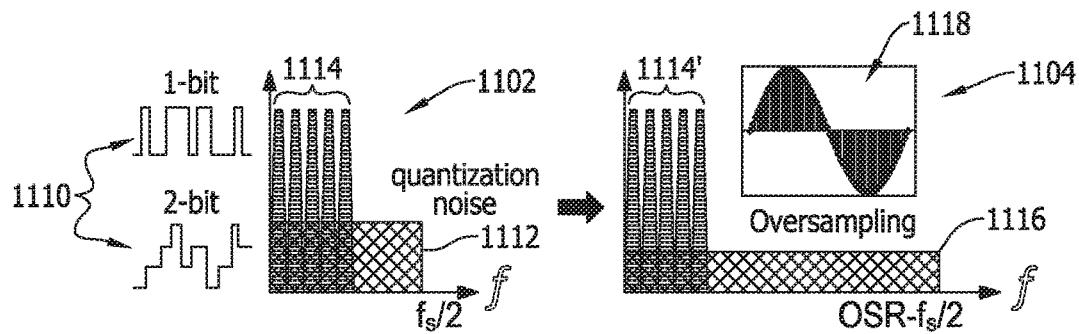
FIGS. 11A-D are graphical illustrations depicting a digitization process according to an embodiment of the present disclosure.
Figures 11C, 11D:
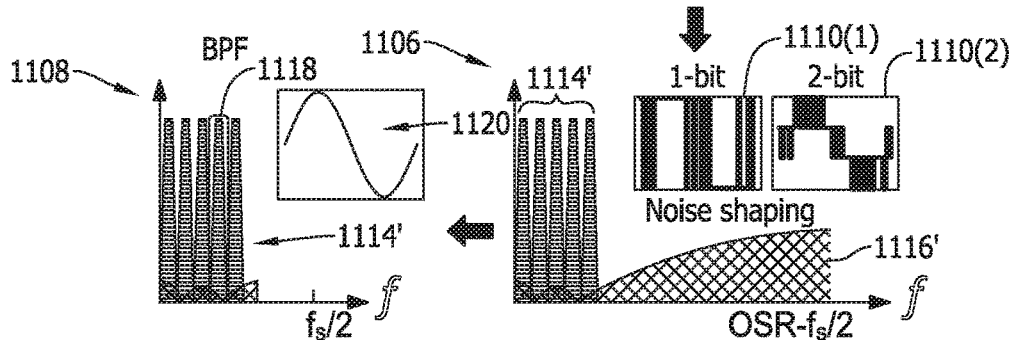

FIGS. 11A-D are graphical illustrations depicting a digitization process 1100. In an exemplary embodiment, process 1100 demonstrates an operational principle of an alternative delta-sigma ADC techniques according to the present systems and methods. Similar to process 600, FIGS. 6A-C, process 1100 may also be executed by a processor in one or more BBUs. More specifically, FIG. 11A depicts a Nyquist sampling condition 1102, FIG. 11B depicts an oversampling subprocess 1104 of process 1100, FIG. 11C depicts a noise shaping subprocess 1106 of process 1100, and FIG. 11D depicts a filtering subprocess 1108 of process 1100.

Sampling condition 1102, for example, represents a case where a limited number of quantization bits 1110 results in significant quantization noise 1112 for non-contiguous aggregated wireless service signal bands 1114 sampled at the Nyquist sampling rate $f_S/2$. In this case, due to the limited number of quantization bits 1110, significant quantization noise is present if the analog signal is sampled at its Nyquist rate. In contrast, in an exemplary embodiment of oversampling subprocess 1104, oversampling extends the Nyquist zone, and quantization noise 1116 is spread over a relatively wider frequency range/wide Nyquist zone (e.g., the oversampling rate (OSR) times the Nyquist sampling rate $f_S/2$, or OSR*$f_S/2$). Similar to the embodiments described above, oversampling subprocess 1104 extends the Nyquist zone, spreads quantization noise 1116 over a wider frequency range, and thereby results in an oversampled analog signal 1118 where in-band SNR is improved.

In an exemplary embodiment of noise shaping subprocess 1106, quantization noise 1116' is pushed out of the signal bands 1114', thereby separating signals from noise in the frequency domain. In this example of subprocess 1106, the respective spectra of signal bands 1114' are not modified during the operation of process 1100. In an exemplary embodiment of filtering subprocess 1108, a BPF 1118 is applied to signal bands 1114' to substantially eliminate the OOB noise, and also enable retrieval of an output signal 1120 closely approximating the original analog waveform.

Process 1100 therefore advantageously circumvents the data rate bottleneck and flexibility issues of CPRI through the innovative flexible digitization interface described above, which is based on delta-sigma ADC. According to the techniques described herein, instead of digitizing each LTE carrier individually, the carriers may first be multiplexed in the frequency domain, and then digitized by a delta-sigma ADC. Unlike the Nyquist ADC, which uses many quantization bits, the present delta-sigma ADC techniques trade quantization bits for sampling rate, exploiting a high sampling rate, but only one or two quantization bits.

According to the present delta-sigma ADC systems and methods, the signal waveforms are transformed from analog to digital by adding quantization noise without changing the spectrum of original analog signal. Therefore, to retrieve the analog waveform, the present delta-sigma digitization processing does not require a DAC, and may instead utilize a BPF to filter out the desired signal (e.g., FIG. 11D), which greatly simplifies the architectural design of the system. Once OOB noise is eliminated, the analog waveform is retrieved. Accordingly, a BPF (e.g., BPF 1118, FIG. 11D) may replace the Nyquist DAC (e.g., Nyquist DAC 320, FIG. 3A), and further perform frequency de-multiplexing functions in additions to the DAC functions, thereby also replacing a de-multiplexer (e.g., time domain de-multiplexer 322, FIG. 3A). In some cases, the retrieved analog signal may have an uneven noise floor from noise shaping.

In some embodiments, the present delta-sigma ADC techniques may also operate in the time domain. One key difference between Nyquist and delta-sigma ADC, for example, is that Nyquist ADC has no memory effect, whereas delta-sigma ADC does have a memory effect. As described above, Nyquist ADC quantizes each sample individually and independently, i.e., current output bits are only determined by the current sample, but have no relevance to previous samples. Delta-sigma ADC, on the other hand, digitizes samples consecutively, i.e., the current output bit may depend on not only the current input sample, but also on previous samples. For example, with a sinusoidal analog input, a one-bit delta-sigma ADC outputs an OOK signal with a density of "1" bits proportional to the input analog amplitude. When the input is close to its maximum, the output contains almost all "1" bits; when the input is close to a minimum value, the output contains all "0" bits (e.g., bits 1110, FIG. 11C). For intermediate inputs, the output will have an equal density of "0" and "1" bits.

The present embodiments thus concentrate a significant quantity of digital signal processing (DSP) capabilities into the BBU, and enable a DAC-free, all analog implementation of the RRHs, which not only reduces the cost and complexity of RRHs significantly, but also makes flexible digitization possible. With an analog RRH, the sampling rate, the number of quantization bits, and the frequency distribution of quantization noise may be flexibly reconfigured according to the required SNR and data rate without experiencing synchronization problems.

As described further below with respect to FIGS. 12-25B, a digitization process (i.e., FIG. 12) is provided for several exemplary implementation scenarios (i.e., FIGS. 13A-25B) that demonstrate the flexibility and reconfigurability of the present delta-sigma digitization interface for on-demand SNR provisioning.

More specifically, five exemplary scenarios are described and illustrated below, which demonstrate the reconfigurability of the present delta-sigma digitization interface in terms of sampling rate, quantization bits, and noise distribution. The flexibility of the present digitization interface is described with respect to enhanced capabilities for on-demand provisioning of SNR, and also of data rate (e.g., for LTE). In some of the examples described below, the SNR is evaluated in terms of error vector magnitude (EVM). Exemplary 3GPP EVM requirements for different modulation formats are listed in Table 3, below.

TABLE 3

| Modulation | QPSK | 16QAM | 64QAM | 256QAM | 1024QAM* |
|---|---|---|---|---|---|
| EVM (%) | 17.5 | 12.5 | 8 | 3.5 | 1 |

With respect to Table 3, it is noted that the 3GPP specification only includes modulation formats up to 256QAM, and therefore does not include an EVM for the 1024QAM modulation format. Accordingly, an EVM value of 1% it is included in Table 3 as a tentative criterion.

The five separate exemplary implementation scenarios are illustrated in Table 4, below. These exemplary implementation scenarios demonstrate the flexibility of the present delta-sigma digitization techniques for on-demand provisioning of SNR and LTE data rates, in terms of ADC order, sampling rate, quantization bits, and noise distribution. For each Case listed in Table 4, different modulation formats are assigned to different carriers according to the respective SNR and EVM requirements specified by 3GPP for the particular modulation order. Accordingly, several different data rate options may be provisioned depending on the distribution of quantization noise.

TABLE 4

| Case | I | II | III | IV | V |
|---|---|---|---|---|---|
| Order | 2 | 4 | 4 | 4 | 4 |
| Bits | 1 | 1 | 2 | 1 | 2 |
| Digital waveform | OOK | OOK | PAM4 | OOK | PAM4 |

TABLE 4-continued

| Case | I | II | III | IV | V |
|---|---|---|---|---|---|
| MFH capacity (Gb/s) | 10 | 10 | 20 | 10 | 20 |
| LTE carriers | 32 | 32 | 32 | 37 | 37 |
| MFH capacity per LTE carrier (Mb/s) | 312.5 | 312.5 | 625 | 270.27 | 540.54 |
| SE Improvement than CPRI | 3.93 | 3.93 | 1.97 | 4.55 | 2.27 |
| Modulation | 64QAM × 18 16QAM × 14 | 256QAM × 16 64QAM × 16 | 1024QAM × 10 256QAM × 22 | 256QAM × 12 64QAM × 25 | 1024QAM × 8 256QAM × 29 |
| Raw LTE data rate (Gb/s) | 2.952 | 4.032 | 4.968 | 4.428 | 5.616 |
| Digitization efficiency | 0.30 | 0.40 | 0.25 | 0.44 | 0.28 |
| Comments | Low cost Low SNR Low data rate | High SE | High SNR High data rate | Highest SE | High SNR High data rate |
| FIGS. | 13A-15B | 16A-18B | 19A-20B | 21A-23B | 24A-25B |

In the first Case I example, which is based on a second-order one-bit delta-sigma ADC, a relatively simple, low-cost MFH solution is provided, and which exhibits a limited SNR and low data rate, and which is capable of digitizing 32 carriers with low modulation formats (e.g., 64QAM and 16QAM). This exemplary embodiment is described further below with respect to FIGS. 13-15.

In the Case II example, the order of delta-sigma ADC is upgraded from two to four, which significantly reduces the quantization noise. Accordingly, higher SNR and modulation formats may be supported to provision a larger data rate. This exemplary embodiment is described further below with respect to FIGS. 16-18. In the Case III example, the quantization bit number is increased from one to two, which further reduces the quantization noise. Accordingly, even higher SNR and modulation formats may be supported. This exemplary embodiment is described further below with respect to FIGS. 19-20.

As listed in Table 4, the Case IV (described further below with respect to FIGS. 21-23) and Case V (described further below with respect to FIGS. 21-23) examples may utilize a fourth-order ADC similarly to an ADC implemented with respect to the Case II and Case III examples, but a different noise distribution. That is, the frequency distribution of quantization noise in the Case II and Case III example scenarios is tuned to maximize the SNR for 32 carriers. In contrast, the Case IV and Case V example scenarios may implement the same fourth-order ADC, but tune the noise distribution to accommodate 5 more carriers, with a slight SNR penalty. For example, the Case II example scenario may support 16 carriers of 256QAM, and 16 carriers of 64QAM, whereas the Case IV example scenario may accommodate 5 additional carriers, but with only 12 of the Case IV carriers having sufficient SNR to support 256QAM (i.e., the remaining 25 Case IV carriers will only support 64QAM. Nevertheless, in the Case IV example scenario, the overall LTE data rate is improved by approximately 10%.

For the exemplary embodiments described in Table 4, above, and also with respect to the following embodiments, the exemplary carriers are described as LTE carriers (e.g., Table 2), for purposes of illustration. Nevertheless, the person of ordinary skill in the art will understand that these examples are provided for ease of explanation, and are not intended to be limiting. Thus, as shown in Table 2, CPRI consumes 1228.8 Mb/s MFH capacity for each LTE carrier. In contrast, as shown in Table 4, according to the present delta-sigma digitization interface techniques, each LTE carrier consumes 270.27-625 Mb/s MFH capacity, and the resultant spectral efficiency (SE) is improved by 1.97-4.55 times in comparison with CPRI.

Figure 12:
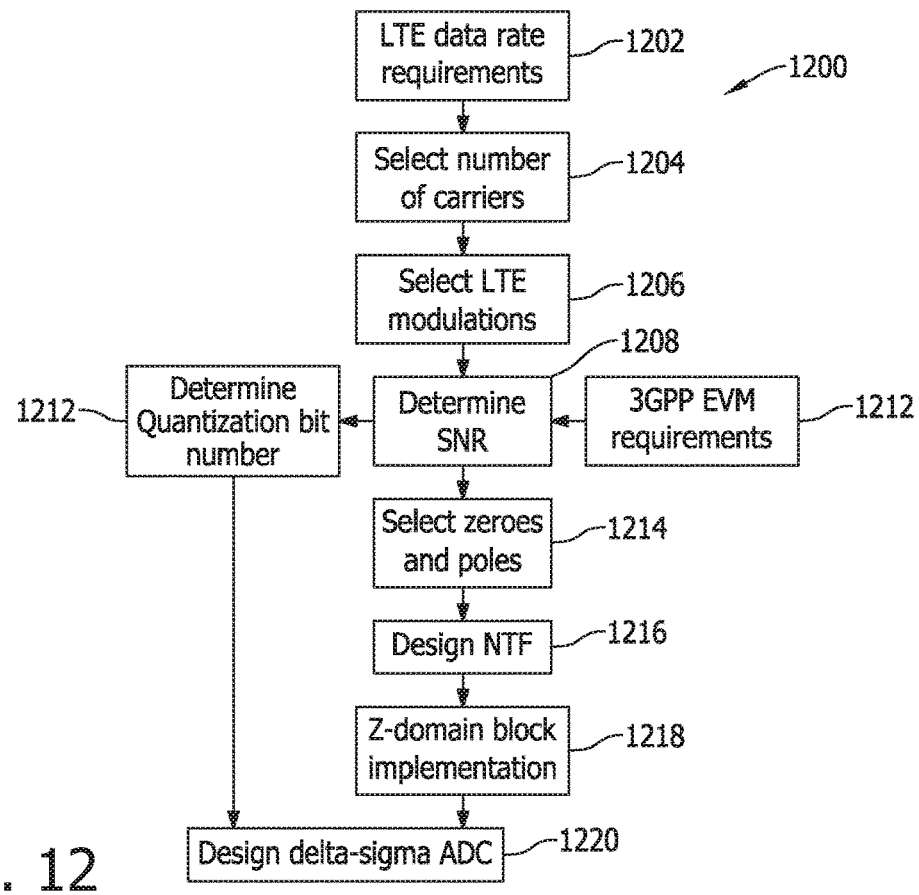
FIG. 12 is a flow diagram for a digitization process according to an embodiment of the present disclosure.

FIG. 12 is a flow diagram for a digitization process 1200. Similar to process 1100, FIGS. 11A-D, digitization process 1200 may also be executed by a processor of one or more BBUs for implementing the present flexible delta-sigma digitization interface, and with respect to carriers, such as LTE, for example, having particular data rate requirements.

In an exemplary embodiment, the number of LTE carriers and their particular modulation formats may be selected according to the demanded LTE data rate. SNR requirements and the number of quantization bits may then be determined, while keeping the EVM performance of each LTE carrier compatible with 3GPP specifications. According to the determined noise distribution, zeros and poles of a noise transfer function (NTF) may then be calculated, and a Z-domain block diagram may be implemented for the design of the delta-sigma ADC, based on the NTF and quantization bit number.

In an embodiment, digitization process 1200 may be implemented as a series of logical steps. The person of ordinary skill in the art though, will understand that except where indicated to the contrary, one or more the following steps may be performed in a different order and/or simultaneously. In the exemplary embodiment, process 1200 begins at step 1202, in which the LTE data rate requirements are obtained. In step 1204, process 1200 selects the number of LTE carriers according to the LTE data rate requirements obtained in step 1202. In an exemplary embodiment of step 1204, the particular LTE data rate requirements are previously known, i.e., stored in a memory of, or in operable communication with, the respective processor implementing process 1200. In step 1206, process 1200 selects the LTE modulation format(s) applicable to the obtained data rate and the selected carriers.

In step 1208, process 1200 determines the SNR requirements according to the relevant communication standard (3GPP, in this example), and in consideration of the LTE carriers and modulation formats selected. In step 1210, process 1200 may additionally obtain the particular EVM requirements of the relevant standard (e.g., 3GPP), such that the EVM performance of each LTE carrier may be maintained according to the particular standard. Step 1210 may, for example, be performed before, after, or simultaneously with step 1208.

After the SNR requirements are determined, process may implement separate sub-process branches. In an exemplary first branch/subprocess, in step 1212, process 1200 determines the quantization bit number. In an exemplary embodiment, step 1214 may be performed in an exemplary second branch/subprocess. In step 1214, process 1200 calculates the zeros and poles for the NTF. In step 1216, process 1200 determines the NTF and distribution of quantization noise in the frequency domain corresponding to the zeros and poles selected in step 1214. In step 1218, process 1200 implements a logical Z-domain block filter configuration having an order corresponding to the number of zeros of the NTF. In step 1220, process 1200 configures the delta-sigma ADC from the quantization bits determined in step 1212 and from the Z-domain block configuration implemented in step 1216.

FIG. 13A is a schematic illustration of a filter 1300. In an embodiment, filter 1300 may represent a Z-block diagram and/or impulse response filter for a delta-sigma ADC according to the systems and methods described herein. In an exemplary embodiment, filter 1300 is a second-order delta-sigma ADC that may be implemented for the Case I implementation scenario illustrated in Table 4. More particularly, in the example depicted in FIG. 13A, filter 1300 operates with respect to a second-order delta-sigma ADC working at 10 GSa/s with one quantization bit and, after digitization, filter 1300 operates to transform 32 LTE carriers, at an input 1302, into a 10 Gb/s OOK signal, for example, at an output 1304. In an exemplary embodiment, because the relevant NTF of the delta-sigma ADC has an order of two, filter 1300 includes two feedforward coefficients a, and two feedback loops 1306 each having a $z^{-1}$ delay cell. In the embodiment depicted in FIG. 13A, filter 1300 includes a "DAC" recursion 1308 for implementing the delta-sigma memory effect of past outputs, described above, and a one-bit quantizer 1310.

FIG. 13B is a graphical illustration depicting an I-Q plot 1312 for the NTF for filter 1300, FIG. 13A. Plot 1312 illustrates the respective zeros and poles of the second-order NTF for filter 1300, which has a conjugate pair of zeros, and a conjugate pair of poles. In the embodiment depicted in FIG. 13B, the two conjugate zeros may be seen to degenerate to z=1, which corresponds to a DC frequency (i.e., f=0).

FIG. 13C is a graphical illustration depicting a frequency response 1314 of the NTF for filter 1300, FIG. 13A. In an exemplary embodiment, frequency response 1314 represents a distribution of quantization noise in the frequency domain. In an embodiment of the delta-sigma ADC described herein, the distribution of quantization noise is uneven, and may therefore be determined by the zeros of the NTF (e.g., FIG. 13B). That is, each zero corresponds to a null point 1316 of quantization noise on frequency response 1314. In this example, using a sampling rate of 10 GSa/s, the relevant Nyquist zone is shown to occur in the range of 0-5 GHz. The only zero may then be seen to be located along frequency response 1314 at f=0. Accordingly, the quantization noise is shown to be minimized at DC, and to rapidly increase with frequency along frequency response 1314.

Thus, according to the embodiments depicted in FIGS. 13A-C, LTE carriers at lower frequencies may be seen to have smaller quantization noise and higher SNR, while also supporting higher modulation formats. In contrast, the higher frequency carriers are seen to have smaller SNR, and will only be capable of accommodating lower modulation formats. The exemplary second-order configuration may therefore be capable of accommodating 32 LTE carriers with differential SNR provisioning, where the first 18 carriers thereof will have sufficient SNR to accommodate a 64QAM modulation format, and the remaining 14 carriers will be capable of supporting a 16QAM modulation format.

According to the exemplary embodiment of FIGS. 13A-C, after digitization, 32 LTE carriers may be transformed into a 10 Gb/s digital OOK signal. Accordingly, each individual LTE carrier will consume 312.5 Mb/s MFH capacity (i.e., 10 Gb/s/32 carriers=312.5 Mb/s per carrier). Compared with CPRI, where each LTE carrier consumes a MFH capacity of 1228.8 Mb/s, the spectral efficiency is improved by 3.93 times according to the present embodiments.

FIG. 14A is a graphical illustration depicting a spectrum plot 1400. In an exemplary embodiment, spectrum plot 1400 illustrates the frequency spectrum including the 32 LTE carriers digitized by a second-order one-bit delta-sigma ADC (e.g., FIG. 13A). In the example depicted in FIG. 14A, the respective spectra of the 32 LTE carriers are contained within a carrier spectrum portion 1402. In some embodiments, to further improve the SNR of LTE carriers at high frequencies, a pre-emphasis may be used to boost the power of high frequency carriers.

FIG. 14B is a graphical illustration depicting a close-up view of carrier spectrum portion 1402, FIG. 14A. Within the close-up view, the first 18 of the 32 LTE carriers (i.e., at 64QAM) may be more readily distinguished from the remaining 14 LTE carriers (i.e., at 16QAM).

Figure 15B:
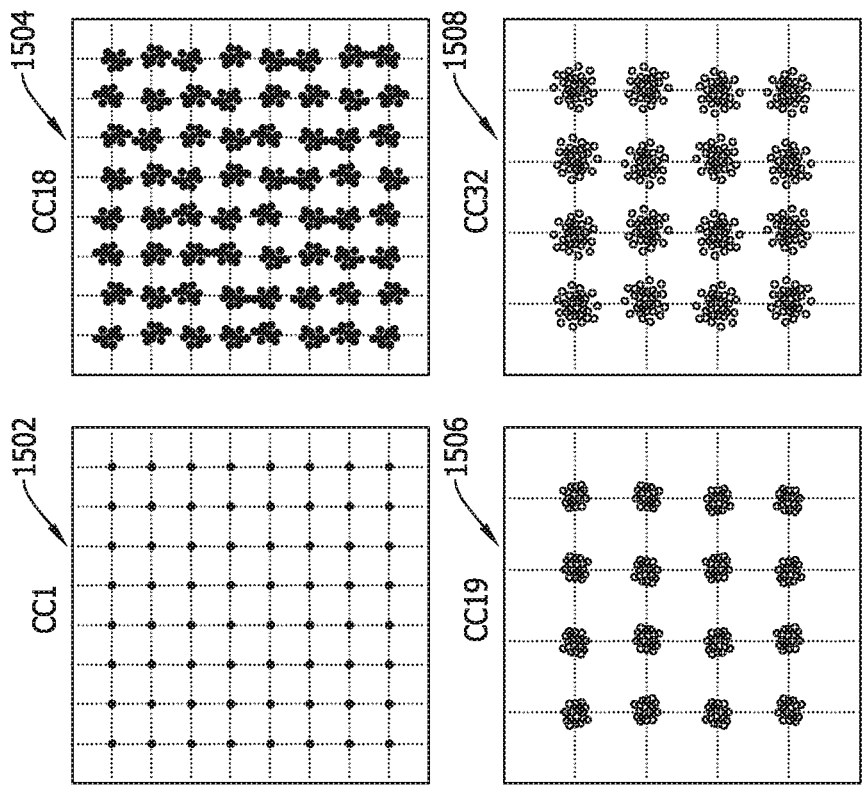
FIG. 15B is a graphical illustration of constellation plots for best case and worst case scenarios for the carriers depicted in FIG. 15A.
Figure 15A:
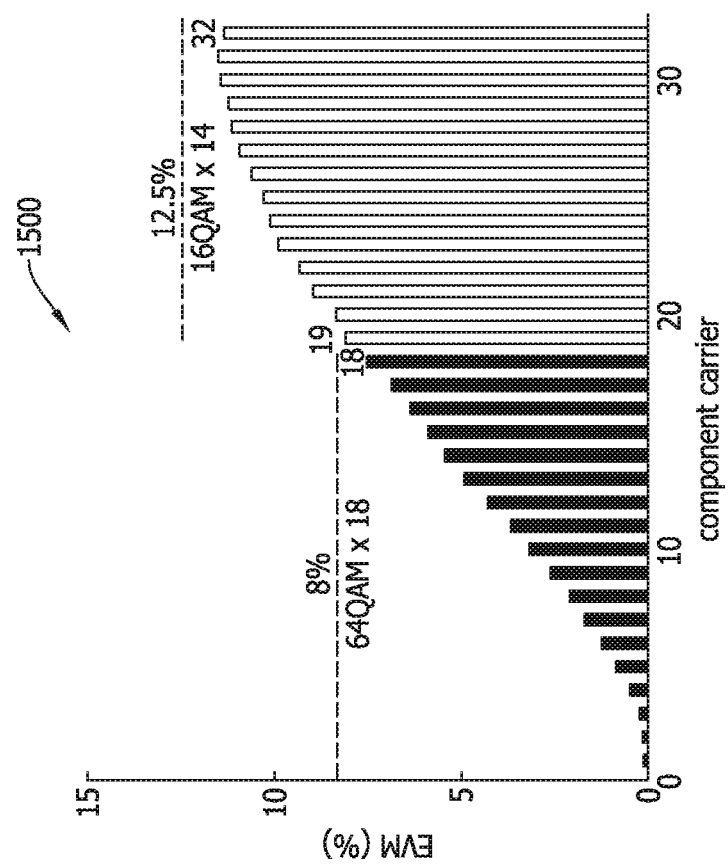
FIG. 15A is a graphical illustration depicting error vector magnitudes for the carriers depicted in FIG. 14B.

FIG. 15A is a graphical illustration 1500 depicting the EVMs for the LTE component carriers depicted in FIG. 14B. In the example depicted in FIG. 15A, the first 18 component carriers (i.e., 64QAM) exhibit an EVM percentage below 8%, and the remaining 14 component carriers (i.e., 16QAM) exhibit an EVM percentage above 8% and below 12.5%.

FIG. 15B is a graphical illustration of constellation plots 1502, 1504, 1506, 1508 for best case and worst case scenarios for the carriers depicted in FIG. 15A. More specifically, constellation plot 1502 demonstrates the best case scenario for the 64QAM component carriers, which occurs at the first component carrier (i.e., CC1) exhibiting the lowest EVM percentage of the group (e.g., illustration 1500, FIG. 15A). Constellation plot 1504 demonstrates the worst case scenario for the 64QAM component carriers, which occurs at the last of the 18 component carriers (i.e., CC18) exhibiting the highest EVM percentage of the group. Similarly, constellation plot 1506 demonstrates the best case scenario for the 16QAM component carriers, which occurs at the first component carrier of the 14-carrier group (i.e., CC19) exhibiting the lowest relative EVM percentage, and constellation plot 1508 demonstrates the worst case scenario for the 16QAM component carriers, which occurs at the last of the 16QAM component carriers (i.e., CC32) exhibiting the highest EVM percentage.

From these constellations, it can be seen how the respective constellation points are much more closely clustered in the respective best case scenarios (i.e., constellation plots 1502, 1506), but appear more to exhibit more distortion in the respective worst case scenarios (i.e., constellation plots 1504, 1508). As can be further seen from the foregoing embodiments, innovative second-order delta-sigma ADCs may be advantageously realized using only one- or two-feedback loops, which provide simple and low-cost implementation incentives. Accordingly, the person of ordinary skill in the art will understand that systems and methods according to the Case I implementation example are particularly suitable for scenarios having relatively low SNR and low data rate requirements.

FIG. 16A is a schematic illustration of a filter 1600. In an embodiment, filter 1600 also represents a Z-block diagram and/or impulse response filter for a delta-sigma ADC according to the systems and methods described herein.

In an exemplary embodiment, filter 1600 constitutes fourth-order delta-sigma ADC for the Case II and Case III implementation scenarios illustrated in Table 4, above. More particularly, in the example depicted in FIG. 16A, filter 1600 operates similarly, in some respects, to filter 1300, FIG. 13A, but as a fourth-order system, in contrast to the second-order system of FIG. 13A. That is, between an input 1602 and an output 1604, filter 1600 includes four feedforward coefficients a, and also four feedback loops 1606 each having a $z^{-1}$ delay cell, corresponding to the order of 4. In the embodiment depicted in FIG. 16A, filter 1600 further includes two feedback coefficients g, a DAC recursion 1608 for implementing the delta-sigma memory effect, and a quantizer 1610.

In some embodiments, the same general filter architecture of filter 1600 may be implemented for both of the Case II and Case III example scenarios, except that, in Case II, quantizer 1610 is a one-bit quantizer that outputs only two levels, similar to quantizer 1310, FIG. 13A (i.e., Case I). In Case III though, quantizer 1310' is a two-bit quantizer that outputs four levels.

FIG. 16B is a graphical illustration depicting an I-Q plot 1612 for an NTF for filter 1600, FIG. 16A. Plot 1612 illustrates the respective zeros and poles of the fourth-order NTF for filter 1600, which, in contrast to plot 1312, FIG. 13B, has two conjugate pairs of zeros, and two conjugate pairs of poles.

FIG. 16C is a graphical illustration depicting a frequency response 1614 of the NTF for filter 1600, FIG. 16A. In an exemplary embodiment, similar to frequency response 1314, FIG. 13C, frequency response 1614 represents a distribution of quantization noise in the frequency domain. Different though, from frequency response 1314, frequency response 1614 includes two null points 1616.

FIG. 17A is a graphical illustration depicting a spectrum plot 1700. In an exemplary embodiment, spectrum plot 1700 illustrates a frequency spectrum including the 32 LTE carriers digitized by a fourth-order one-bit delta-sigma ADC (e.g., FIG. 16A, Case II). In the example depicted in FIG. 17A, the respective spectra of the 32 LTE carriers are contained within a carrier spectrum portion 1702.

FIG. 17B is a graphical illustration depicting a close-up view of carrier spectrum portion 1702, FIG. 17A. Similar to the Case I implementation scenario (e.g., FIG. 14B), within this close-up view, it can be seen that this design configuration will also support 32 LTE carriers. However, due to the increased order of delta-sigma ADC (i.e., from second to fourth), the in-band quantization noise in this Case II scenario is significantly reduced in comparison with Case I, and a higher SNR and modulation may therefore be provisioned. In this Case II example, all 32 LTE carriers may be seen to have sufficient SNR to support a 64QAM modulation format, and half of the carriers (i.e., 16) have sufficient SNR to support a 256QAM modulation format. The RF spectrum and EVMs of all 32 carriers in the Case II scenario are described further below with respect to FIG. 18.

Figure 18B:
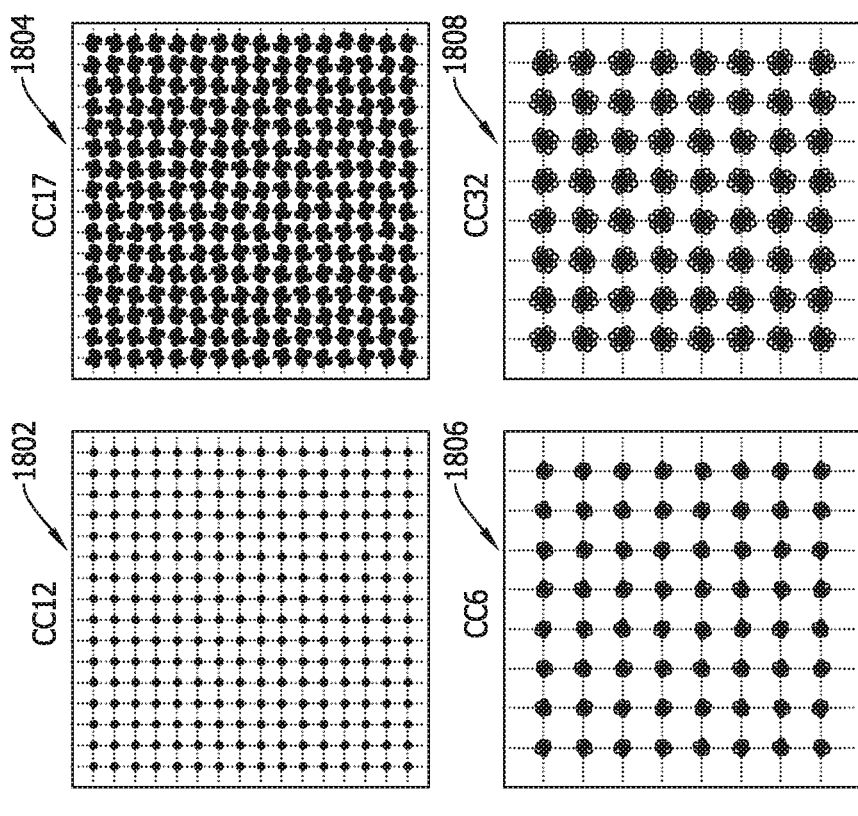
FIG. 18B is a graphical illustration of constellation plots for best case and worst case scenarios for the carriers depicted in FIG. 18A.
Figure 18A:
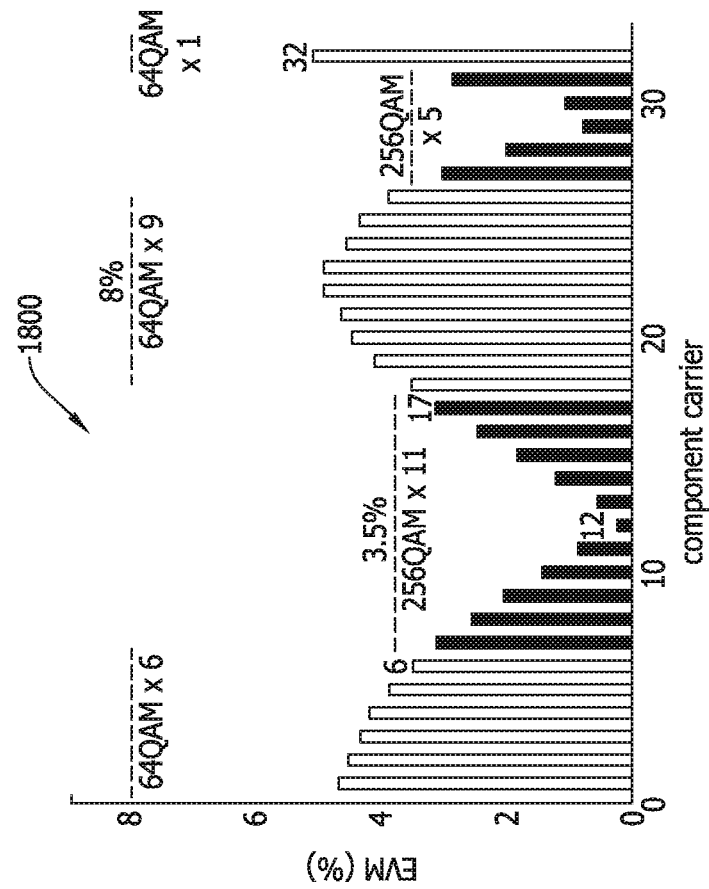
FIG. 18A is a graphical illustration depicting error vector magnitudes for the carriers depicted in FIG. 17B.

FIG. 18A is a graphical illustration 1800 depicting the EVMs for the 32 Case II LTE component carriers depicted in FIG. 17B. That is, illustration 1800 depicts the EVM percentages of 32 carriers digitized by a fourth-order one-bit delta-sigma ADC. In the example depicted in FIG. 18A, 16 of the 32 component carriers (i.e., 256QAM) exhibit an EVM percentage below 3.5%, and the remaining 16 carriers (i.e., 64QAM) exhibit an EVM percentage above 3.5% and below 8%.

FIG. 18B is a graphical illustration of constellation plots 1802, 1804, 1806, 1808 for best case and worst case scenarios for the carriers depicted in FIG. 18A. More specifically, constellation plot 1802 demonstrates the best case scenario for the 256QAM component carriers, which occurs at the twelfth component carrier (i.e., CC12) exhibiting the lowest EVM percentage of the modulation format group. Constellation plot 1804 thus demonstrates the worst case scenario for the 256QAM component carriers, which occurs at the seventeenth component carrier (i.e., CC17), in this example. Similarly, constellation plot 1806 demonstrates the best case scenario for the 64QAM component carriers, which occurs at the sixth component carrier (i.e., CC6), and constellation plot 1808 demonstrates the worst case scenario for the 64QAM component carriers, which occurs at the thirty-second component carrier (i.e., CC32).

Fourth-order delta-sigma ADC techniques are more complex than second-order ADC techniques. However, fourth-order delta-sigma ADC comparatively enables significantly reduced in-band quantization noise and enhanced SNR. The present fourth-order delta-sigma ADC embodiments are of particular use for high SNR and data rate scenarios, and can potentially support more LTE carriers. In this exemplary implementation scenario, 32 LTE carriers are shown to be supported. As described further below with respect to the Case IV and V implementation scenarios, the present fourth-order delta-sigma ADC embodiments may also support up to 37 LTE carriers as well.

Figures 19A, 19B:
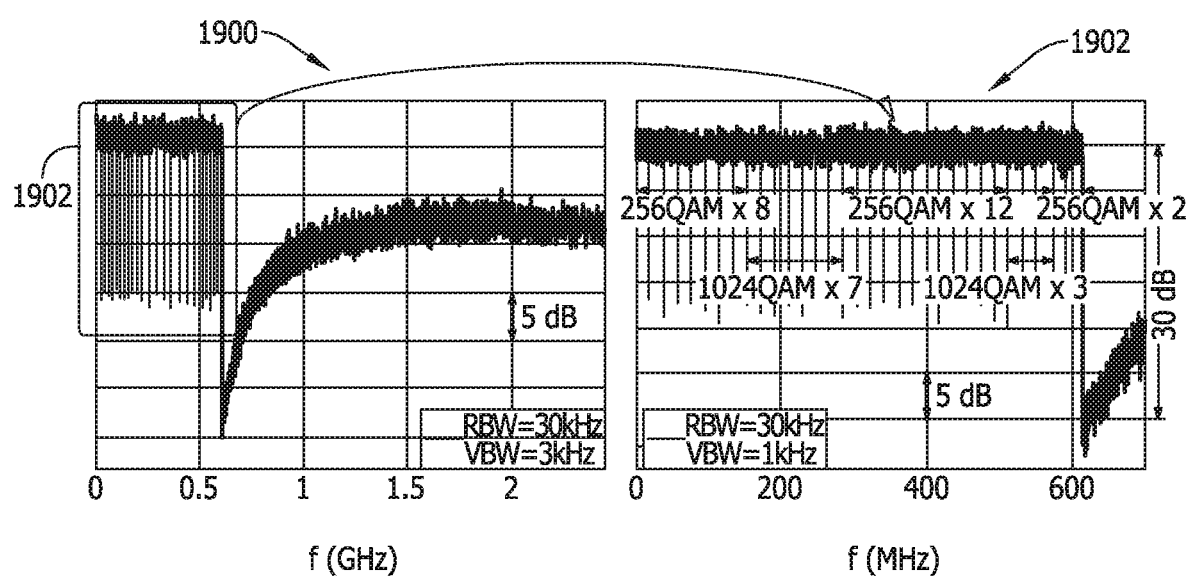
FIG. 19A is a graphical illustration depicting a spectrum plot according to an embodiment of the present disclosure.
FIG. 19B is a graphical illustration depicting a close-up view of the carrier spectrum portion depicted in FIG. 19A.

FIG. 19A is a graphical illustration depicting a spectrum plot 1900. In an exemplary embodiment, spectrum plot 1900 illustrates a frequency spectrum including the 32 LTE carriers digitized by a fourth-order two-bit delta-sigma ADC (e.g., FIG. 16A, Case III). In the example depicted in FIG. 19A, the respective spectra of the 32 LTE carriers are contained within a carrier spectrum portion 1902. As described above, the Case III implementation scenario uses the same fourth-order delta-sigma ADC as in Case II, except for a two-bit quantizer (e.g., quantizer 1310', FIG. 13A) instead of a one-bit quantizer (e.g., quantizer 1310). Accordingly, both of the Case II and Case III scenarios share the same zeroes and poles (e.g., FIG. 16B), as well as the same NTF frequency distribution (e.g., FIG. 16C). In Case III though, the two-bit quantizer is configured to output a PAM4 signal. The presence of this additional quantization bit enables the present embodiments, according to this example, to realize further reductions in the quantization noise, while also achieving higher SNR provisioning.

FIG. 19B is a graphical illustration depicting a close-up view of carrier spectrum portion 1902, FIG. 19A. Similar to the Case II implementation scenario (e.g., FIG. 17B), within this close-up view, it can be seen that the design configuration for this Case III scenario will also support 32 LTE carriers. In the Case III scenario though, due to the additional quantization bit, the total MFH capacity is increased to 20 Gb/s. Additionally, in this implementation scenario, the fronthaul capacity consumed by each LTE carrier is also doubled in comparison with the respective capacities of the Case I and Case II implementation scenarios. This Case III implementation scenario is therefore particularly useful and instances where it is desirable to trade spectral efficiency for SNR. Nevertheless, as can be seen in Table 4, the spectral efficiency under the Case III implementation scenario is still 1.97 times greater than CPRI. The RF spectrum and EVMs of the 32 Case III carriers are described further below with respect to FIG. 20.

Figure 20B:
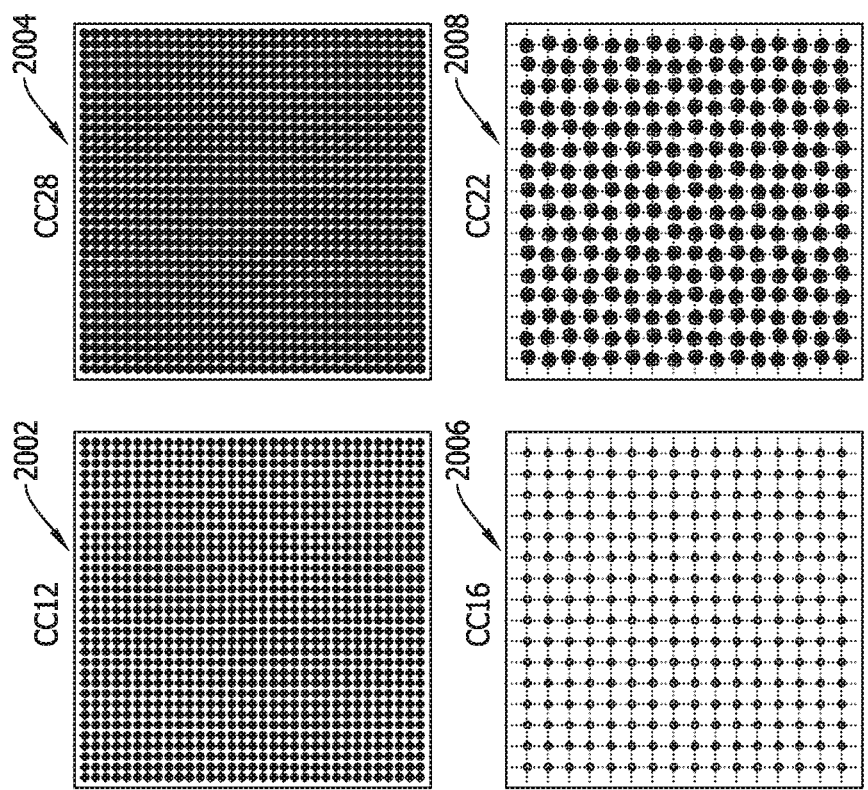
FIG. 20B is a graphical illustration of constellation plots for best case and worst case scenarios for the carriers depicted in FIG. 20A.
Figure 20A:
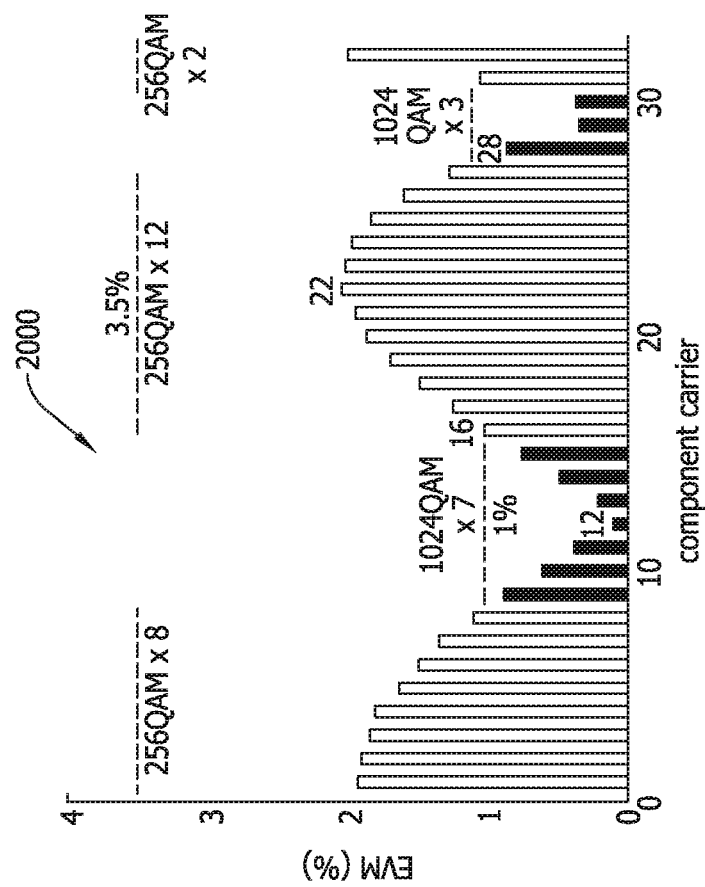
FIG. 20A is a graphical illustration depicting error vector magnitudes for the carriers depicted in FIG. 19B.

FIG. 20A is a graphical illustration 2000 depicting the EVMs for the 32 Case III LTE component carriers depicted in FIG. 19B. That is, illustration 2000 depicts the EVM percentages of 32 carriers digitized by a fourth-order two-bit delta-sigma ADC. In the example depicted in FIG. 20A, all 32 component carriers have sufficient SNR to support 256QAM, i.e., all 32 carriers exhibit an EVM percentage below 3.5%. Furthermore, because 10 of the component carriers exhibit an EVM percentage below 1%, these 10 carriers will support 1024QAM.

FIG. 20B is a graphical illustration of constellation plots 2002, 2004, 2006, 2008 for best case and worst case scenarios for the carriers depicted in FIG. 20A. More specifically, constellation plot 2002 demonstrates the best case scenario for the 1024QAM component carriers, which occurs at the twelfth component carrier (i.e., CC12). Constellation plot 2004 thus demonstrates the worst case scenario for the 1024QAM component carriers, which occurs at the twenty-eighth component carrier (i.e., CC28), in this example. Similarly, constellation plot 2006 demonstrates the best case scenario for the 256QAM component carriers, which occurs at the sixteenth component carrier (i.e., CC16), and constellation plot 2008 demonstrates the worst case scenario for the 256QAM component carriers, which occurs at the twenty-second component carrier (i.e., CC22).

Figures 21A, 21B:
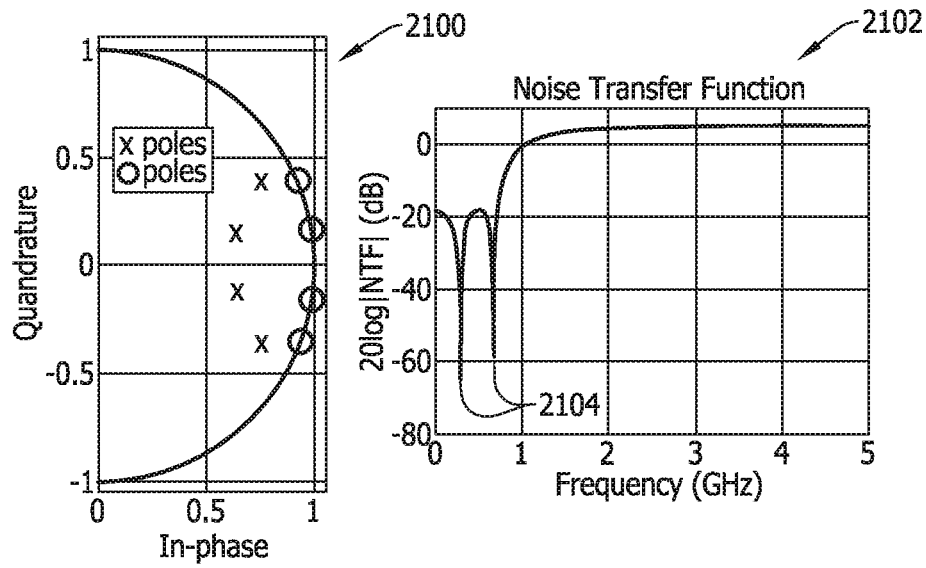
FIG. 21A is a graphical illustration depicting an I-Q plot for a noise transfer function according to an embodiment of the present disclosure.
FIG. 21B is a graphical illustration depicting a frequency response of the noise transfer function for the I-Q plot depicted in FIG. 21A.

FIG. 21A is a graphical illustration depicting an I-Q plot 2100 for an NTF. In an exemplary embodiment, plot 2100 illustrates the respective zeros and poles of a fourth-order NTF, for the Case IV implementation scenario, of a filter, such as filter 1600, FIG. 16A. Indeed, for ease of illustration, the Case IV and Case V scenarios may utilize the same respective fourth-order delta-sigma ADC and Z-domain block diagram implemented with respect to the Case II and Case III scenarios (e.g., filter 1600, FIG. 16A). However, in the Case IV and Case V implementation scenarios, the coefficients on the feedback (i.e., g1, g2) and feedforward (i.e., a1, a2, a3, a4) paths may be differently tuned to accommodate additional LTE carriers. In some embodiments, the respective two conjugate pairs of zeros in the Case IV scenario may be more separated from each other than in the Case II scenario (e.g., FIG. 16B).

FIG. 21B is a graphical illustration depicting a frequency response 2102 of the NTF for I-Q plot 2100, FIG. 21A. In an exemplary embodiment, frequency response 2102 is similar to frequency response 1614, FIG. 16C, and includes two null points 2104. In some embodiments, where the respective conjugate pairs of zeros exhibit more separation from each other, null points 2104 may similarly exhibit greater separation from one another in relation to the Case II scenario (e.g., FIG. 16C). The Case IV implementation scenario it is therefore particularly advantageous where it is desirable to accommodate as many LTE carriers as possible with maximized spectral efficiency.

In comparison with the Case II implementation scenario, the Case IV implementation scenario supports 37 LTE carriers with slight SNR penalty. Additionally, the MFH capacity consumed per carrier in this Case IV scenario is reduced to 270.27 Mb/s, and the spectral efficiency is improved by 4.55 times in comparison with CPRI.

Figures 22A, 22B:
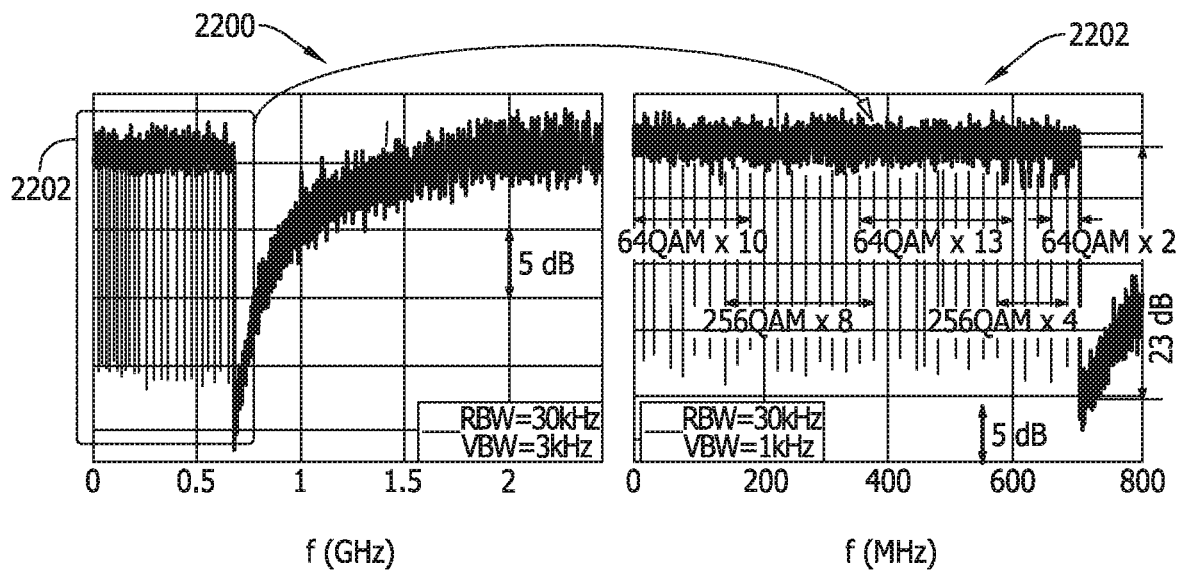
FIG. 22A is a graphical illustration depicting a spectrum plot according to an embodiment of the present disclosure.
FIG. 22B is a graphical illustration depicting a close-up view of the carrier spectrum portion depicted in FIG. 22A.

FIG. 22A is a graphical illustration depicting a spectrum plot 2200. In an exemplary embodiment, spectrum plot 2200 illustrates a frequency spectrum including 37 LTE carriers digitized by a fourth-order one-bit delta-sigma ADC (e.g., FIG. 16A, Case III). In the example depicted in FIG. 22A, the respective spectra of the 37 LTE carriers are contained within a carrier spectrum portion 2202. In this Case IV implementation scenario, the same one-bit quantizer (e.g., quantizer 1310, FIG. 13A) may be used in the fourth order delta-sigma ADC as was used in the Case II scenario.

FIG. 22B is a graphical illustration depicting a close-up view of carrier spectrum portion 2202, FIG. 22A. Different from the Case II implementation scenario (e.g., FIG. 17B), within this close-up view, it can be seen that the design configuration for this Case IV scenario will support 37 LTE carriers. The RF spectrum and EVMs of the 37 Case IV carriers are described further below with respect to FIG. 23.

Figures 23A, 23B:
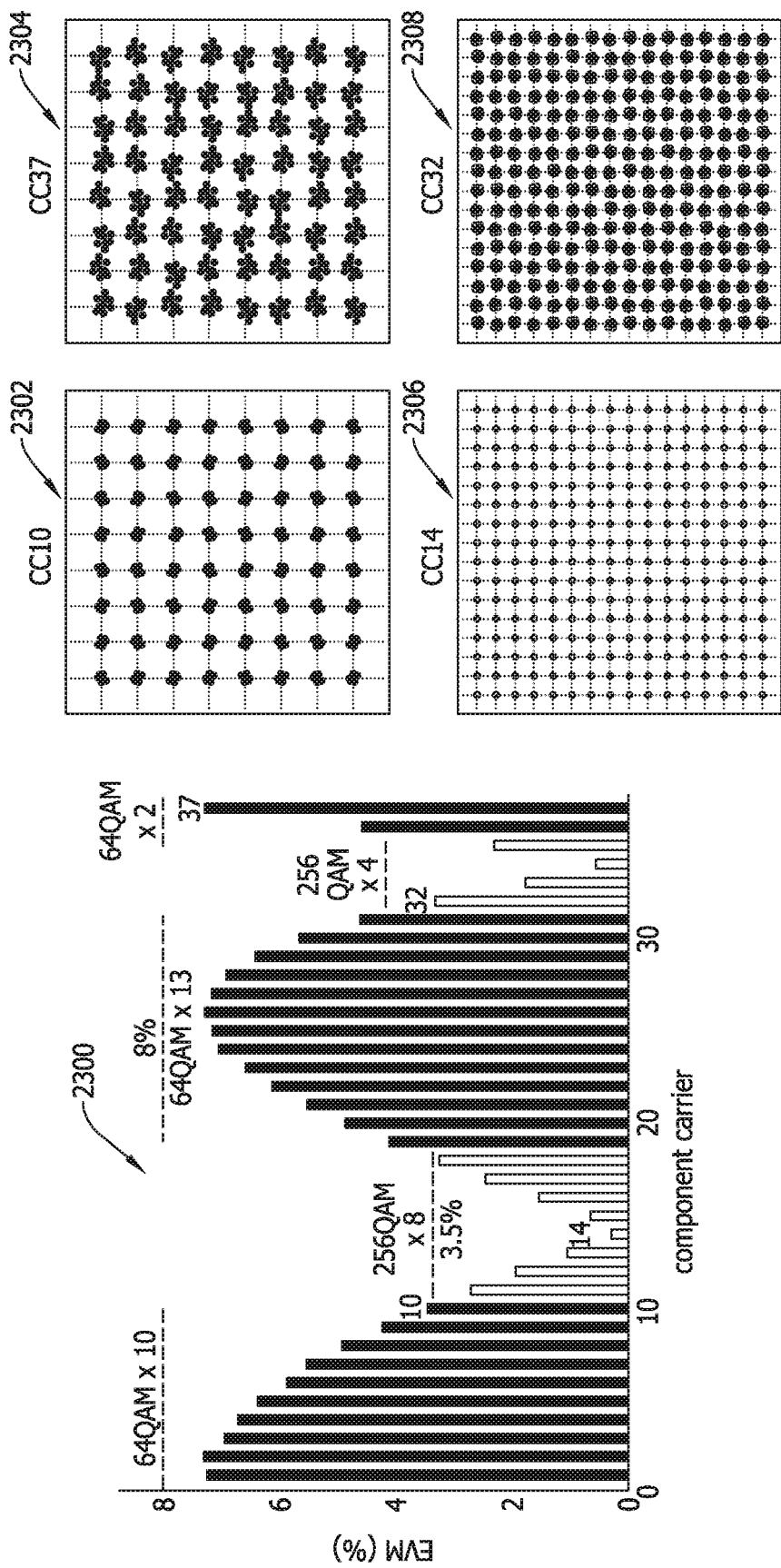
FIG. 23A is a graphical illustration depicting error vector magnitudes for the carriers depicted in FIG. 22B.
FIG. 23B is a graphical illustration of constellation plots for best case and worst case scenarios for the carriers depicted in FIG. 23A.

FIG. 23A is a graphical illustration 2300 depicting the EVMs for the 37 Case IV LTE component carriers depicted in FIG. 22B. That is, illustration 2300 depicts the EVM percentages of 37 carriers digitized by a fourth-order one-bit delta-sigma ADC. In the example depicted in FIG. 23A, all 37 component carriers have sufficient SNR to support a 64QAM modulation format, i.e., all 37 carriers exhibit an EVM percentage below 8%. Additionally, 12 of the Case IV component carriers exhibit an EVM percentage below 3.5%, and may therefore support a 256QAM modulation format.

FIG. 23B is a graphical illustration of constellation plots 2302, 2304, 2306, 2308 for best case and worst case scenarios for the carriers depicted in FIG. 23A. More specifically, constellation plot 2302 demonstrates the best case scenario for the 64QAM component carriers, which occurs at the tenth component carrier (i.e., CC10). Constellation plot 2304 demonstrates the worst case scenario for the 64QAM component carriers, which occurs at the thirty-seventh component carrier (i.e., CC37), in this example. Similarly, constellation plot 2306 demonstrates the best case scenario for the 256QAM component carriers, which occurs at the fourteenth component carrier (i.e., CC14), and constellation plot 2308 demonstrates the worst case scenario for the 256QAM component carriers, which occurs at the thirty-second component carrier (i.e., CC32).

Figures 24A, 24B:
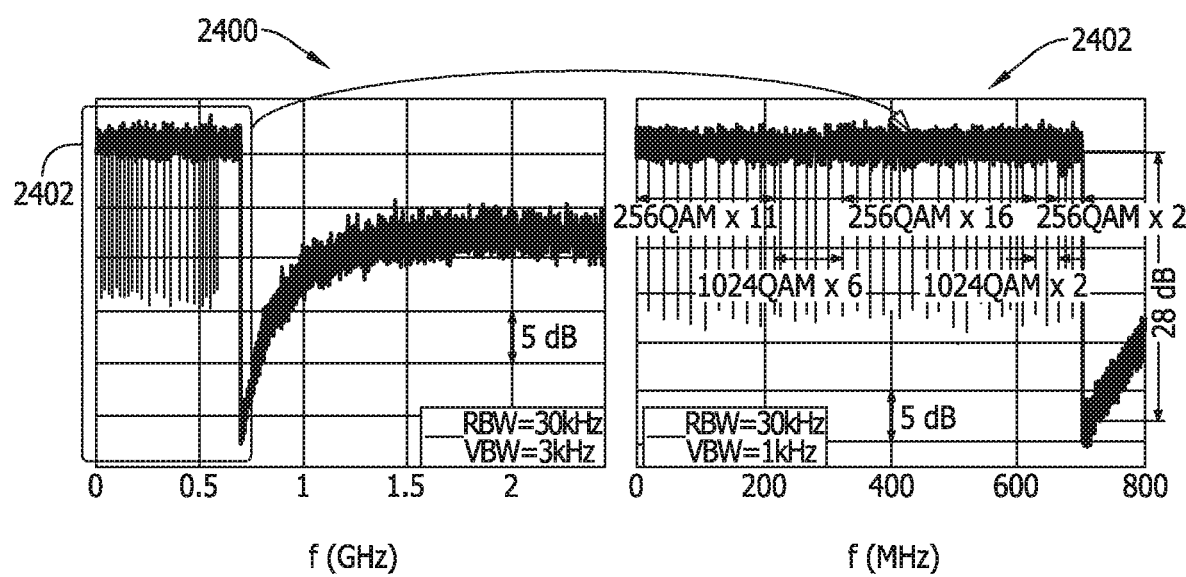
FIG. 24A is a graphical illustration depicting a spectrum plot according to an embodiment of the present disclosure.
FIG. 24B is a graphical illustration depicting a close-up view of the carrier spectrum portion depicted in FIG. 24A.

FIG. 24A is a graphical illustration depicting a spectrum plot 2400. In an exemplary embodiment, spectrum plot 2400 illustrates a frequency spectrum including 37 LTE carriers digitized by a fourth-order two-bit delta-sigma ADC (e.g., FIG. 16A, Case III). In the example depicted in FIG. 24A, the respective spectra of the 37 LTE carriers are contained within a carrier spectrum portion 2402. In this Case V implementation scenario, the same two-bit quantizer (e.g., quantizer 1310', FIG. 13A) may be used in the fourth order delta-sigma ADC as was used in the Case III scenario. In other words, the Case V implementation scenario is similar to the Case IV implementation scenario, except that in Case V, the one-bit Case IV quantizer is replaced with a two-bit quantizer. The zeros, poles, and frequency response of the corresponding NTF though, remain the same as with the Case IV scenario.

Due to the increase from one quantization bit to two quantization bits, the quantization noise in the Case V scenario is reduced in comparison with the Case IV scenario. Furthermore, in the Case V scenario, all 37 LTE carriers have sufficient SNR to support a 256QAM modulation format, and 8 of the 37 carriers exhibit an EVM less than 1%, and may therefore support up to a 1024QAM modulation format.

FIG. 24B is a graphical illustration depicting a close-up view of carrier spectrum portion 2402, FIG. 24A. Different from the Case III implementation scenario (e.g., FIG. 19B), within this close-up view, it can be seen that the design configuration for this Case V scenario will support 37 LTE carriers. The RF spectrum and EVMs of the 37 Case V carriers are described further below with respect to FIG. 25.

Figures 25A, 25B:
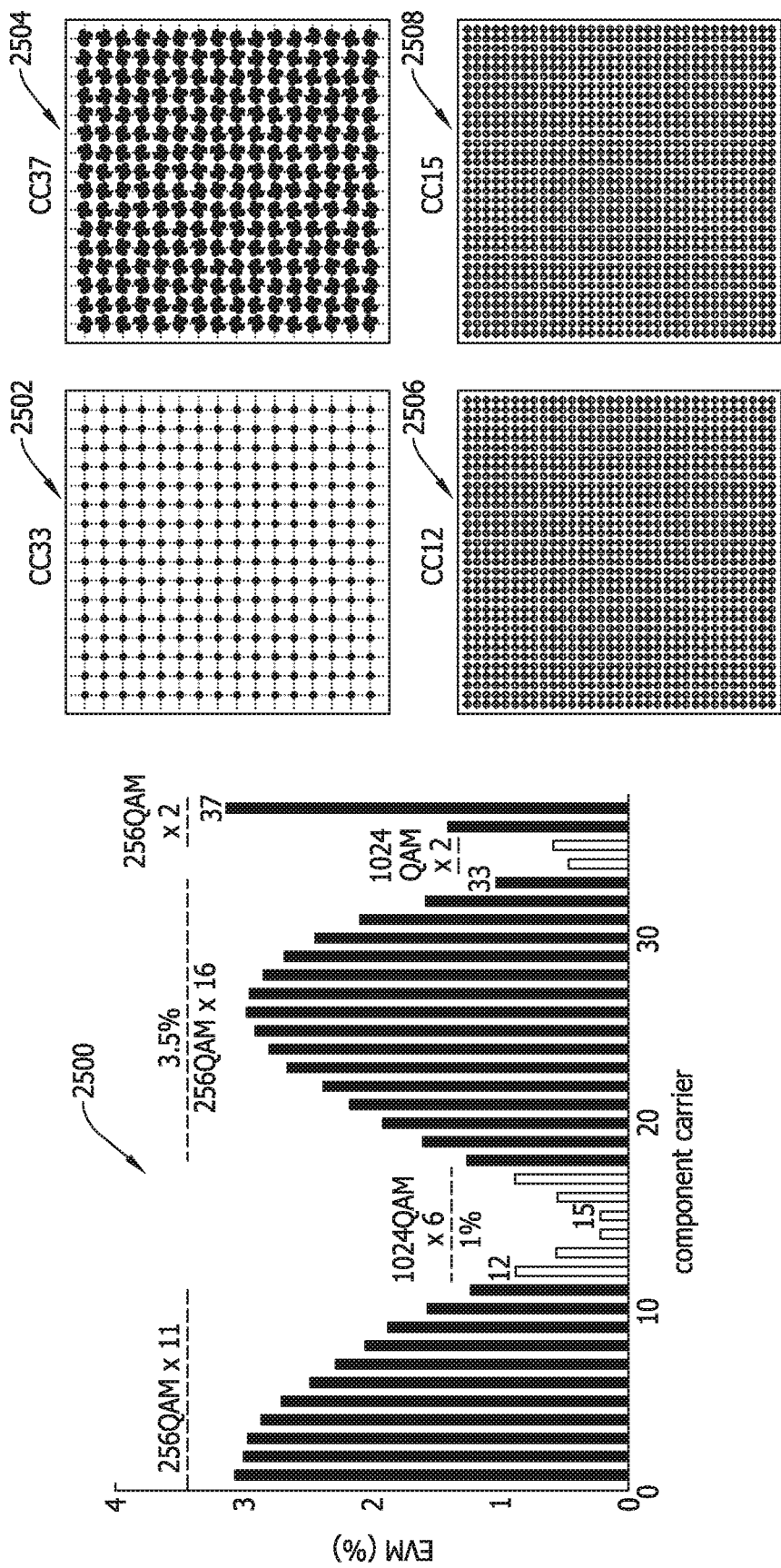
FIG. 25A is a graphical illustration depicting error vector magnitudes for the carriers depicted in FIG. 24B.
FIG. 25B is a graphical illustration of constellation plots for best case and worst case scenarios for the carriers depicted in FIG. 25A.

FIG. 25A is a graphical illustration depicting the EVMs for the 37 Case V LTE component carriers depicted in FIG. 24B. That is, illustration 2500 depicts the EVM percentages of 37 carriers digitized by a fourth-order two-bit delta-sigma ADC. In the example depicted in FIG. 25A, all 37 component carriers have sufficient SNR to support a 256QAM modulation format, i.e., all 37 carriers exhibit an EVM percentage below 3.5%. Additionally, eight of the Case V component carriers exhibit an EVM percentage below 1%, and may therefore support a 1024QAM modulation format.

FIG. 25B is a graphical illustration of constellation plots 2502, 2504, 2506, 2508 for best case and worst case scenarios for the carriers depicted in FIG. 25A. More specifically, constellation plot 2502 demonstrates the best case scenario for the 256QAM component carriers, which occurs at the thirty-third component carrier (i.e., CC33). Constellation plot 2504 demonstrates the worst case scenario for the 256QAM component carriers, which occurs at the thirty-seventh component carrier (i.e., CC37), in this example. Similarly, constellation plot 2506 demonstrates the best case scenario for the 1024QAM component carriers, which occurs at the twelfth component carrier (i.e., CC12), and constellation plot 2508 demonstrates the worst case scenario for the 1024QAM component carriers, which occurs at the fifteenth component carrier (i.e., CC15).

According to the systems and methods described herein, an innovative flexible digitization interface is provided that is based on delta-sigma ADC, and which enables on-demand SNR and LTE data rate provisioning in next generation MFH networks. The present embodiments advantageously eliminate the need for conventional DAC at the RRH by providing a simplified architecture that allows replacement with a DAC by a BPF, which significantly reduces the cost and complexity of small cell deployment.

According to the techniques described herein, a simplified, DAC-free, all-analog implementation of RRHs it may also be effectively provided. These all-analog RRH implementations offer additional flexibility to the digitization interface in terms of sampling rate, quantization bits, and quantization noise distribution. Through exploitation of the noise shaping techniques described herein, the present systems and methods are further capable of manipulating the frequency distribution of quantization noise as needed or desired. By allowing for a more flexible choice of sampling rate, quantization bits, and noise distribution, the present systems and methods significantly improve over conventional systems by enabling an efficient capability for on-demand SNR and data rate provisioning. In comparison with conventional CPRI, the present digitization interface embodiments are capable of improving the spectral efficiency by at least 1.97-4.55 times.

Real-Time Implementation

Proof of the concepts of the present systems and methods is demonstrated with respect to several real-time implementations. In one exemplary implementation, delta-sigma ADC as demonstrated using a real-time field-programmable gate array (FPGA). The FPGA-based system provides a 5-GSa/s delta-sigma ADC capable of digitizing signals up to 252 MHz 5G (LTE, in this example, backspace), using a 1024QAM modulation format and having an EVM less than 1.25%. Additionally, the following embodiments further provide an innovative digitization approach that enables greater functional split options for next generation fronthaul interfaces (NGFIs).

As described above, an improved delta-sigma ADC is provided that delivers bandwidth efficiency four times better than conventional CPRI techniques. For ease of explanation, some of the exemplary embodiments above are described with respect to a low-pass ADC that may be emulated by offline processing (e.g., a waveform generator). As described further above, in such cases, RF up-conversion would still be necessary at each RRU.

In further exemplary embodiments, an NGFI according to the present systems and methods is configured to implement a real-time FPGA-based bandpass delta-sigma ADC. This real-time bandpass delta-sigma ADC both further improves the bandwidth efficiency, and also enables digitization of mobile signals "AS IS" at respective radio frequencies without requiring frequency conversion. This additional functionality further simplifies the RRU design in a significant manner by eliminating the conventional need for a local oscillator and RF mixer. These architectural improvements may be implemented singly, or in combination with one or more of the innovative configurations described above.

The present systems and methods further enable an innovative functional split option for NGFIs. In an exemplary embodiment, a significant portion of RF functionality is consolidated in a distributed unit (DU), which enables a significantly simplified, and thus lower-cost, configuration at the RRU for small cell deployment. In an exemplary implementation, a high-performance FPGA (e.g., XILINX VC707) is employed as a bandpass delta-sigma ADC, using a 5 GSa/s sampling rate and having a widest reported signal bandwidth of 252 MHz. In such exemplary configurations, real-time digitization may be provided for both 5G-new radio (5GNR) and LTE signals, and for modulation formats up to 1024QAM having an EVM less than 1.25%.

Figure 26:
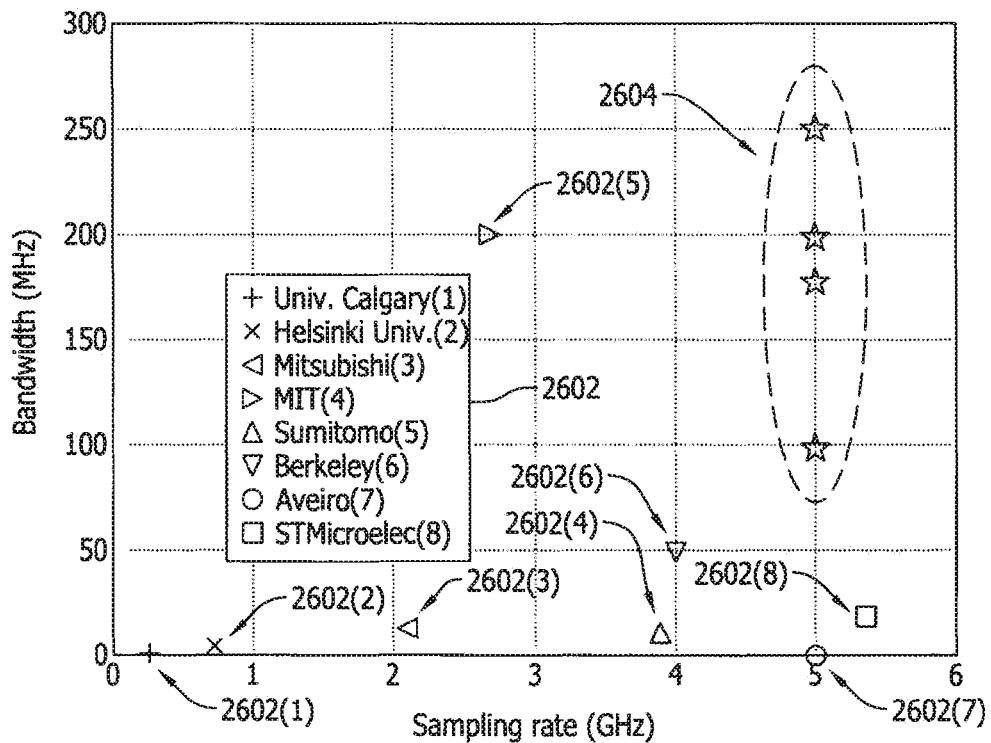
FIG. 26 is a graphical illustration of a comparative summary plot of delta-sigma radio frequency sampling rates taken against conversion bandwidths.

FIG. 26 is a graphical illustration of a comparative summary plot 2600 of delta-sigma RF sampling rates taken against conversion bandwidths. More specifically, comparative summary plot 2600 graphically illustrates known, reported results 2602 of a plurality of delta-sigma ADC studies that have been performed by numerous universities, corporations, and research centers. It can be seen, from reported results 2602 that all of these recent studies, with one exception (i.e., reported result 2602(4), MIT) are all confined to bandwidths of between zero and 50 MHz, irrespective of the noted sampling rate.

Reported result 2602(4) is the lone exception to this trend, indicating a 200 MHz bandwidth increase at a sampling rate between 2 and 3 GHz. However, reported result 2602(4) does not rise above a 3 GHz sampling rate. In contrast, according to the present systems and methods, a set of present results 2604, namely, that of the real-time implementations described herein, are illustrated to all locate at an approximately 5 GHz sampling rate, and all for bandwidths ranging between 100 MHz at the low end, to 250 MHz at the high-end. Accordingly, the present systems and methods are configured to operate at considerably higher sampling rates (e.g., 5 GSa/s) and bandwidths (e.g., up to 100-250 MHz and greater) than all of the known, reported delta-sigma ADC implementations. FIG. 26 is just one example of the superior qualities provided according to the present techniques.

Figure 27:
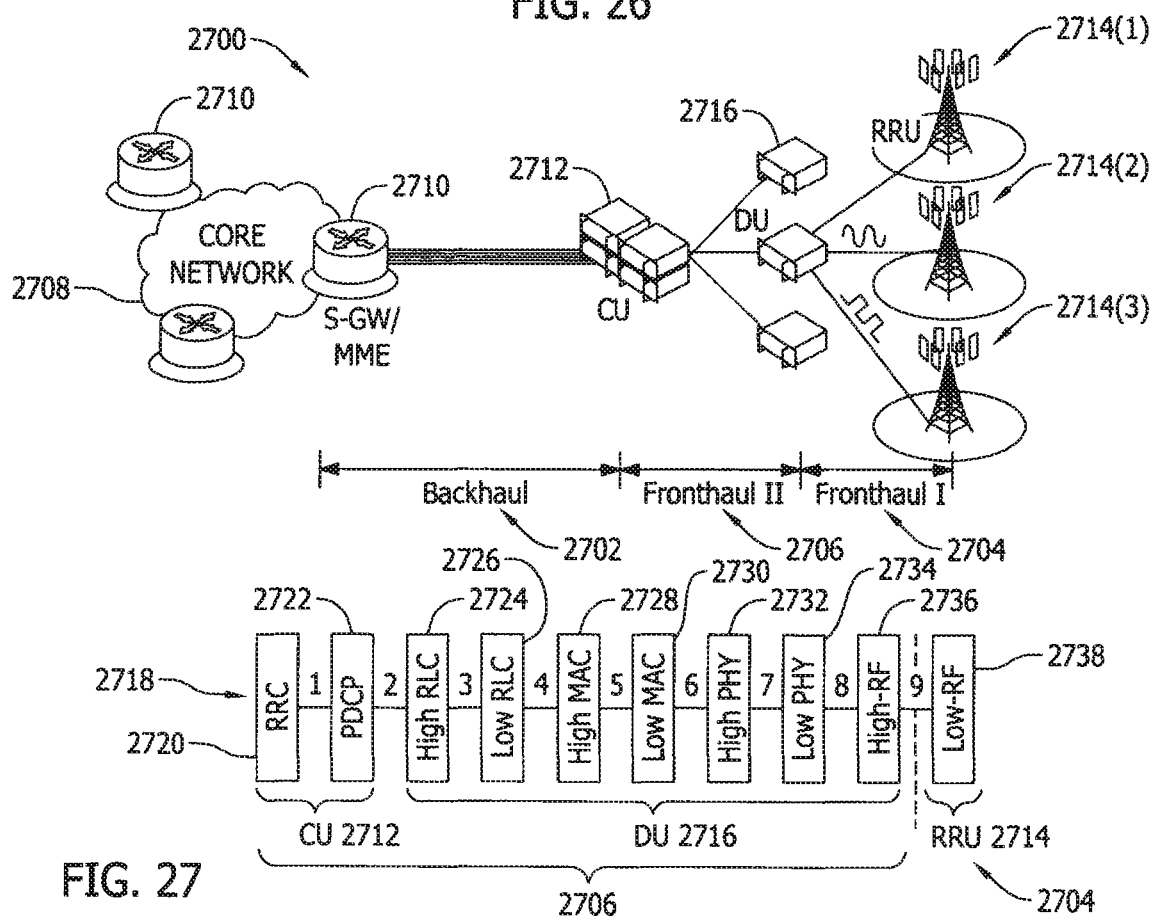
FIG. 27 is a schematic illustration of an access network architecture according to an embodiment of the present disclosure.

FIG. 27 is a schematic illustration of a network architecture 2700. In an exemplary embodiment, architecture 2700 is similar in some respects to architecture 100, FIG. 1, and may represent a C-RAN architecture including an MBH network portion 2702, a first MFH network portion 2704, and a second MFH network portion 2706. In the exemplary embodiment, architecture 2700 further includes a core network 2708 and a plurality of S-GW/MMEs 2710 in communication with a central unit (CU) 2712 in operable communication with MBH network portion 2702. That is, MBH network portion 2702 constitutes the network segment from S-GW/MMEs 2710 and core network 2708 to CU 2712.

Architecture 2700 further includes one or more RRHs 2714 (also referred to as remote radio units, or RRUs), accessible by mobile and/or wireless users (not separately shown in FIG. 27). A plurality of DUs 2716 are in operable communication with CU 2712, and serve to facilitate communication between CU 2712 and one or more RRHs 2714. In some embodiments, each DU 2716 may include one or more BBUs or a BBU pool (not separately shown). In at least one embodiment, CU 2712 may include additional BBUs or BBU pools. Accordingly, first MFH network portion 2704 constitutes the network segment from DUs 2716 to RRHs 2714, and second MFH network portion 2704 constitutes the combination of CU 2712 and DUs 2716. In the embodiment depicted in FIG. 27

In exemplary operation of architecture 2700, general functionality may be similar to that of architecture 100, FIG. 1. Different from architecture 100 though, in architecture 2700, NGFI functions are split and/or shared between CU 2712, DU 2716, and RRHs 2714. An NGFI functional layer diagram 2718 illustrates exemplary NGFI functional split options between several functional layers of CU 2712, DU 2716, and RRH 2714, which options are schematically represented in diagram 2718 as numbered connections between the various layers. For example, CU 2716 includes a radio resource control (RRC) layer 2720 and a packet data convergence protocol (PDCP) layer 2722, with a split option 1 indicated therebetween. Additionally, in this example, DU 2716 includes one or more of a high radio link control (RLC) layer 2724, a low RLC layer 2726, a high media access control (MAC) layer 2728, a low MAC control layer 2730, a high physical (PHY) layer 2732, a low PHY layer 2734, and a high RF layer 2736. RRH 2714 includes a low RF layer 2738 in operable communication with high RF layer 2736 of DU 2716, through split option 9.

During the evolution to 5G, NGFI was proposed to split baseband functions into a central unit and a distributed unit, thereby dividing a C-RAN architecture (e.g., architecture 2700) into three segments: (1) an MBH segment (e.g., MBH network portion 2702) from service gateways (e.g., S-GW 2710) to the BBU; (2) one fronthaul segment (e.g., second MFH network portion 2706) from the CU (e.g., CU 2712) to the DU (e.g., DU 2716); and (3) another fronthaul segment (e.g., first MFH network portion 2704) from the DU to the RRU (e.g., RRH 2714). Some of the split options depicted in diagram 2718 became achievable according to this original NGFI proposal. However, using the architectural and functional improvements of the embodiments herein, the present bandpass delta-sigma ADC techniques newly enable split option 9 (i.e., between high-RF layer 2736 and low-RF layers 2738) as being achievable due to the consolidation of a significant portion of the RF functions in the DU. This consolidation at the DU advantageously lowers both the cost and complexity of the RRU architecture and functionality which thereby facilitates a substantially denser deployment of small cells.

Figure 28:
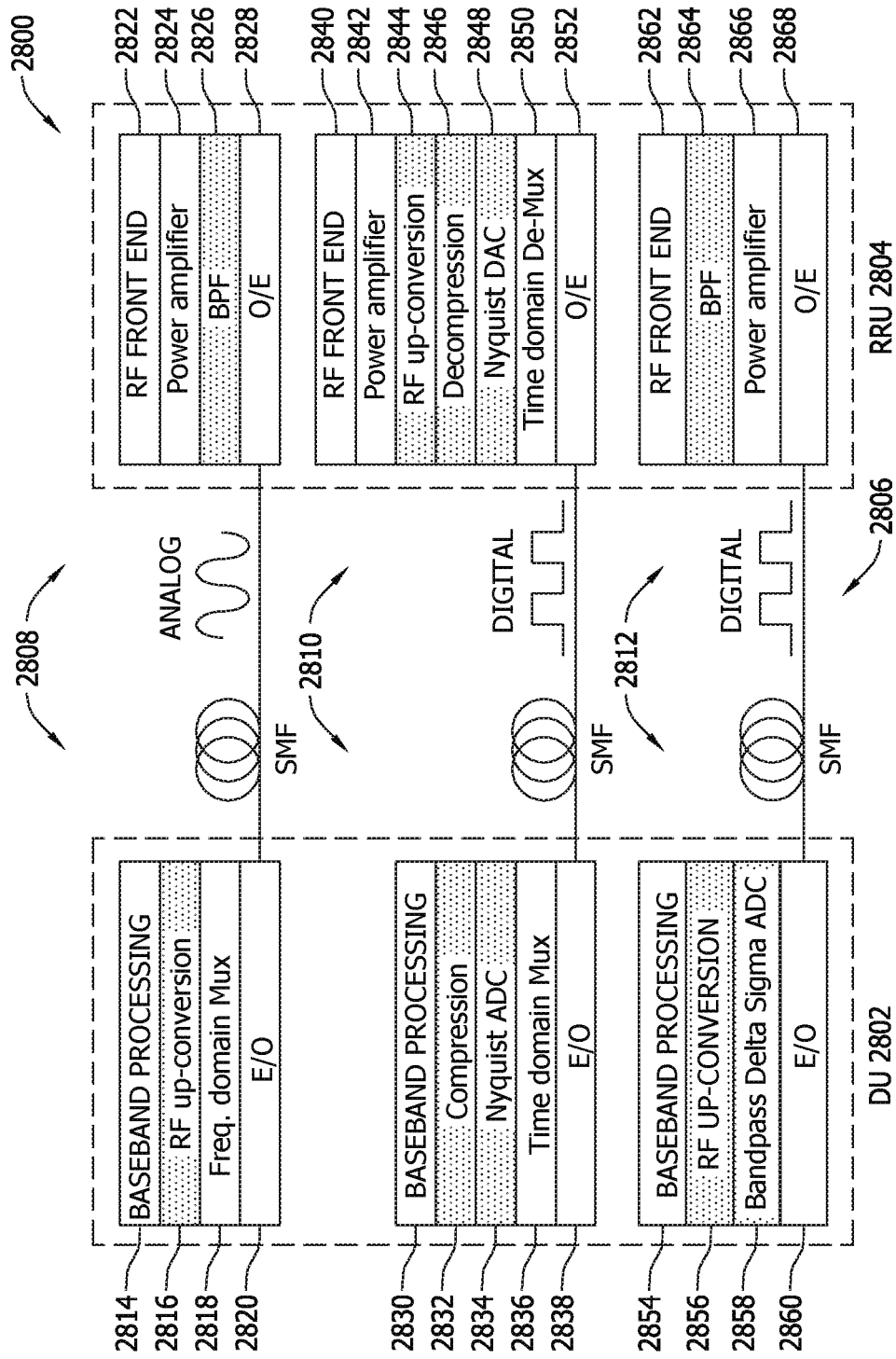
FIG. 28 is a schematic illustration of a radio-over-fiber link according to an embodiment of the present disclosure.

FIG. 28 is a schematic illustration of an RoF link 2800. RoF link 2800 includes at least one DU 2802 in operable communication with at least one RRU 2804 over a transport medium 2806 (e.g., a single mode fiber, or SMF). In an exemplary embodiment, DU 2802 includes one or more fronthaul technologies of an analog link portion 2808, a first digital link portion 2810, and a second digital link portion 2812. Analog link portion 2808, for example, serves to provide RoF-based analog MFH functionality, similar to MFH network 200, FIG. 2A. Similarly, first digital link portion 2810 serves to provide CPRI-based digital MFH functionality, similar to MFH network 300, FIG. 3A, and second digital link portion 2812 serves to provide bandpass delta-sigma ADC-based digital MFH functionality, similar to MFH network 400, FIG. 4A.

More specifically, analog link portion 2808 includes, at DU 2802, a baseband processing layer 2814, an RF up-conversion layer 2816, an FDM 2818, and an E/O interface 2820, and at RRU 2804, a complementary RF front end 2822, a first power amplifier 2824, a first BPF 2826, and an O/E interface 2828. Similarly, first digital link portion 2810 includes, at DU 2802, a baseband processing layer 2830, a compression unit 2832, a Nyquist ADC 2834, a first TDM 2836, and an E/O interface 2838, and at RRU 2804, a complementary RF front end 2840, a second power amplifier 2842, an RF up-converter 2844, a decompression unit 2846, a Nyquist DAC 2848, a second TDM 2850, and an O/E interface 2852. Additionally, second digital link portion 2812 includes, at DU 2802, a baseband processor 2854, an RF up-converter 2856, a delta-sigma ADC 2858 (e.g., a bandpass delta-sigma ADC), and an E/O interface 2860, and at RRU 2804, a complementary RF front end 2862, a second BPF 2864, a third power amplifier 2866, and an O/E interface 2868.

According to the exemplary configuration of link 2800, a simplified, inexpensive system is obtained, which provides high spectral efficiency. Limitations due to nonlinear impairments are also advantageously addressed by the innovative configuration therein. For example, the CPRI-based digital MFH system of first digital link portion 2810 implements Nyquist ADC at DU 2802, and DAC at RRU 2804, to digitize/retrieve the analog waveforms of baseband signals. Nevertheless, RF up-conversion performance is still necessary at RRU 2804. Because CPRI-based solutions only work at fixed chip rates (e.g., 3.84 MHz), synchronization presents a significant challenge for different radio access technologies such as LTE, 5G, Wi-Fi, etc. However, by implementing the innovative functional split provided by split option 9 (e.g., FIG. 27) at second digital link portion 2812 of the same DU (e.g., DU 2802), the limitations of the CPRI-based digital MFH system may be avoided, or at least significantly mitigated.

More particularly, at DU 2802, mobile signals may be up-converted to radio frequencies and digitized "AS IS" by bandpass delta-sigma ADC 2858. Additionally, at RRU 2804, a conventional DAC is replaced by the lower-cost second BPF 2864 to retrieve the analog waveform. As described above, the retrieved analog waveform is then ready for wireless transmission without the need for RF up-conversion. The operational principles of bandpass delta-sigma ADC 2858 and second BPF 2864 are described above in greater detail with respect to FIGS. 6 and 7, and the operational principles of Nyquist ADC 2834 are described in greater detail with respect to FIG. 5. That is, in summary, delta-sigma ADC techniques are different from Nyquist ADC in that delta-sigma ADC trades quantization bit(s) for the sampling rate.

For example, as described above, delta-sigma ADC enables use of a high sampling rate with only one quantization bit (or two bits). The input signal is first oversampled, followed by exploitation of a noise shaping technique to push the quantization noise out of the signal band, so that the signal and noise are separated in the frequency domain.

Using these innovative techniques at delta-sigma ADC 2858, the analog waveform may be easily retrieved at RRU 2804 by second BPF 2864, which filters out the OOB noise.

In the exemplary embodiment, in analog link portion 2808, first power amplifier 2824 is deployed after first BPF 2826 to amplify the analog signals, whereas in second digital link portion 2812, third power amplifier 2866 is deployed before second BPF 2864 to boost the OOK signal (or a PAM4 signal, in the case where two quantization bits are used). Link 2800 is thus able to advantageously avoid the amplifier nonlinearity limitations described above, and further provide for use of a significantly lower-cost, higher-efficiency, switch-mode power amplifier than would be realized according to conventional techniques.

Figure 29:
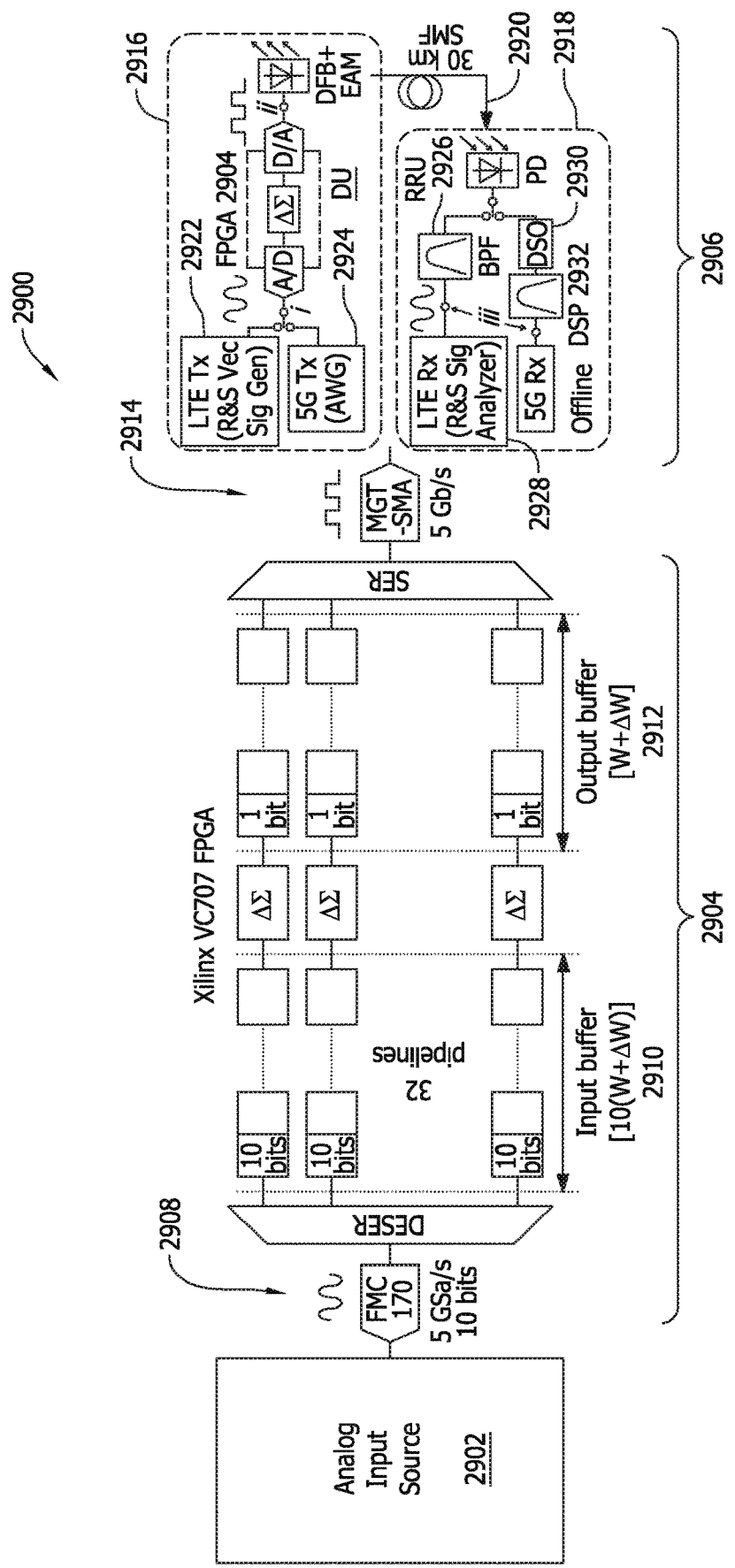
FIG. 29 is a schematic illustration of a system architecture according to an embodiment of the present disclosure.

FIG. 29 is a schematic illustration of a system architecture 2900. System architecture 2900 represents a real-time experimental implementation of the architectures in operating principles described herein. In the exemplary embodiment, system architecture represents a three-stage implementation, including an analog input source 2902, an FPGA 2904, and a fronthaul system 2906. In the real-time implementation of architecture 2900, FPGA 2904 receives the analog signal of analog input source 2902 using an ADC interface 2908. In this implementation, ADC interface 2908 was a 4DSP FPGA Mezzanine Card (FMC170) inserted on the high-pin count (HPC) connector of a Xilinx VC707 FPGA of FPGA 2904, which realizes a 5 GSa/s one-bit bandpass delta-sigma ADC as ADC interface 2908 of the input analog signal. The person of ordinary skill in the art though, will understand that these specific hardware components are described for illustrative purposes, and are not intended to be limiting. Other structural components may be utilized without departing from the scope of the principles described herein.

In exemplary operation, ADC interface 2908 samples the input analog signal from input source 2902 at 5 GSa/s, with 10 bits per sample. FPGA 2904 then performed one-bit delta-sigma modulation to transform 10 input bits, at an input buffer 2910, into one output bit at an output buffer 2912. FPGA 2904 was then configured to output the resulting one output bit through a multi-gigabit transceiver (MGT) port 2914. In this exemplary configuration, due to the speed limitations of FPGA 2904, the FPGA configuration was pipelined to de-serialize the input data into 32 pipelines, such that the operation speed of each pipeline was individually reduced to 156.25 MSa/s.

Fronthaul stage 2906 thus represents a real-time experimental setup implementation of a functional DU 2916 that includes FPGA 2904, and is in operable communication with a functional RRU 2918 over a 30 km SMF transport medium 2920. In operation, DU 2916 generated real-time LTE and 5G signals using a Rohde Schwarz (R&S) vector signal generator 2922 and an arbitrary waveform generator (AWG), respectively. FPGA 2904 then, for this implementation, digitized the mobile signal(s) into a 5-Gb/s OOK signal, which was then transmitted from DU 2916 to RRU 2918 over medium 2920 using an optical IM-DD system. The real-time LTE signals were received at RRU 2918 by a BPF 2926, followed by an R&S signal analyzer. For the 5G signals, the received OOK signal was captured by a data storage oscilloscope (DSO) 2930 followed by real-time DSP 2932. The respective OFDM parameters of the several 5G/LTE signals of this real-time implementation are shown below in Table 5.

TABLE 5

| R-T Case | Signals | Sampling rate (MSa/s) | FFT size | Subcarrier spacing (kHz) | Data subcarriers | Carrier number | Actual BW (MHz) | Modulation (QAM) |
|---|---|---|---|---|---|---|---|---|
| A | 5G-NR | 122.88 | 4096 | 30 | 3300 | 1 | 99 | 1024 |
| B | | | | | | 2 | 198 | 256 x 2 |
| C | 4G-LTE | 30.72 | 2048 | 15 | 1200 | 10 | 180 | 256 x 6, 1024 x 4 |
| D | | | | | | 14 | 252 | 1024 x 2, 256 x 4, 64 x 8 |

For Table 5, the 30 kHz subcarrier spacing and 3300 active subcarriers values for the 5G-NR signals are according to 3GPP Release 14. The EVM results, as described above, may then be used to evaluate the performance of the digitization. As described further below with respect to FIGS. 30-34, the EVM criteria used in accordance with 3GPP, similar to the embodiments described above, were: 12.5% EVM for the 16QAM modulation format, 8% EVM for the 64QAM modulation format, and 3.5% EVM for the 256QAM modulation format. Different from the embodiments above though, an EVM of 2% was used for the 1024QAM modulation format. Again, EVM for the 1024QAM modulation format is not yet specified for 3GPP. The person of ordinary skill in the art though, will understand that the operating principles of the present embodiments fully apply to either EVM value for the 1024QAM modulation format.

Figures 30A, 30B, 30C:
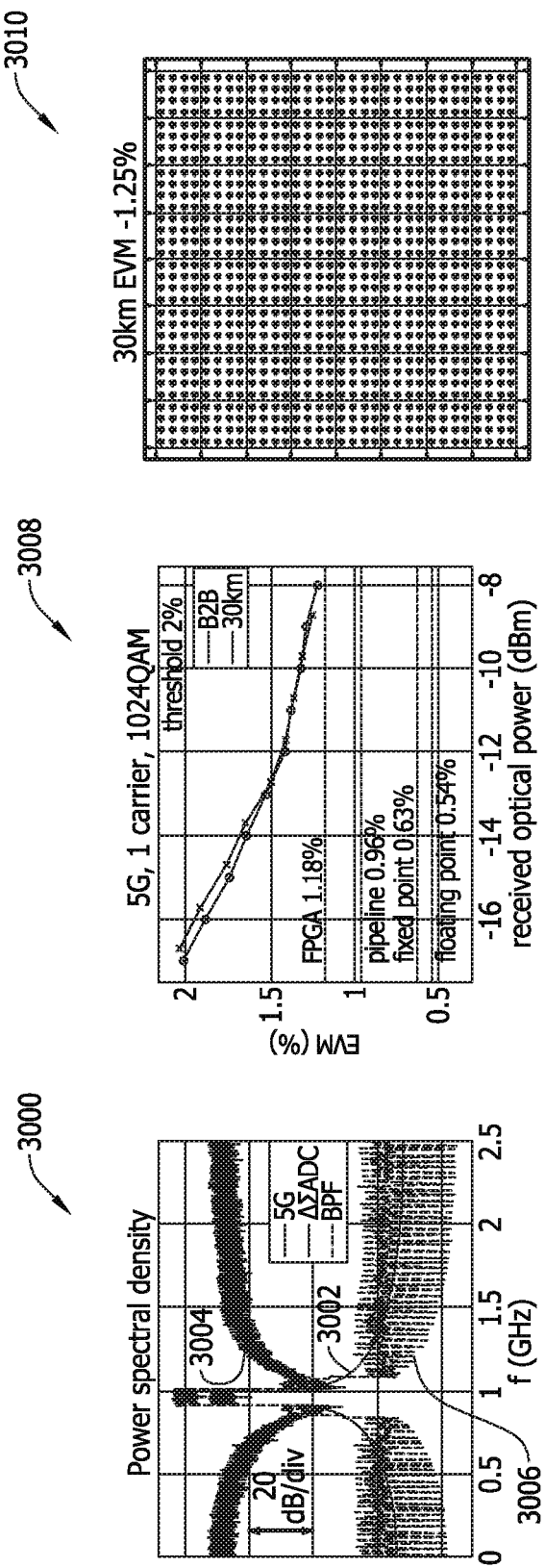
FIG. 30A is a graphical illustration depicting a power spectral density plot for an exemplary carrier.
FIG. 30B is a graphical illustration depicting a plot of error vector magnitude against received optical power for the carrier depicted in FIG. 30A.
FIG. 30C is a graphical illustration depicting a post-transmission constellation plot for the carrier depicted in FIG. 30A.

FIG. 30A is a graphical illustration depicting a power spectral density plot 3000 for an exemplary carrier. More particularly, power spectral density plot 3000 represents experimental results for Case A, Table 5, above, in which a single 960 MHz 5G carrier, having 99 MHz bandwidth and using the 1024QAM modulation format, was digitized. Power spectral density plot 3000 illustrates the respective RF spectra of an input analog signal 3002 (e.g., 5G), an OOK signal 3004 after delta-sigma ADC, and a retrieved analog signal 3006 after BPF. In this experimental implementation, a 5-Gb/s error-free transmission was achieved over 30 km fiber. It can also be seen from power spectral density plot 3000 that retrieved analog signal 3006 tracks fairly closely with input analog signal 3002 across the entire frequency range.

FIG. 30B is a graphical illustration of depicting a plot 3008 of EVM (in %) against received optical power for the carrier depicted in FIG. 30A. More particularly, plot 3008 illustrates EVM as a function of received optical power, and with respect to several hardware simulations, such as floating point, fixed point, and pipeline, which further illustrate the advantageous step-by-step implementation of the present FPGA embodiments. As can be seen from plot 3008, no EVM penalty is observed after 30-km fiber transmission.

FIG. 30C is a graphical illustration depicting a post-transmission constellation plot 3010 for the carrier depicted in FIG. 30A. More particularly, constellation plot 3010 further confirms the integrity of the carrier transmission over a 30 km SMF.

Figures 31A, 31B:
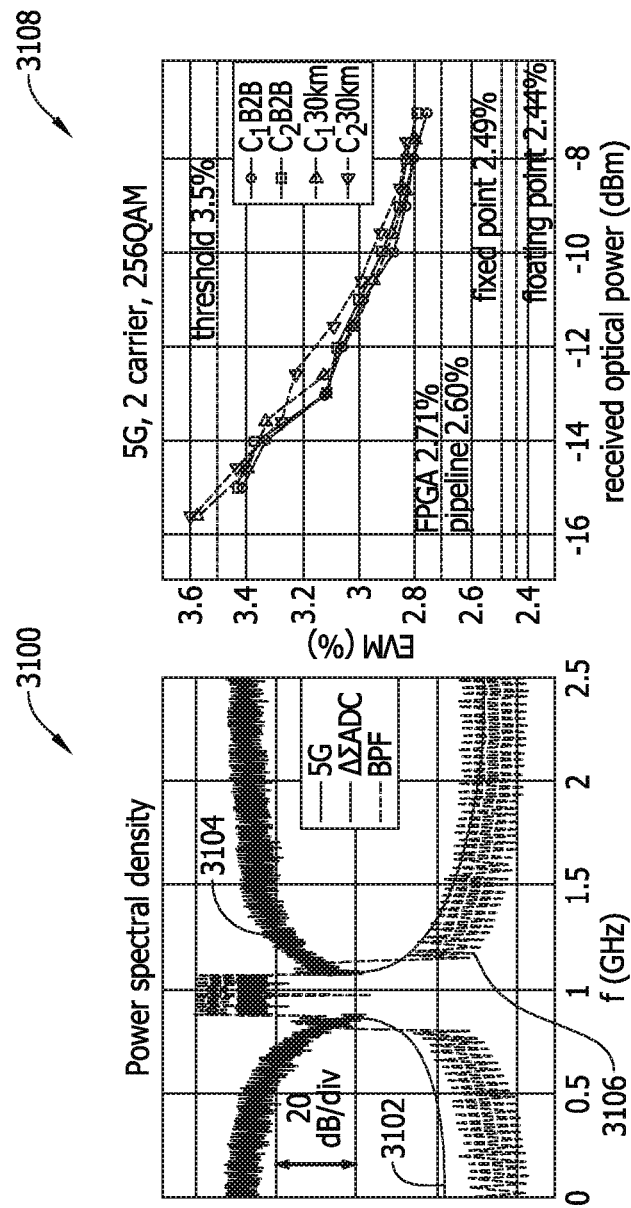
FIG. 31A is a graphical illustration depicting a power spectral density plot for an exemplary pair of carriers.
FIG. 31B is a graphical illustration depicting a plot of error vector magnitudes against received optical power for the pair of carriers depicted in FIG. 31A.

FIG. 31A is a graphical illustration depicting a power spectral density plot 3100 for an exemplary pair of carriers. More particularly, power spectral density plot 3100 is similar to power spectral density plot 3000, FIG. 30A, but represents experimental results for Case B of Table 5, above, for a digitization implementation of two 5G carriers having a total 198 MHz bandwidth and using the 256QAM modulation format. Power spectral density plot 3100 illustrates the respective RF spectra of input analog signals 3102 (e.g., 5G), digitized OOK signal 3104, and retrieved analog signals 3106. In this experimental implementation, it can be seen that, after transmission over 30 km fiber, quantization noise increases due to the wider signal bandwidth, and the EVMs of both carriers increases to 2.71% (see FIG. 31B, below) in comparison with the single-carrier case depicted in FIG. 30A. Nevertheless, as depicted in FIG. 31A, the results still satisfy the 3.5% EVM requirements of 3GPP for the 256 QAM modulation format. It can also be seen from power spectral density plot 3100 that retrieved analog signals 3106 track more closely with input analog signal 3102 at higher frequencies than at lower frequencies.

FIG. 31B is a graphical illustration depicting a plot 3108 of EVM (in %) against received optical power for the pair of carriers depicted in FIG. 31A. More particularly, plot 3108 illustrates EVM as a function of received optical power for both carriers, and with respect to the several hardware simulations depicted in plot 3008, FIG. 30B. In comparison with plot 3008, plot 3108 demonstrates significant increases for each hardware simulation, in addition to the EVM increase described above.

Figures 32A, 32B:
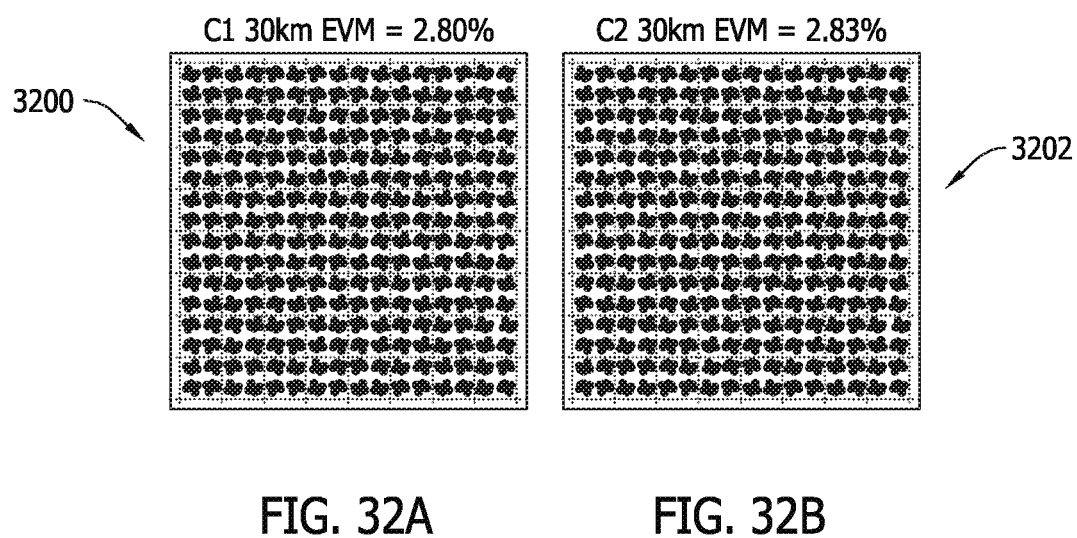
FIGS. 32A-B are graphical illustrations depicting post-transmission constellation plots for the carriers depicted in FIG. 31A.

FIGS. 32A-B are graphical illustrations depicting post-transmission constellation plots 3200, 3202 for the carriers depicted in FIG. 31A. More particularly, constellation plot 3200 illustrates the post-transmission signal of the first carrier after 30 km, which has an EVM of 2.80%, and constellation plot 3202 illustrates the post-transmission signal of the second carrier after 30 km, which has an EVM of 2.83%. As can be seen from constellation plots 3200, 3202, the relative signal integrity between the two carriers is substantially similar, and within 3GPP requirements.

Figures 33A, 33B:
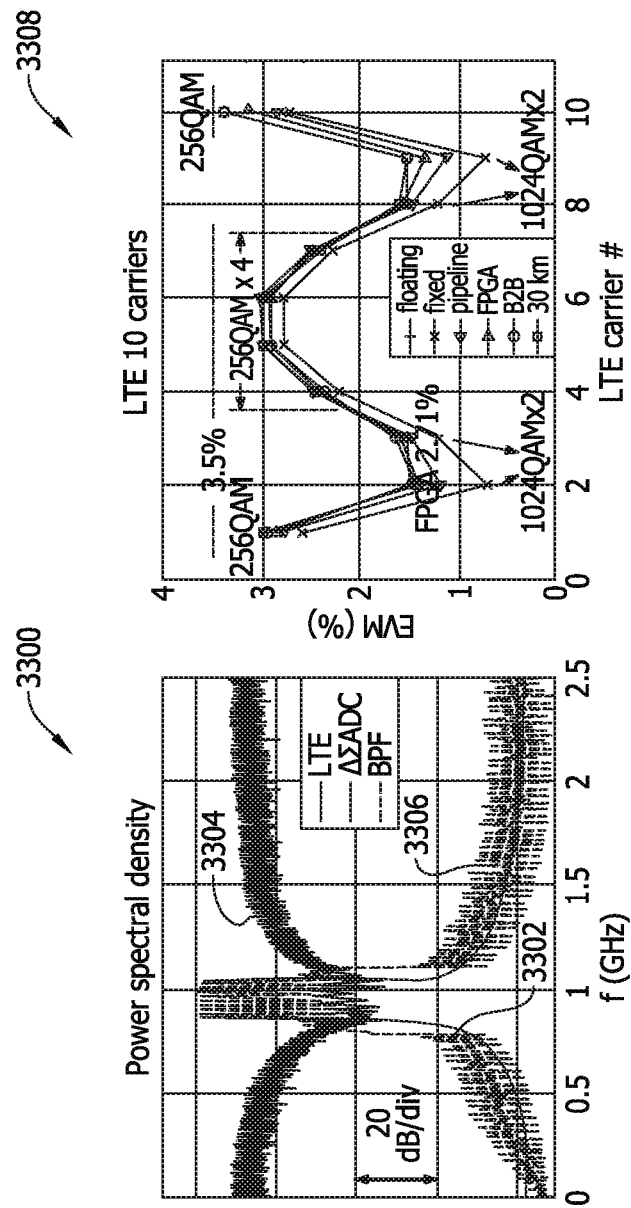
FIG. 33A is a graphical illustration depicting a power spectral density plot for an exemplary set of carriers.
FIG. 33B is a graphical illustration depicting a plot of error vector magnitudes according to the respective carrier number of the set of carriers depicted in FIG. 33A.

FIG. 33A is a graphical illustration depicting a power spectral density plot 3300 for an exemplary set of carriers. More particularly, power spectral density plot 3300 is similar to power spectral density plot 3100, FIG. 31A, but represents experimental results for Case C of Table 5, above, for a real-time digitization implementation of 10 LTE carriers having a total 180 MHz bandwidth and where 6 of the 10 LTE carriers used the 256QAM modulation format, and the remaining 4 LTE carriers used the 1024QAM modulation format. Power spectral density plot 3300 illustrates the respective RF spectra of input analog signals 3302 (e.g., LTE), digitized signal 3304, and retrieved analog signals 3306. It can be seen from power spectral density plot 3300 that retrieved analog signals 3306 track with input analog signals 3302 across most of the frequency range other than zero (i.e., DC).

FIG. 33B is a graphical illustration depicting a plot 3308 of EVM (in %) according to the respective carrier number of the set of 10 carriers depicted in FIG. 33A. From plot 3308, it can be seen that the different modulations that are assigned to the respective carriers track fairly closely with one another across several different hardware simulations, but with the most significant deviation being between the direct 30 km transmission simulation and the FPGA hardware simulation.

Figures 34A, 34B:
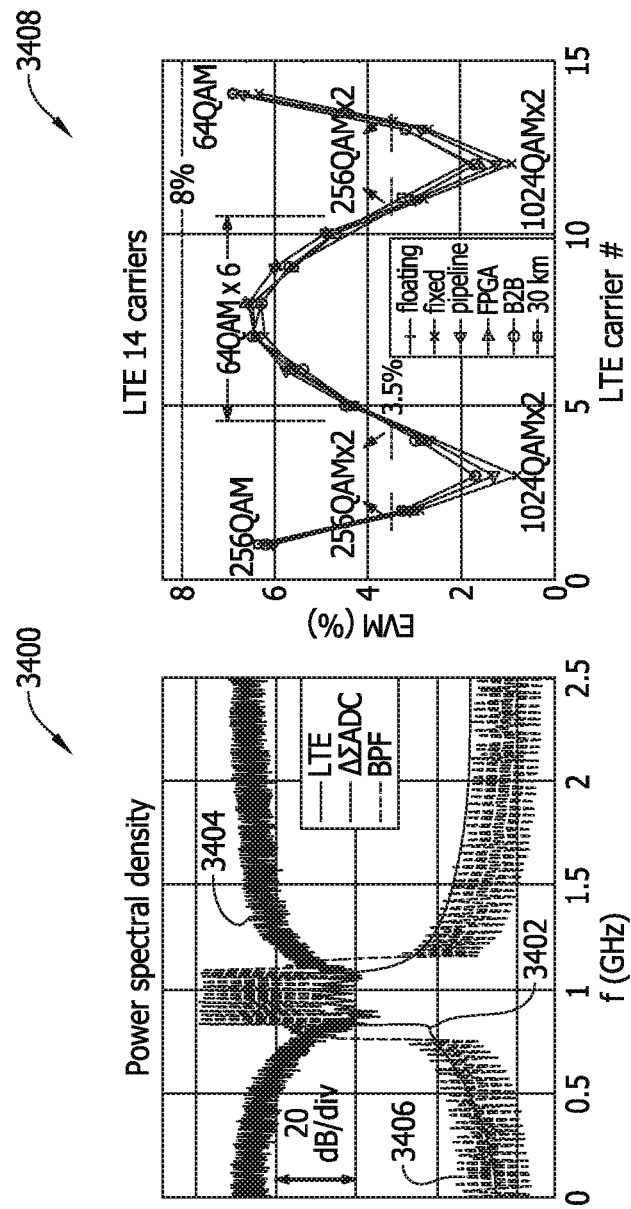
FIG. 34A is a graphical illustration depicting a power spectral density plot for an alternative set of carriers.
FIG. 34B is a graphical illustration depicting a plot of error vector magnitudes according to the respective carrier number of the set of carriers depicted in FIG. 34A.

FIG. 34A is a graphical illustration depicting a power spectral density plot 3400 for an alternative set of carriers. More particularly, power spectral density plot 3400 is similar to power spectral density plot 3300, FIG. 33A, but represents experimental results for Case D of Table 5, above, which represents a real-time digitization implementation of 14 LTE carriers having a total 252 MHz bandwidth and where 8 of the 14 LTE carriers used the 64QAM modulation format, 4 of the 14 LTE carriers used the 256QAM modulation format, and the remaining 2 LTE carriers used the 1024QAM modulation format. Power spectral density plot 3400 illustrates the respective RF spectra of input analog signals 3402 (e.g., LTE), digitized signal 3404, and retrieved analog signals 3406. It can be seen from power spectral density plot 3300 that retrieved analog signals 3406 track more closely with input analog signals 3402 at lower frequencies than at higher frequencies, but still within desired results.

FIG. 34B is a graphical illustration depicting a plot 3408 of EVM (in %) according to the respective carrier number of the set of 14 carriers depicted in FIG. 34A. From plot 3408, it can be seen that the different modulations that are assigned to the respective carriers track more closely with one another across the several different hardware simulations, then in the 10-carrier case illustrated in FIG. 33B. The largest still occurs between the direct 30 km transmission simulation and the FPGA hardware simulation, but this deviation is smaller than in the 10-carrier case.

According to the embodiments described herein, innovative real-time, FPGA-based, bandpass delta-sigma ADC his advantageously implemented at the 5 GSa/s sampling rate, and significantly beyond the widest reported signal bandwidth (e.g., FIG. 26) for the digitization of 5G and LTE signals. According to the present embodiments, the bandwidth efficiency of the fronthaul segment to the RRH is significantly improved, while the cost and complexity of the RRUs are significantly reduced. The present techniques therefore unable a new and useful functional split option for NGFI that significantly improves over conventional proposals.

Exemplary embodiments of delta-sigma digitization systems, methods, and real-time implementations are described above in detail. The systems and methods of this disclosure though, are not limited to only the specific embodiments described herein, but rather, the components and/or steps of their implementation may be utilized independently and separately from other components and/or steps described herein. Additionally, the exemplary embodiments described herein may be implemented and utilized in connection with access networks other than MFH and MBH networks.

Although specific features of various embodiments of the disclosure may be shown in some drawings and not in others, this is for convenience only. In accordance with the principles of the disclosure, a particular feature shown in a drawing may be referenced and/or claimed in combination with features of the other drawings.

Some embodiments involve the use of one or more electronic or computing devices. Such devices typically include a processor or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a DSP device, and/or any other circuit or processor capable of executing the functions described herein. The processes described herein may be encoded as executable instructions embodied in a computer readable medium, including, without limitation, a storage device and/or a memory device. Such instructions, when executed by a processor, cause the processor to perform at least a portion of the methods described herein. The above examples are exemplary only, and thus are not intended to limit in any way the definition and/or meaning of the term "processor."

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A delta-sigma digitization system for modulating an input analog carrier signal into a digitized bit stream, comprising:
    a sampling unit configured to sample the input analog signal at a predetermined sampling rate to produce a sampled analog signal;
    a delta-sigma analog-to-digital converter (ADC) configured to (i) quantize the sampled analog signal into a quantized signal according to a predetermined number of quantization bits, and (ii) determine a noise transfer function (NTF) to separate quantization noise from the quantized signal; and
    an output port for transmitting the digitized bit stream to a transport medium based on the predetermined number of quantization bits and the determined NTF.

2. The system of claim 1, wherein the delta-sigma ADC comprises a field programmable gate array (FPGA).

3. The system of claim 2, wherein the predetermined number of quantization bits is one, and wherein the delta-sigma ADC is further configured to perform one-bit quantization according to a binary quantization format.

4. The system of claim 3, wherein the binary quantization format comprises on-off keying.

5. The system of claim 2, wherein the sampling unit comprises an FPGA mezzanine card (FMC).

6. The system of claim 5, wherein the FMC is configured to sample the input analog signal at 5 GSa/s.

7. The system of claim 6, further comprising an input de-serializer configured to de-serialize the sampled analog signal into a plurality of separate pipelines, and an output serializer configured to serialize the separate pipelines into the digitized bit stream at the output port.

8. The system of claim 7, wherein an operational speed of each pipeline of the plurality of separate pipelines is approximately 156.25 MSa/s.

9. The system of claim 5, wherein the output port comprises a multi-gigabit transceiver.

10. The system of claim 2, wherein the delta-sigma ADC is disposed within a distributed unit (DU) of a communication network.

11. The system of claim 10, wherein the DU comprises a baseband processing unit of a fronthaul segment of the communication network.

12. The system of claim 1, wherein the input analog signal comprises at least one of a 5G new radio (5GNR) signal and a long term evolution (LTE) signal.

13. The system of claim 12, wherein the input analog signal comprises at least one of a 64QAM, a 256QAM, and a 1024QAM modulation format.

14. A communication system, comprising:
    a core network;
    a central unit (CU) in operable communication with the core network;
    at least one distributed unit (DU) different from, and in operable communication with, the CU;
    at least one radio resource unit (RRU) in operable communication with the at least one DU over a next generation fronthaul interface (NGFI) split option from the at least one DU;
    a backhaul network segment formed between the core network and the CU;
    a first fronthaul network segment formed between the CU and the at least one DU; and
    a second fronthaul network segment formed between the at least one DU and the at least one RRU,
    wherein the second fronthaul network segment comprises (i) a first digital link including a delta-sigma analog-to-digital converter, and (ii) at least one of an analog link and a second digital link different from the first digital link.

15. The communication system of claim 14, wherein the analog link comprises a radio-over-fiber fronthaul link, and wherein the second digital link comprises a digital fronthaul link based on common public radio interface.

16. The communication system of claim 15, wherein the at least one DU includes a high radio frequency (RF) layer, wherein the at least one RRU includes a low RF layer, and wherein the NGFI split option from the at least one DU includes operable communication between the high RF layer and the low RF layer over the first digital link.

17. The communication system of claim 16, wherein the CU further comprises one or more of a radio resource control layer and a packet data convergence protocol layer, and wherein the at least one DU further comprises one or more of a high radio link control (RLC) layer, a low RLC layer, a high media access control (MAC) layer, a low MAC control layer, a high physical (PHY) layer, and a low PHY layer.

18. The communication system of claim 14, comprising a cloud-radio access network.

19. The system of claim 1, wherein the NTF corresponds to at least one of a passive filter, an active filter, and a programmable filter of a receiver disposed at an opposing end of the transport medium.

20. The system of claim 1, wherein the NTF corresponds to at least one signal band of a wireless service included in the input analog signal.

* * * * *